(12) United States Patent
Fujiyama et al.

(10) Patent No.: US 11,974,494 B2
(45) Date of Patent: Apr. 30, 2024

(54) POLYMER COMPOUND, COMPOSITION INCLUDING THE POLYMER COMPOUND, LIGHT-EMITTING DEVICE INCLUDING THE POLYMER COMPOUND

(71) Applicant: Samsung Electronics Co., Ltd., Suwon-si (KR)

(72) Inventors: Takahiro Fujiyama, Kanagawa (JP); Keisuke Korai, Kanagawa (JP); Katsunori Shibata, Kanagawa (JP); Daeyoung Chung, Suwon-si (KR); Eunjoo Jang, Suwon-si (KR); Taehyung Kim, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 555 days.

(21) Appl. No.: 15/855,145

(22) Filed: Dec. 27, 2017

(65) Prior Publication Data
US 2018/0182969 A1    Jun. 28, 2018

(30) Foreign Application Priority Data

Dec. 27, 2016 (JP) .................. 2016-253651
Oct. 30, 2017 (JP) .................. 2017-209850
Dec. 13, 2017 (KR) ............ 10-2017-0171419

(51) Int. Cl.
*C08G 61/02* (2006.01)
*C08G 61/12* (2006.01)
(Continued)

(52) U.S. Cl.
CPC .......... *H10K 85/115* (2023.02); *C08G 61/02* (2013.01); *C08G 61/124* (2013.01);
(Continued)

(58) Field of Classification Search
CPC ......... C09K 11/00; C09K 11/06; C09K 11/07; H01L 51/50; H01L 51/5004;
(Continued)

(56) References Cited

U.S. PATENT DOCUMENTS 8,330,142 B2    12/2012  Cho et al.
8,440,325 B2    5/2013   Mckiernan et al.
(Continued)

FOREIGN PATENT DOCUMENTS

JP    2009-521118 A    5/2009
JP    2010-199067 A    9/2010
(Continued)

OTHER PUBLICATIONS

Park, S.M.; Yook, K.S.; Lee, W.H.; Hong, Y.; Lee, J.Y.; Kang, I.N., 2013, Synthesis and Characterization of Thermally Crosslinkable Hole-Transporting Polymers for PLEDs, J. Poly. Sci. A, 51, 5111-5117 (Year: 2013).*

(Continued)

*Primary Examiner* — Sean M DeGuire
*Assistant Examiner* — Rachel Simbana
(74) *Attorney, Agent, or Firm* — CANTOR COLBURN LLP

(57) ABSTRACT

A polymer compound including a repeating unit represented by Formula 1:

(Continued)

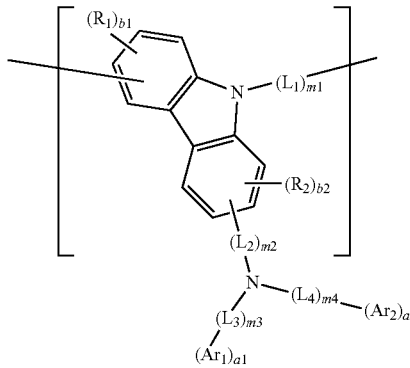

Formula 1 wherein, in Formula 1, groups and variables are the same as described in the specification.

16 Claims, 3 Drawing Sheets

(51) Int. Cl.
| | |
|---|---|
| H10K 50/11 | (2023.01) |
| H10K 50/115 | (2023.01) |
| H10K 50/15 | (2023.01) |
| H10K 50/17 | (2023.01) |
| H10K 85/10 | (2023.01) |
| H10K 101/10 | (2023.01) |

(52) U.S. Cl.
CPC ......... *H10K 50/115* (2023.02); *H10K 85/141* (2023.02); *H10K 85/151* (2023.02); *C08G 2261/12* (2013.01); *C08G 2261/1412* (2013.01); *C08G 2261/1414* (2013.01); *C08G 2261/1434* (2013.01); *C08G 2261/147* (2013.01); *C08G 2261/148* (2013.01); *C08G 2261/312* (2013.01); *C08G 2261/3142* (2013.01); *C08G 2261/95* (2013.01); *H10K 50/11* (2023.02); *H10K 50/15* (2023.02); *H10K 50/17* (2023.02); *H10K 2101/10* (2023.02)

(58) Field of Classification Search
CPC ............. H01L 51/5012; H01L 51/5024; H01L 51/5028; H01L 51/5048; H01L 51/5052; H01L 51/5056; H01L 51/506; H01L 51/5068; H01L 51/5096; H01L 51/0032; H01L 51/0034; H01L 51/0035; H01L 51/0039; H01L 51/0043; H01L 51/0036; C07C 13/547; C07C 13/567; C08G 2261/00; C08G 2261/12; C08G 2261/122; C08G 2261/124; C08G 2261/30; C08G 2261/31; C08G 2261/312; C08G 2261/314; C08G 2261/3142; C08G 2261/316; C08G 2261/3162; C08G 2261/32; C08G 2261/324; C08G 2261/3241; C08G 2261/3244; C08G 2261/35; C08G 2261/352; C08G 2261/354; C08G 2261/90; C08G 2261/91; C08G 2261/95; H10K 85/111; H10K 85/151

See application file for complete search history.

(56) References Cited

U.S. PATENT DOCUMENTS

| | | | |
|---|---|---|---|
| 8,558,007 B2 | 10/2013 | Yang et al. | |
| 8,580,393 B2 | 11/2013 | Mizuki et al. | |
| 9,761,820 B2 | 9/2017 | Pillow et al. | |
| 2006/0149022 A1* | 7/2006 | Parham | C09B 69/105 528/102 |
| 2007/0031699 A1* | 2/2007 | Yamada | C08G 61/00 428/690 |
| 2014/0299855 A1 | 10/2014 | Yomogita et al. | |
| 2015/0287927 A1* | 10/2015 | Okubo | B82Y 20/00 257/40 |
| 2016/0343949 A1* | 11/2016 | Seo | H01L 51/0062 |
| 2017/0358750 A1* | 12/2017 | Radu | C08G 61/12 |

FOREIGN PATENT DOCUMENTS

| | | | | |
|---|---|---|---|---|
| JP | 2011-144375 | A | 7/2011 | |
| JP | WO2013-057922 | A1 | 4/2013 | |
| JP | 2013-216789 | A | 10/2013 | |
| JP | 2014-065885 | A | 4/2014 | |
| JP | 5587172 | B2 | 8/2014 | |
| JP | 5707873 | B2 | 3/2015 | |
| JP | 2016-503087 | A | 2/2016 | |
| JP | 2016-084370 | A | 5/2016 | |
| KR | 10-0865661 | B1 | 10/2008 | |
| KR | 10-2016-0091198 | A | 8/2016 | |
| KR | 10-2016-0131947 | A | 11/2016 | |
| WO | WO-0162822 | A1 * | 8/2001 | ............. C08G 61/02 |
| WO | WO-2009110360 | A1 * | 9/2009 | ............. C08G 61/12 |
| WO | 2011078391 | A1 | 6/2011 | |
| WO | 2013-146806 | A1 | 10/2013 | |
| WO | 2013-191086 | A1 | 12/2013 | |
| WO | 2013-191088 | A1 | 12/2013 | |
| WO | 2014057968 | A1 | 4/2014 | |
| WO | 2016026122 | A1 | 2/2016 | |
| WO | WO-2016026265 | A1 * | 2/2016 | ........... H01L 51/005 |
| WO | 2016-081583 | A1 | 5/2016 | |
| WO | WO-2016081583 | A1 * | 5/2016 | ......... H01L 51/0043 |

OTHER PUBLICATIONS

WO-2009110360-A1—translation (Year: 2009).*
English Translation of Office Action issued in Japanese Patent Application No. 2017-209850, dated Sep. 14, 2021, 3 pp.
Office Action issued in Japanese Patent Application No. 2017-209850, dated Sep. 14, 2021, 3 pp.

* cited by examiner

POLYMER COMPOUND, COMPOSITION INCLUDING THE POLYMER COMPOUND, LIGHT-EMITTING DEVICE INCLUDING THE POLYMER COMPOUND

CROSS-REFERENCE TO RELATED APPLICATIONS

This application claims priority to Japanese Patent Application No. 2016-253651, filed on Dec. 27, 2016, in the Japanese Patent Office, Japanese Patent Application No. 2017-209850, filed on Oct. 30, 2017, in the Japanese Patent Office; and Korean Patent Application No. 10-2017-0171419, filed on Dec. 13, 2017, in the Korean Intellectual Property Office, and all the benefits accruing therefrom under 35 U.S.C. § 119, the contents of which are incorporated herein in their entireties by reference.

BACKGROUND

1. Field

One or more embodiments relate to a polymer compound, a composition including the polymer compound, and a light-emitting device including the polymer compound.

2. Description of the Related Art

Recently, display apparatus, mobile apparatus, lighting apparatus, and the like using organic light-emitting devices that are self-emission devices have been actively developed.

As the materials for the organic light-emitting devices, a variety of low-molecular-weight materials and high-molecular-weight materials are used for an emission layer and a charge transport layer. In particular, many low-molecular-weight materials that are excellent in terms of device efficiency and lifespan have been proposed, and commercialization thereof has been started in mobile applications. However, the biggest problem of organic light-emitting devices including low-molecular-weight materials is manufacturing costs. In order to solve the problem, there is a need to develop a cost-effective coating material such as a polymer material.

SUMMARY

As a polymer material capable of forming a film by solution coating, an arylamine polymer for a hole transport material has been proposed.

Also, organic light-emitting devices using a phosphorescent material exhibiting high luminescent efficiency, such as a 2-phenylpyridine iridium complex [Ir(ppy)$_3$], have been actively developed. In addition to such light-emitting materials, carrier transport materials may preferably have a high triplet energy level (for example, 2.5 electron volts, eV or higher). However, in the case of the arylamine polymer, a repeating unit itself has a sufficiently high triplet energy level, but the triplet energy level is reduced as the repeating unit increases. Therefore, research has been conducted into polymer materials enabling a large-area film formation and increasing luminescent efficiency.

Additional aspects will be set forth in part in the description which follows and, in part, will be apparent from the description, or may be learned by practice of the presented embodiments. Hereinafter, embodiments of the present disclosure will be described. Also, the present disclosure is not limited to the following embodiments.

An aspect of the present disclosure provides a polymer compound including a first repeating unit represented by Formula 1:

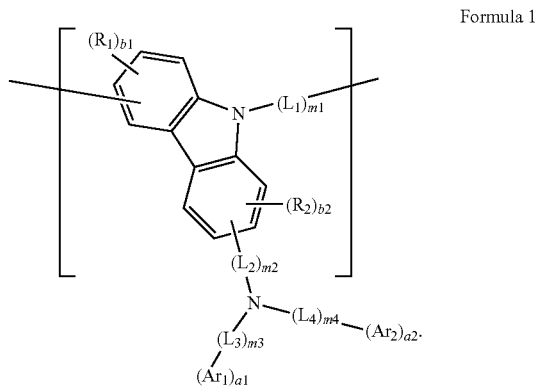

Formula 1

In Formula 1, $L_1$ and $L_2$ may each independently be selected from a substituted or unsubstituted $C_1$-$C_{60}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_3$ and $L_4$ may each independently be selected from a substituted or unsubstituted $C_5$-$C_{30}$ carbocyclic group and a substituted or unsubstituted $C_1$-$C_{30}$ heterocyclic group, m1 to m4 may each independently be an integer from 0 to 5, when m1 is zero, $L_1$ may be a single bond, when m2 is zero, $L_2$ may be a single bond, when m3 is zero, $L_3$ may be a single bond, when m4 is zero, $L_4$ may be a single bond, when m1 is two or more, two or more groups $L_1$ may be identical to or different from each other, when m2 is two or more, groups $L_2$ may be identical to or different from each other, when m3 is two or more, groups $L_3$ may be identical to or different from each other, when m4 is two or more, groups $L_4$ may be identical to or different from each other, $Ar_1$ and $Ar_2$ may each independently be selected from a substituted or unsubstituted $C_5$-$C_{30}$ carbocyclic group and a substituted or unsubstituted $C_1$-$C_{30}$ heterocyclic group, a1 and a2 may each independently be an integer from 1 to 5, when a1 is two or more, two or more groups $Ar_1$ may be identical to or different from each other, when a2 is two or more, two or more groups $Ar_2$ may be identical to or different from each other, $R_1$ and $R_2$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1 and b2 may each independently be an integer from 1 to 3, when b1 is two or more, two or more groups $R_1$ may be identical to or different from each other, and when b2 is two or more, two or more groups $R_2$ may be identical to or different from each other.

Another aspect of the present disclosure provides a composition for manufacturing a light-emitting device, which includes the polymer compound and a liquid medium.

Another aspect of the present disclosure provides a light-emitting device including:

a first electrode, a second electrode, and an intermediate layer disposed between the first electrode and the second electrode, wherein the intermediate layer includes the polymer compound.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
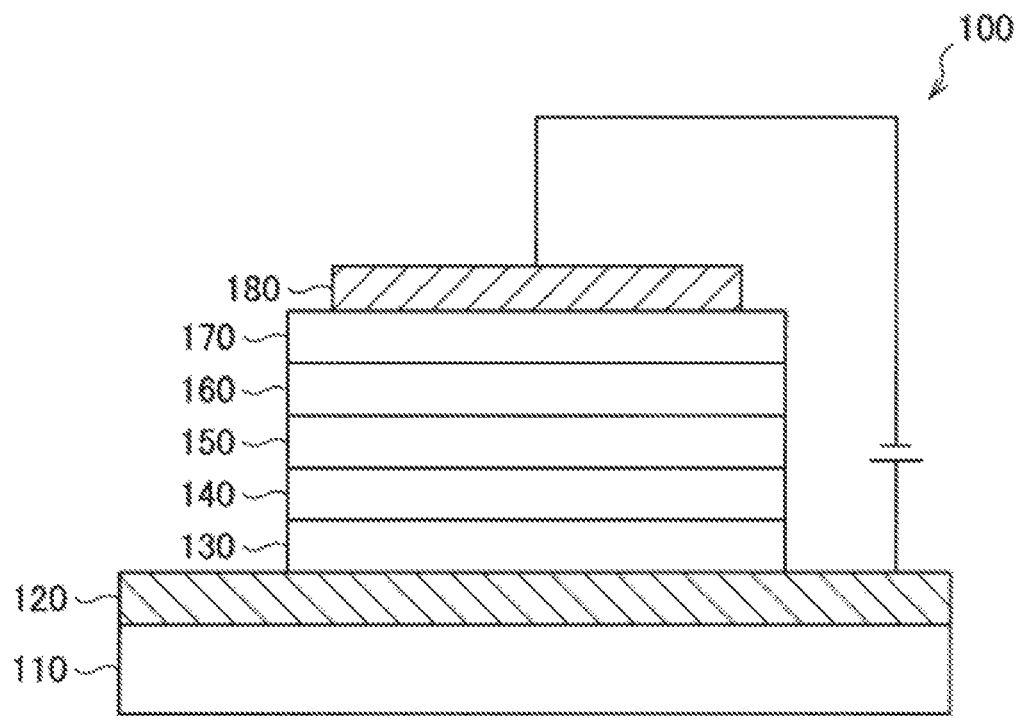
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The term "x to y" indicating a range, as used herein, means "greater than or equal to x and less than or equal to y".

Also, the operations and physical properties have been measured at a temperature of 20° C. to 25° C. and a relative humidity of 40% RH to 50% RH, unless otherwise specified.

Polymer Compound

A polymer compound according to an embodiment includes a first repeating unit represented by Formula 1 below:

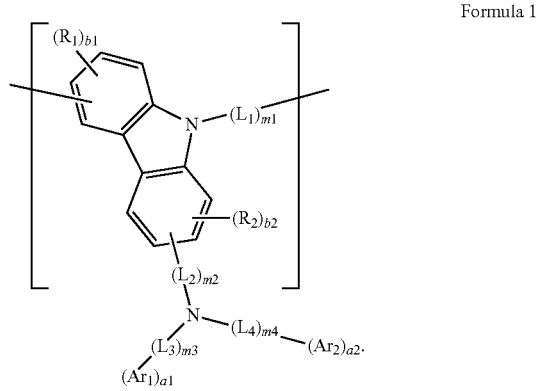

Formula 1

In Formula 1, $L_1$ and $L_2$ may each independently be selected from a substituted or unsubstituted $C_1$-$C_{60}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_3$ and $L_4$ may each independently be selected from a substituted or unsubstituted $C_5$-$C_{30}$ carbocyclic group and a substituted or unsubstituted $C_1$-$C_{30}$ heterocyclic group, m1 to m4 may each independently be an integer from 0 to 5, when m1 is zero, $L_1$ may be a single bond, when m2 is zero, $L_2$ may be a single bond, when m3 is zero, $L_3$ may be a single bond, when m4 is zero, $L_4$ may be a single bond, when m1 is two or more, two or more groups $L_1$ may be identical to or different from each other, when m2 is two or more, two or more groups $L_2$ may be identical to or different from each other, when m3 is two or more, two or more groups $L_3$ may be identical to or different from each other, when m4 is two or more, two or more groups $L_4$ may be identical to or different from each other, $Ar_1$ and $Ar_2$ may each independently be selected from a substituted or unsubstituted $C_5$-$C_{30}$ carbocyclic group and a substituted or unsubstituted $C_1$-$C_{30}$ heterocyclic group, a1 and a2 may each independently be an integer from 1 to 5, when a1 is two or more, two or more groups $Ar_1$ may be identical to or different from each other, when a2 is two or more, two or more groups $Ar_2$ may be identical to or different from each other, $R_1$ and $R_2$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b1 and b2 may each independently be an integer from 1 to 3, when b1 is two or more, two or more groups $R_1$ may be identical to or different from each other, and when b2 is two or more, two or more groups $R_2$ may be identical to or different from each other.

First Repeating Unit

The polymer compound includes a first repeating unit represented by Formula 1. For example, the polymer compound may include first repeating units having the same structure, or may include two or more first repeating units having different structures.

$L_1$ and $L_2$ in Formula 1 may each independently be selected from a substituted or unsubstituted $C_1$-$C_{60}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In an embodiment, $L_2$ in Formula 1 may be a substituted or unsubstituted $C_6$-$C_{12}$ arylene group or a substituted or unsubstituted heteroarylene group having 3 to 12 ring-forming atoms. At this time, a conjugate size of $L_2$ is reduced, and thus, a triplet energy level may be kept high.

The $C_6$-$C_{12}$ arylene group may be, for example, a phenylene group, a biphenylene group, a pentalenylene group, an indenylene group, a naphthylene group, an azulenylene group, a heptalenylene group, an acenaphthacenylene group, or a phenalenylene group, but embodiments of the present disclosure are not limited thereto.

The heteroarylene group having 3 to 12 ring-forming atoms may be, for example, a pyridinylene group, a pyrimidinylene group, a pyrazinylene group, a pyridazinylene group, a triazinylene group, a quinolinylene group, an isoquinolinylene group, a naphthyridinylene group, a phthalazinylene group, a quinoxalinylene group, a quinazolinylene group, a pyrrolynyl group, an imidazolynyl group, a pyrazolylene group, a triazinylene group, tetrazinylene group, an indolynyl group, a benimidazolynyl group, an indazolylene group, an imidazopyridinylene group, a benzotriazolynyl group, a carbazolylene group, a furanylene group, a thienylene group, an oxazolylene group, a thiazolylene group, an isoxazolylene group, an isothiazolylene group, an oxaidazolylene group, a thiadiazoleylene group, a benzofuranylene group, a benzothiophenylene group, a benzoxazolylene group, a benzothiazolylene group, a benzisooxazolylene group, a benzoisothiazolylene group, a benzoxadiazolylene group, a benzoxathiazolylene group, a piperidinylene group, a pyrrolidinylene group, a piperadinylene group, or a morpholinylene group, but embodiments of the present disclosure are not limited thereto.

In an embodiment, $L_1$ and $L_2$ in Formula 1 may each independently be selected from:

a $C_1$-$C_{60}$ alkylene group, a phenylene group, a biphenylene group, a naphthylene group, a fluorenylene group, a spiro-bifluorenylene group, a triphenylenylene group, and a carbazolylene group; and a $C_1$-$C_{60}$ alkylene group, a phenylene group, a biphenylene group, a naphthylene group, a fluorenylene group, a spiro-bifluorenyl group, a triphenylenylene group, and a carbazolylene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a carbazolyl group, a fluorenyl group, and a triphenylenyl group.

$L_3$ and $L_4$ in Formula 1 may each independently be selected from a substituted or unsubstituted $C_5$-$C_{30}$ carbocyclic group and a substituted or unsubstituted $C_1$-$C_{30}$ heterocyclic group.

In an embodiment, $L_3$ and $L_4$ may each independently be selected from:

a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group; and a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group.

For example, $L_3$ and $L_4$ may each independently be selected from:

a benzene group, a carbazole group, a fluorene group, and a triphenylene group; and a benzene group, a carbazole group, a fluorene group, and a triphenylene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a carbazolyl group, a fluorenyl group, and a triphenylenyl group, but embodiments of the present disclosure are not limited thereto.

In an embodiment, $L_1$ to $L_4$ may each independently be selected from Formulae L-1 to L-3.

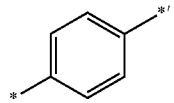

L-1

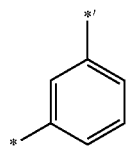

L-2

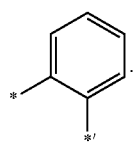

L-3

In Formulae L-1 to L-3,

\* and \*' each indicate a binding site to a neighboring atom.

In an embodiment, $L_3$ and $L_4$ may be identical to each other.

In one or more embodiments, $L_3$ and $L_4$ may be different from each other.

In Formula 1, m1 to m4 may each independently be an integer from 0 to 5, when m1 is zero, $L_1$ may be a single bond, when m2 is zero, $L_2$ may be a single bond, when m3 is zero, $L_3$ may be a single bond, and when m4 is zero, $L_4$ may be a single bond, when m1 is two or more, two or more groups $L_1$ may be identical to or different from each other, when m2 is two or more, two or more groups $L_2$ may be identical to or different from each other, when m3 is two or more, two or more groups $L_3$ may be identical to or different from each other, and when m4 is two or more, two or more groups $L_4$ may be identical to or different from each other.

In an embodiment, m2 may be an integer from 1 to 3. For example, m2 may be 1 or 2, but embodiments of the present disclosure are not limited thereto.

In an embodiment, m1 and m2 may each independently be an integer from 1 to 3. For example, m1 and m2 may each independently be 1 or 2, but embodiments of the present disclosure are not limited thereto.

In an embodiment, m3 and m4 may each independently be an integer from 0 to 2. For example, m3 and m4 may be 0 or 1, but embodiments of the present disclosure are not limited thereto.

$Ar_1$ and $Ar_2$ in Formula 1 may each independently be selected from a substituted or unsubstituted $C_5$-$C_{30}$ carbocyclic group and a substituted or unsubstituted $C_1$-$C_{30}$ heterocyclic group.

In an embodiment, $Ar_1$ and $Ar_2$ may each independently be selected from:

a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group; and a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group.

In an embodiment, $Ar_1$ and $Ar_2$ may each independently be selected from:

a phenyl group, a naphthyl group, a fluorenyl group, a spiro-bifluorenyl group, an indenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzimidazolyl group, a benzofuran group, a benzothiophenyl group, an isobenzothiophenyl group, a benzoxazolyl group, an isobenzoxazolyl group, a triazolyl group, a tetrazolyl group, an oxadiazolyl group, a triazinyl group, a dibenzofuran group, and a dibenzothiophenyl group; and a phenyl group, a naphthyl group, a fluorenyl group, a spiro-bifluorenyl group, an indenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzimidazolyl group, a benzofuran group, a benzothiophenyl group, an isobenzothiophenyl group, a benzoxazolyl group, an isobenzoxazolyl group, a triazolyl group, a tetrazolyl group, an oxadiazolyl group, a triazinyl group, a dibenzofuran group, and a dibenzothiophenyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group.

For example, $Ar_1$ and $Ar_2$ may each independently be selected from:

a benzene group, a carbazole group, a fluorene group, and a triphenylene group; and a benzene group, a carbazole group, a fluorene group, and a triphenylene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a carbazolyl group, a fluorenyl group, and a triphenylenyl group, but embodiments of the present disclosure are not limited thereto.

For example, $Ar_1$ and $Ar_2$ may each independently be selected from:

a phenyl group, a carbazolyl group, a fluorenyl group, and a triphenylenyl group; and a phenyl group, a carbazolyl group, a fluorenyl group, and a triphenylenyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a carbazolyl group, a fluorenyl group, and a triphenylenyl group, but embodiments of the present disclosure are not limited thereto.

In an embodiment, $Ar_1$ and $Ar_2$ may each independently be a substituent represented by one of Formulae B-1 to B-44:

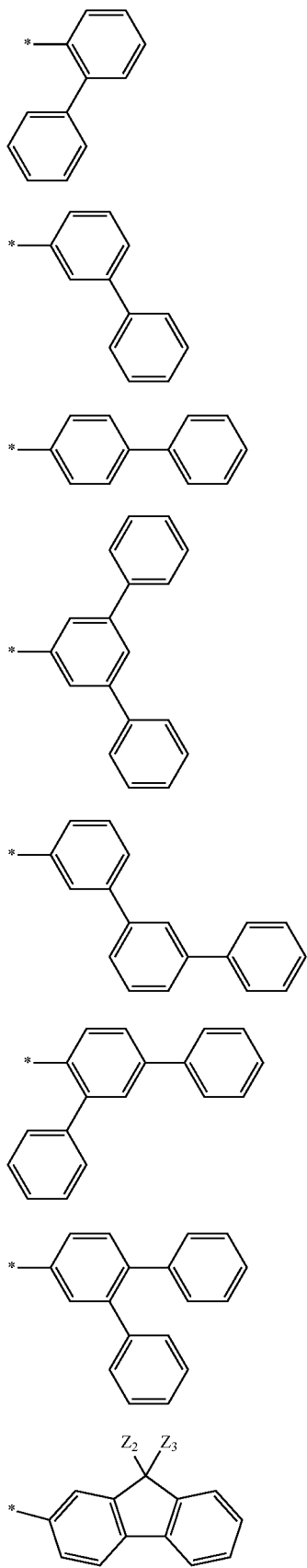

B-17 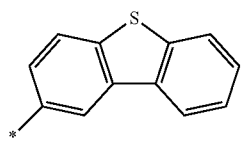
B-18 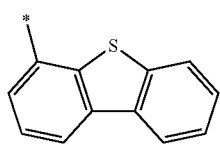
B-19 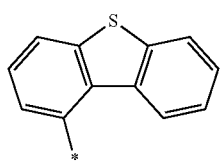
B-20 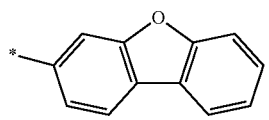
B-21 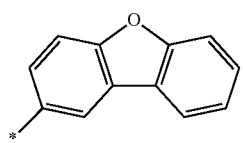
B-22 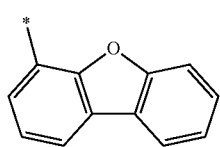
B-23 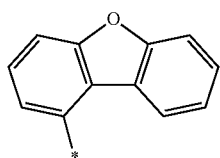
B-24 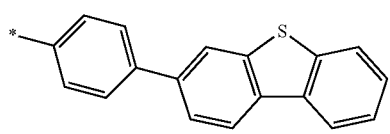
B-25 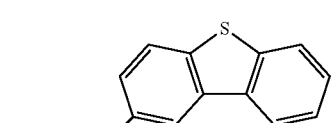
B-26 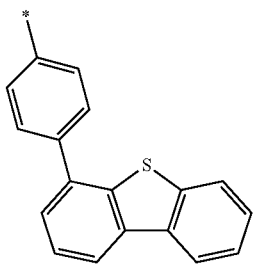
B-27 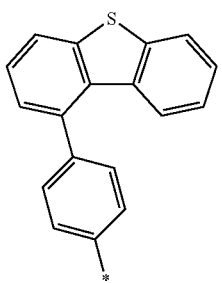
B-28 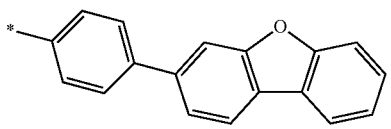
B-29 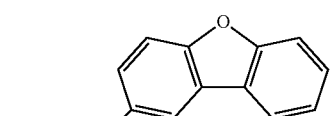
B-30 
B-31 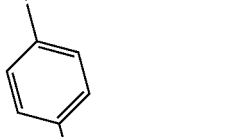
B-32 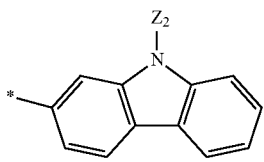

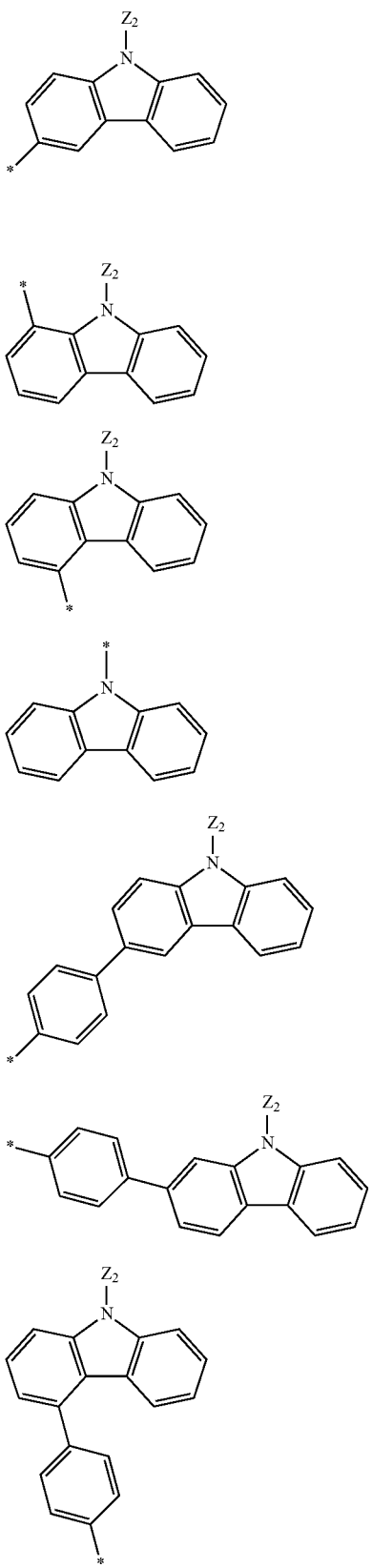
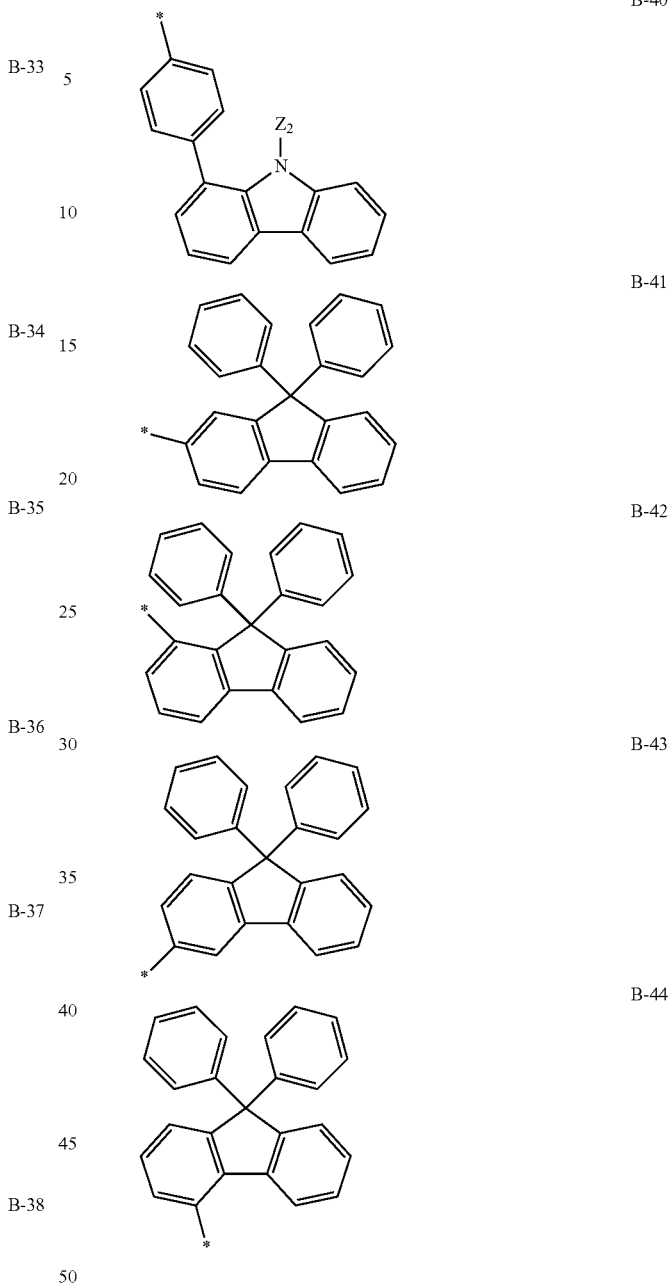

In Formulae B-1 to B-44, $Z_2$ and $Z_3$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubsti- $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and

* indicates a binding site to a neighboring atom.

In an embodiment, $Ar_1$ and $Ar_2$ may be identical to or different from each other.

In one or more embodiments, $Ar_1$ and $Ar_2$ may be different from each other.

a1 and a2 in Formula 1 may each independently be an integer from 1 to 5, wherein, when a1 is two or more, two or more groups $Ar_1$ may be identical to or different from each other, and when a2 is two or more, two or more groups $Ar_2$ may be identical to or different from each other.

For example, a1 and a2 may each independently be 1 or 2, but embodiments of the present disclosure are not limited thereto.

$R_1$ and $R_2$ in Formula 1 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In an embodiment, $R_1$ and $R_2$ may each independently be selected from:
hydrogen, deuterium, —F, —Cl, —Br, —I, a hydroxyl group, a $C_1$-$C_{20}$ alkyl group, a $C_1$-$C_{20}$ alkoxy group, a phenyl group, a naphthyl group, a fluorenyl group, a spiro-bifluorenyl group, a triphenylenyl group, a biphenyl group, a dimethylfluorenyl group, a diphenylfluorenyl group, a carbazolyl group, a phenylcarbazolyl group, a biphenylcarbazolyl group, a dibenzofuranyl group, and a dibenzothiophenyl group; and
a phenyl group, a naphthyl group, a fluorenyl group, a spiro-bifluorenyl group, a biphenyl group, a dimethylfluorenyl group, a diphenylfluorenyl group, a carbazolyl group, a phenylcarbazolyl group, a biphenylcarbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-bifluorenyl group, a triphenylenyl group, a biphenyl group, a dimethylfluorenyl group, a diphenylfluorenyl group, a carbazolyl group, a phenylcarbazolyl group, a biphenylcarbazolyl group, a dibenzofuranyl group, and a dibenzothiophenyl group.

For example, $R_1$ and $R_2$ may each independently be selected from hydrogen, deuterium, —F, —Cl, —Br, —I, a hydroxyl group, a $C_1$-$C_{20}$ alkyl group, a $C_1$-$C_{20}$ alkoxy group, a phenyl group, a naphthyl group, a fluorenyl group, a spiro-bifluorenyl group, a triphenylenyl group, a biphenyl group, a dimethylfluorenyl group, a diphenylfluorenyl group, a carbazolyl group, but embodiments of the present disclosure are not limited thereto.

In an embodiment, $R_1$ and $R_2$ may each be hydrogen.

b1 and b2 in Formula 1 may each independently be an integer from 1 to 3, wherein, when b1 is two or more, two or more groups $R_1$ may be identical to or different from each other, and when b2 is two or more, two or more groups $R_2$ may be identical to or different from each other.

For example, b1 and b2 may each independently be 1 or 2, but embodiments of the present disclosure are not limited thereto.

In an embodiment, the first repeating unit may be represented by one of Formulae 1-1 to 1-4:

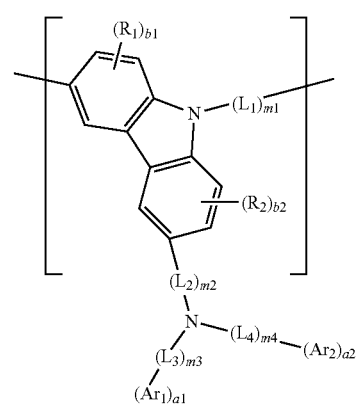

1-1

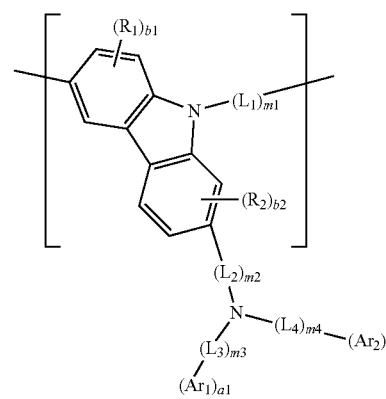

1-2

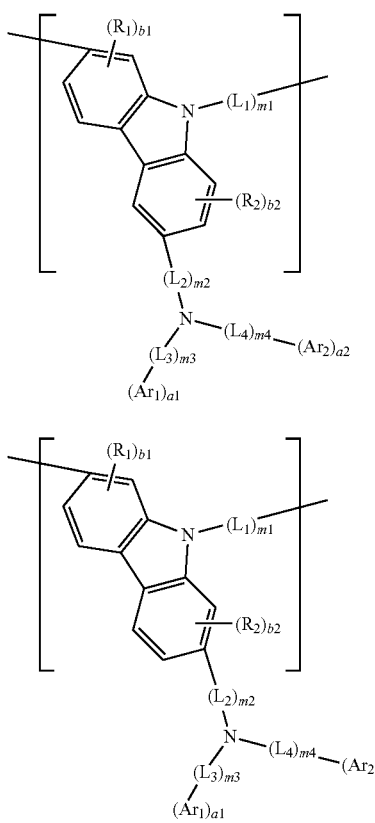
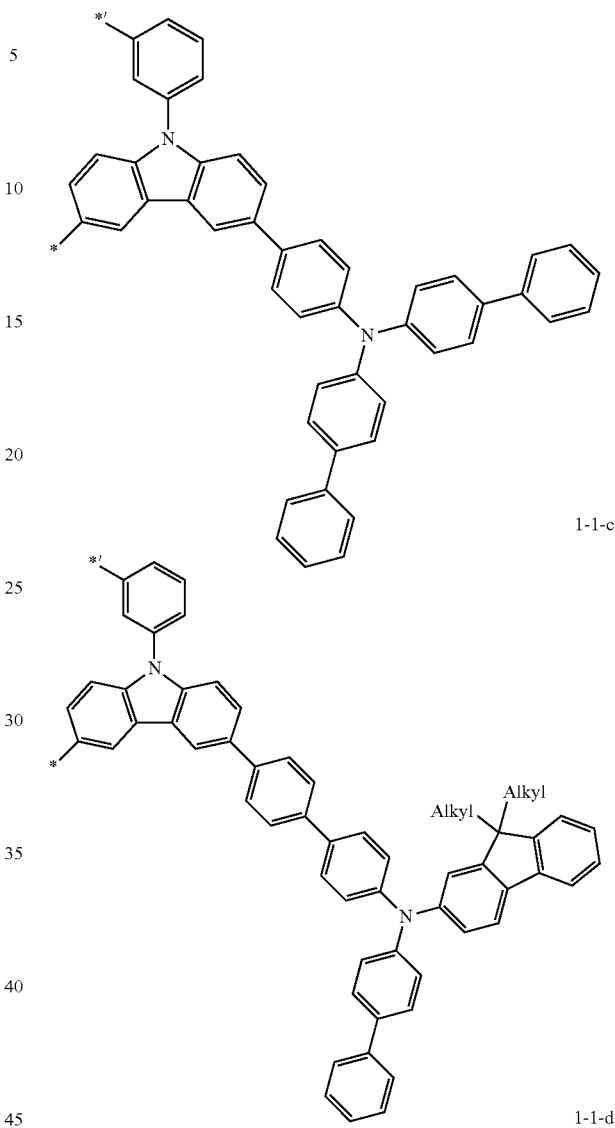
In Formulae 1-1 to 1-4,
$R_1$, $R_2$, b1, b2, $L_1$, $L_2$, $L_3$, $L_4$, m1, m2, m3, m4, $Ar_1$, $Ar_2$, a1, and a2 are the same as described herein.
In an embodiment, the repeating unit represented by Formula 1 may be represented by one of Formulae 1-1- to 1-1-r, 1-2-a to 1-2-l, 1-3-a to 1-3-l, and 1-4-a to 1-4-l:
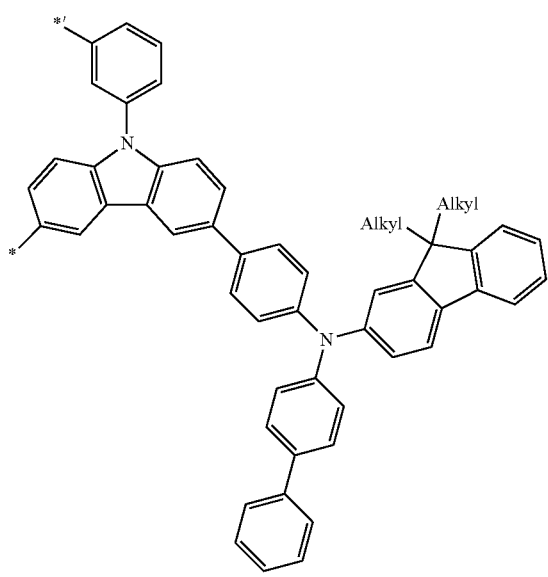

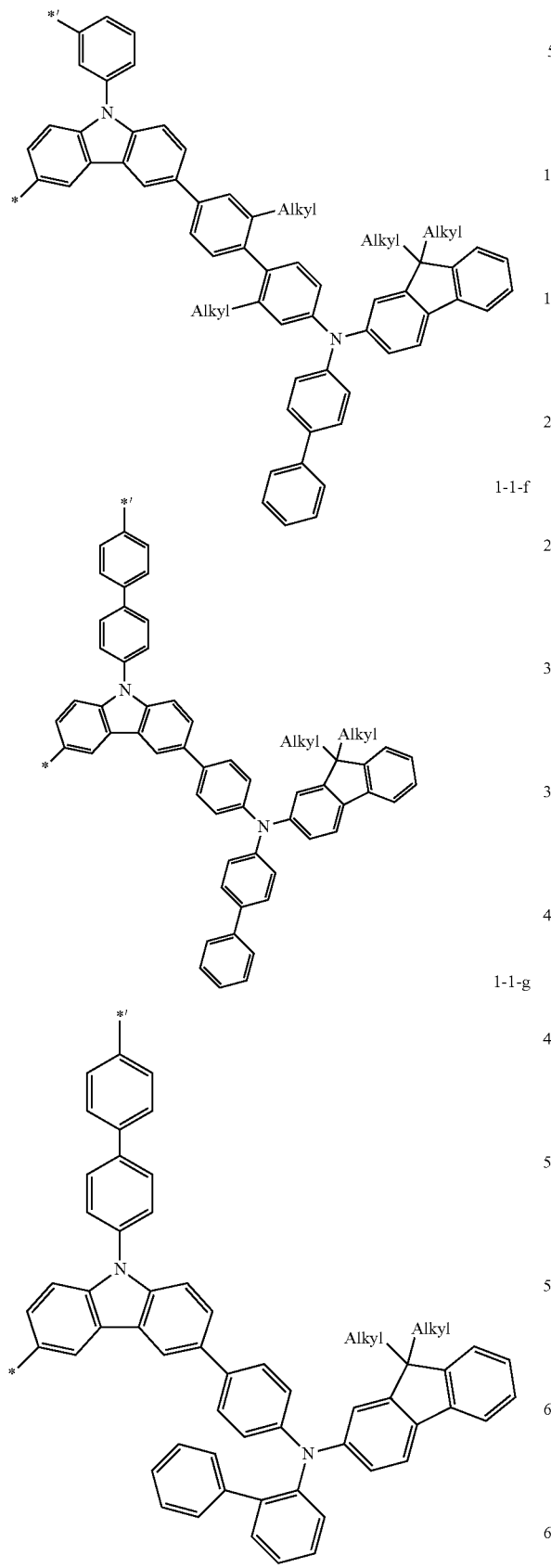
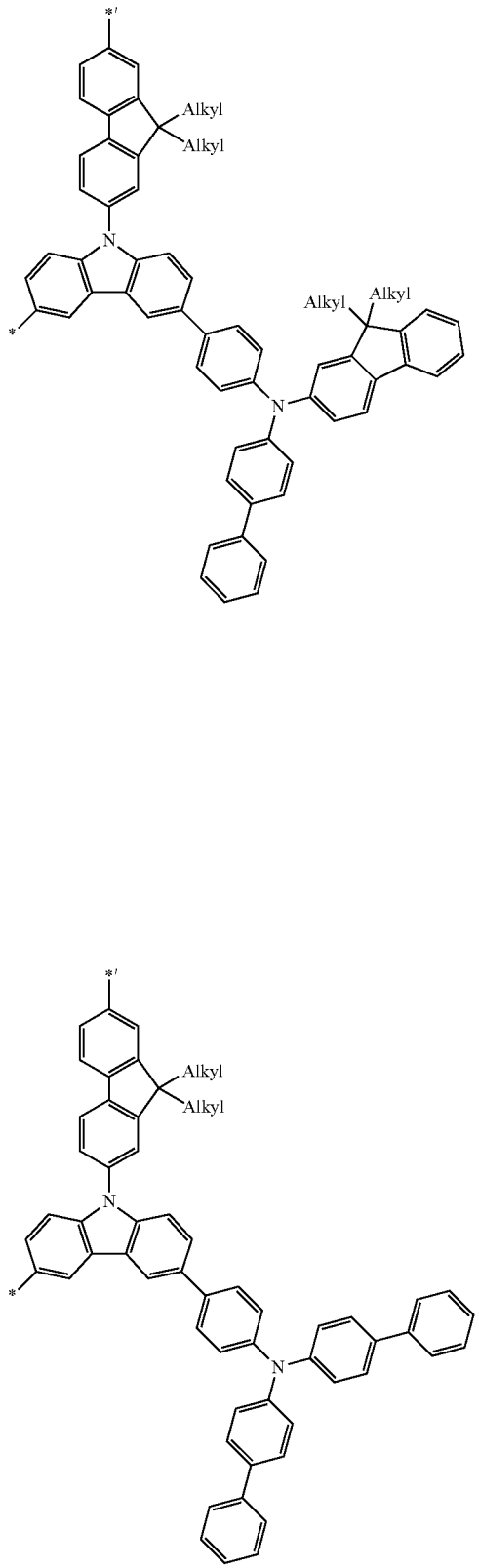

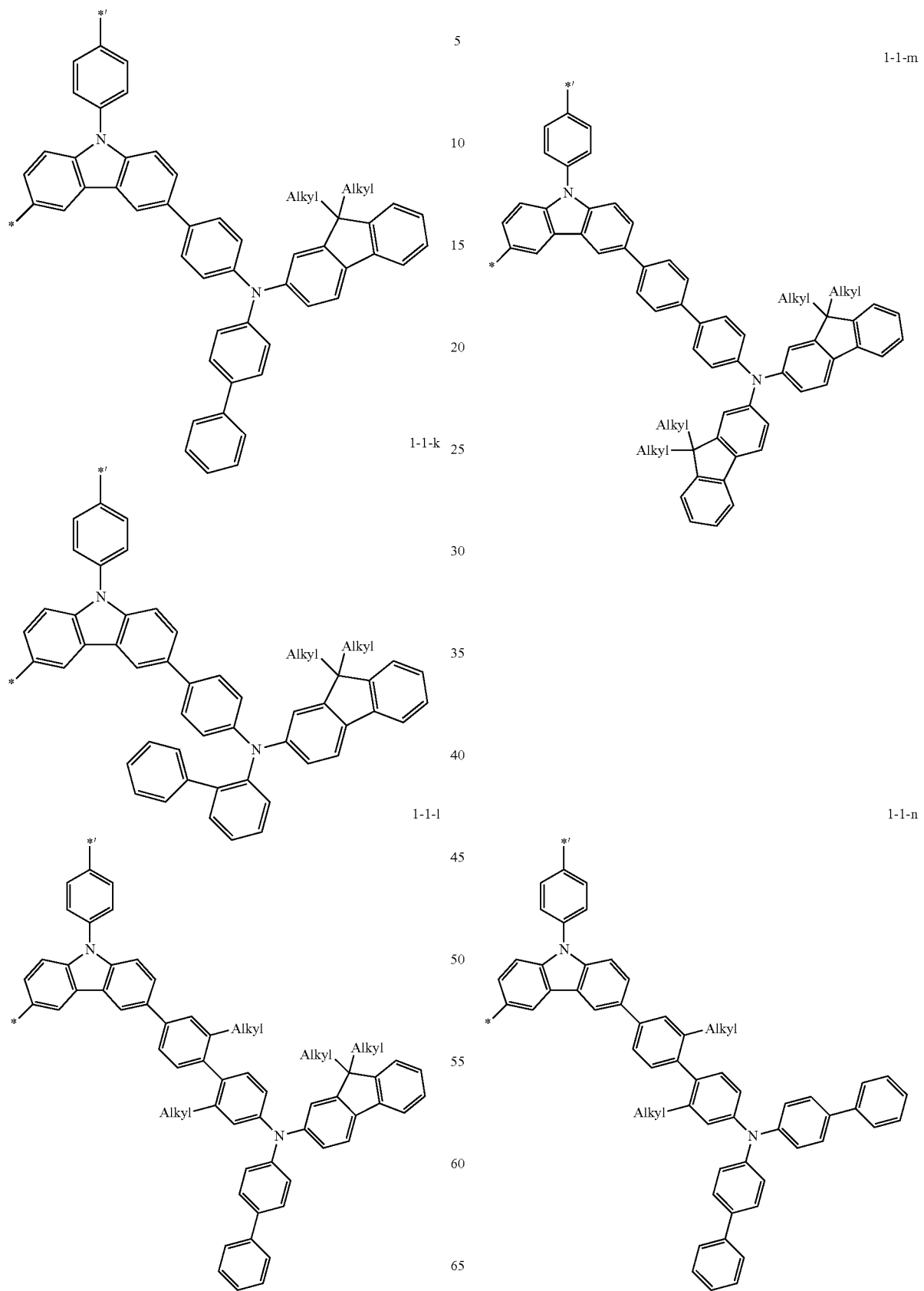

1-1-o
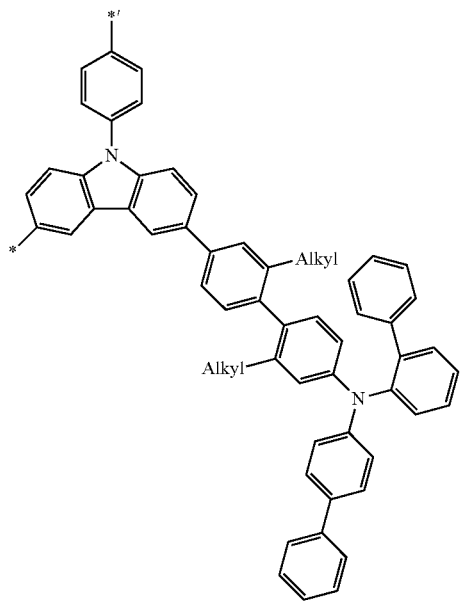
1-1-p
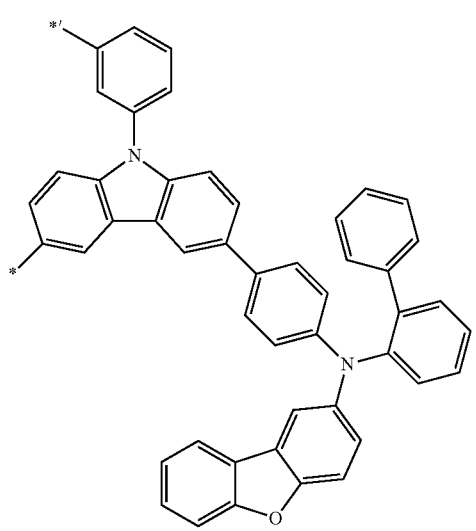
1-1-q
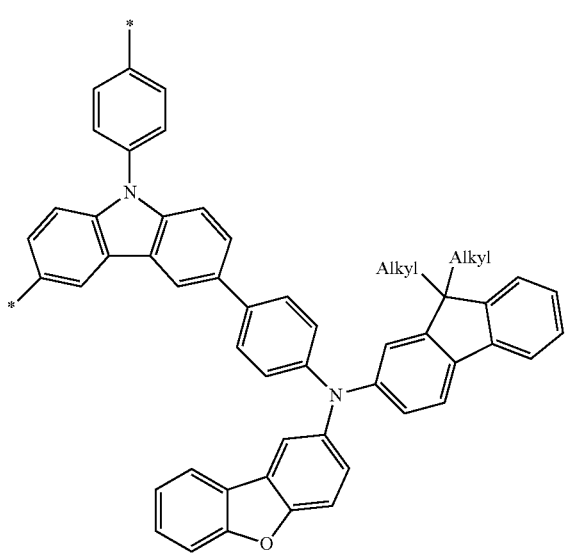
1-1-r
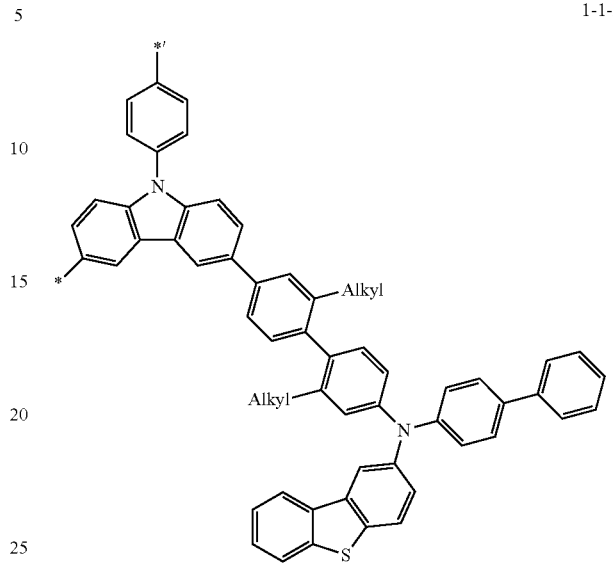
1-2-a
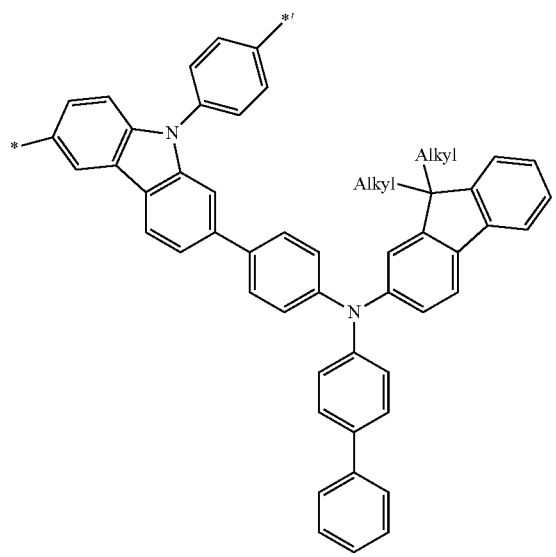
1-2-b
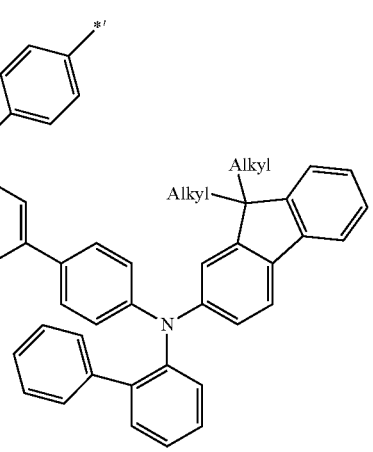

1-2-c
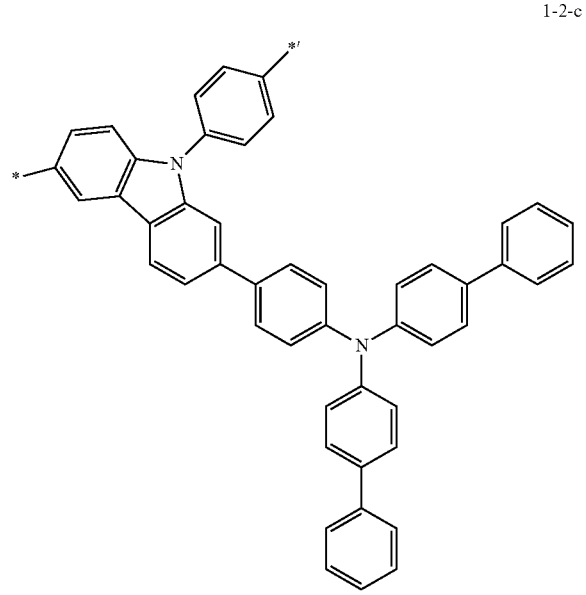
1-2-d
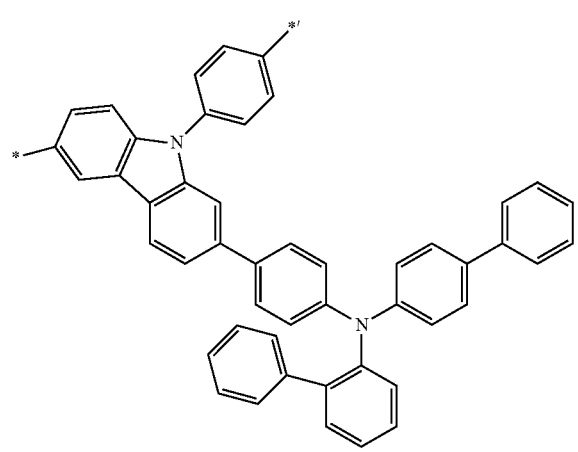
1-2-e
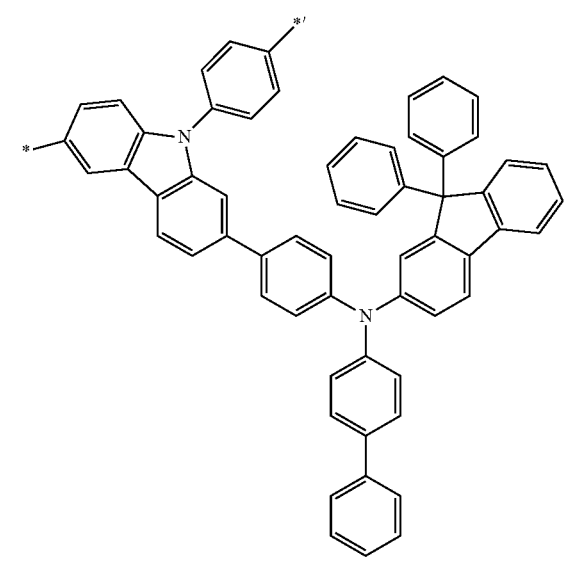
1-2-f
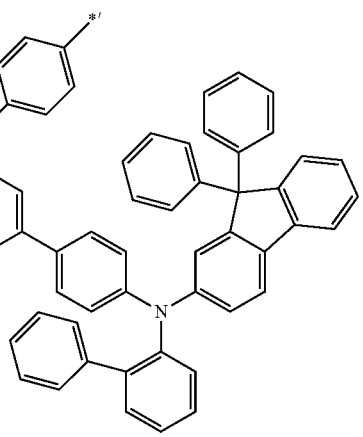
1-2-g
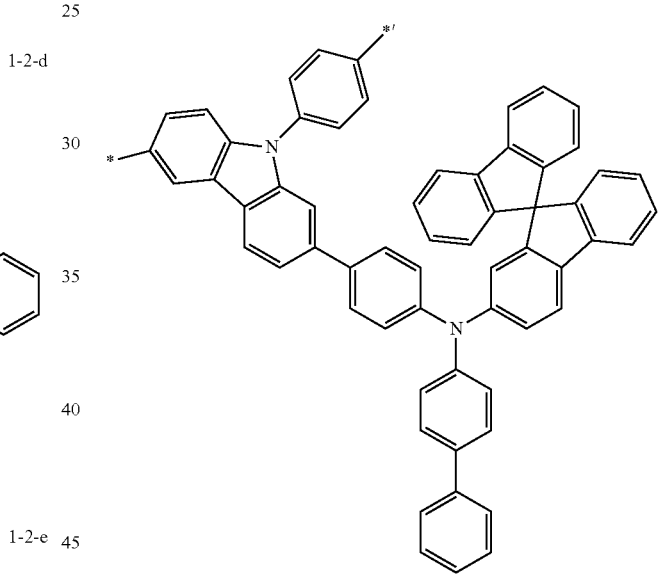
1-2-h
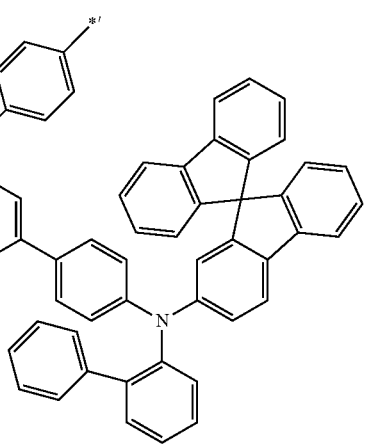

1-2-i
1-2-k
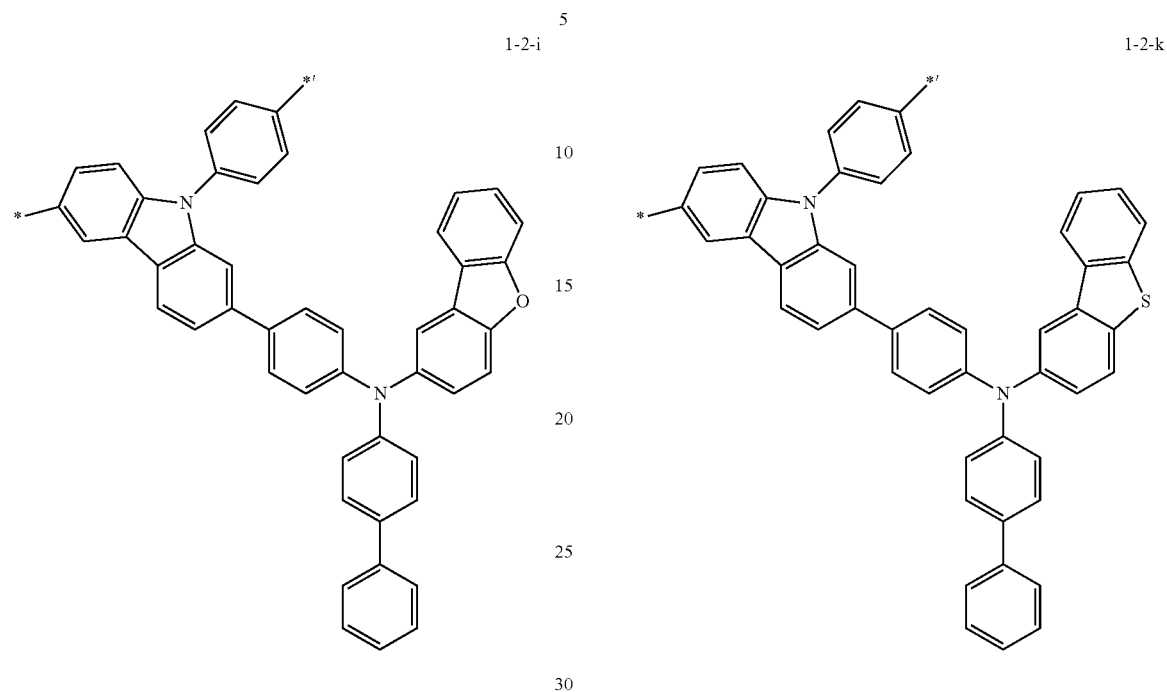
1-2-j
1-2-l
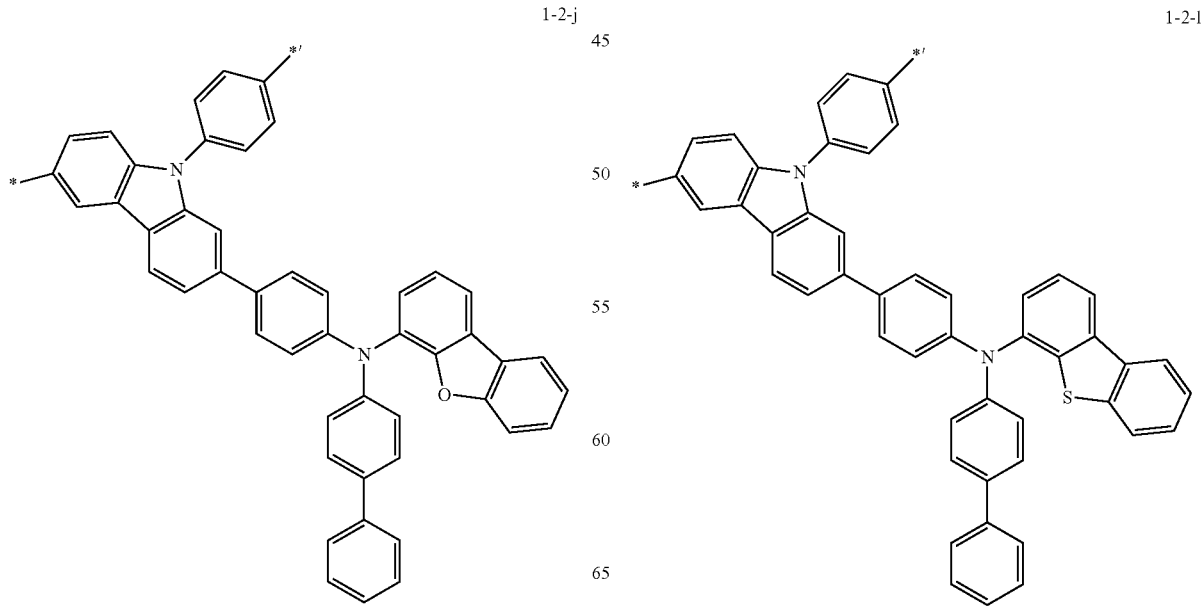

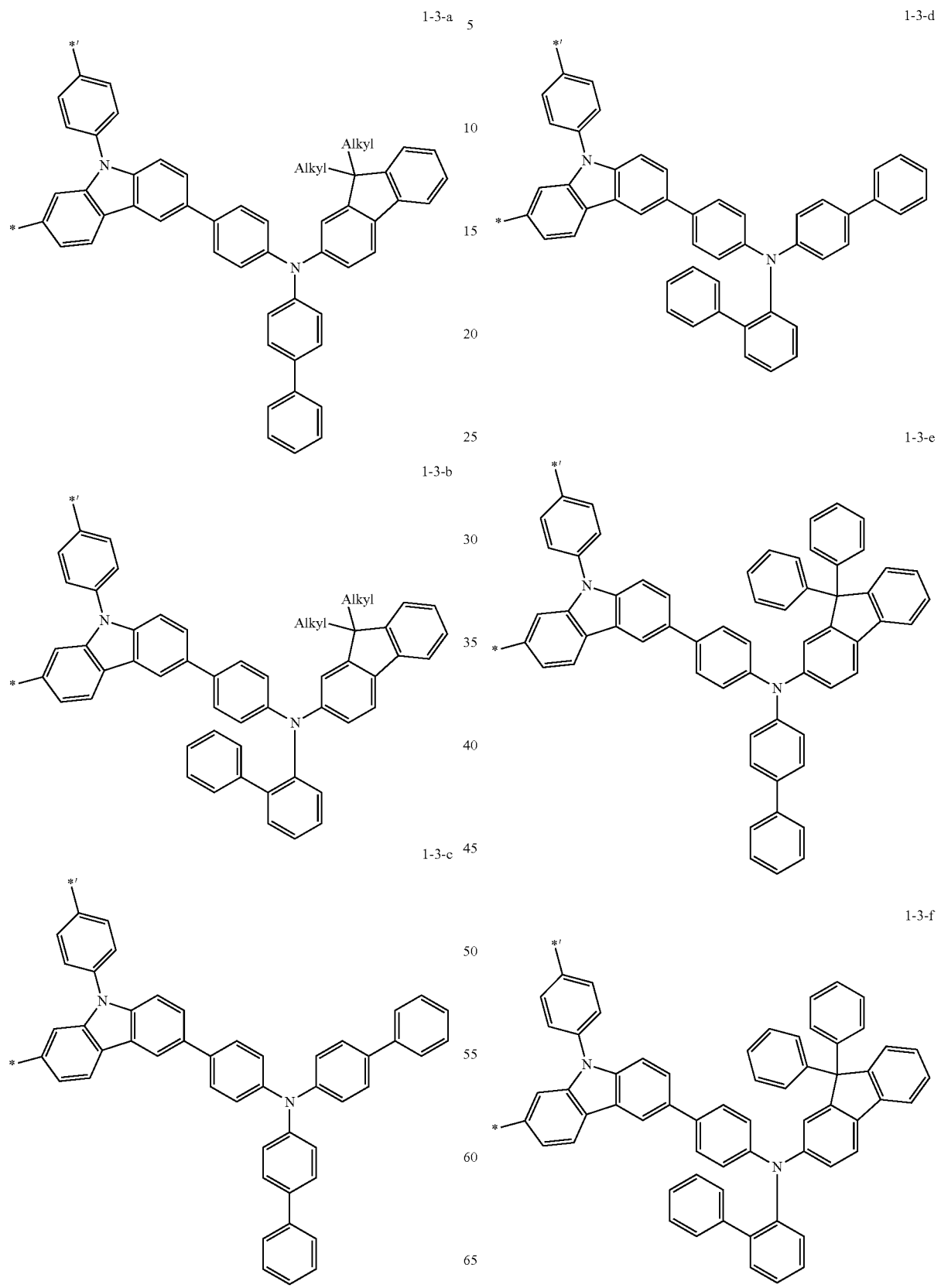

1-3-g
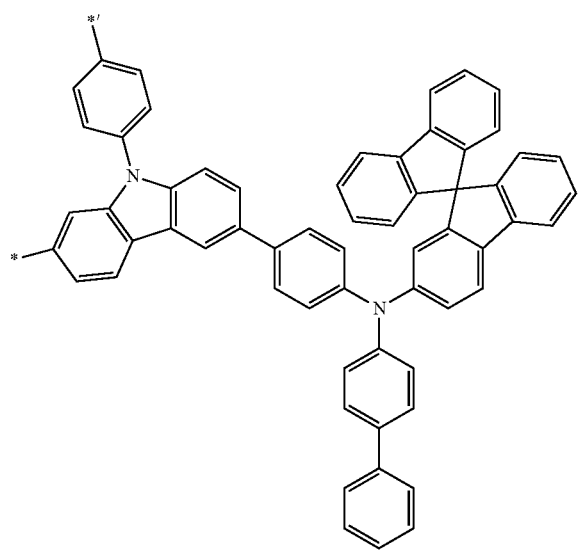
1-3-h
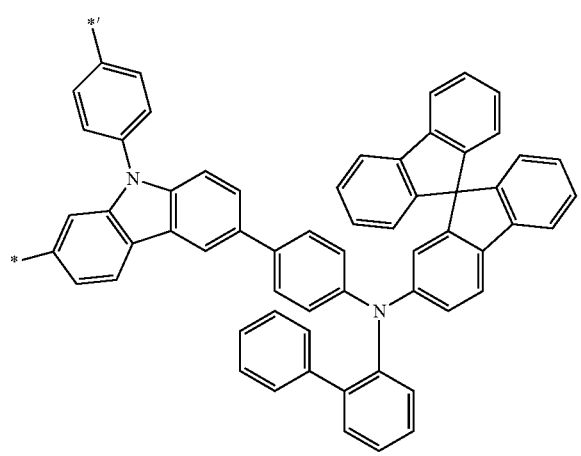
1-3-i
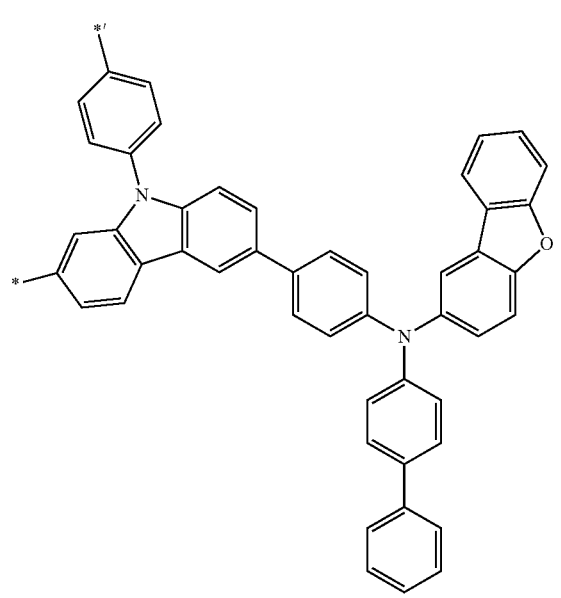
1-3-j
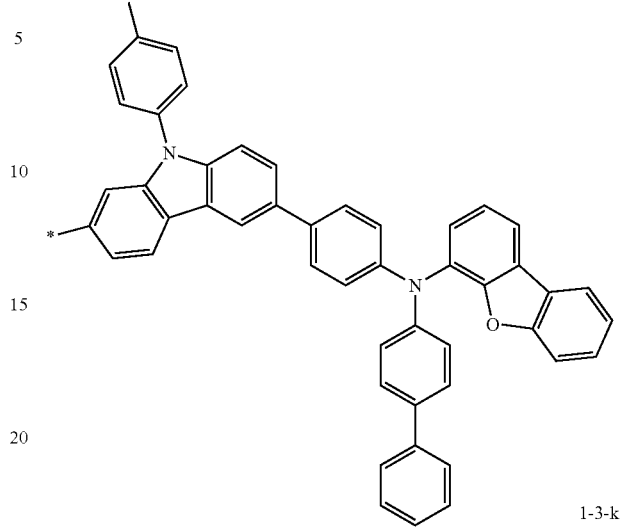
1-3-k
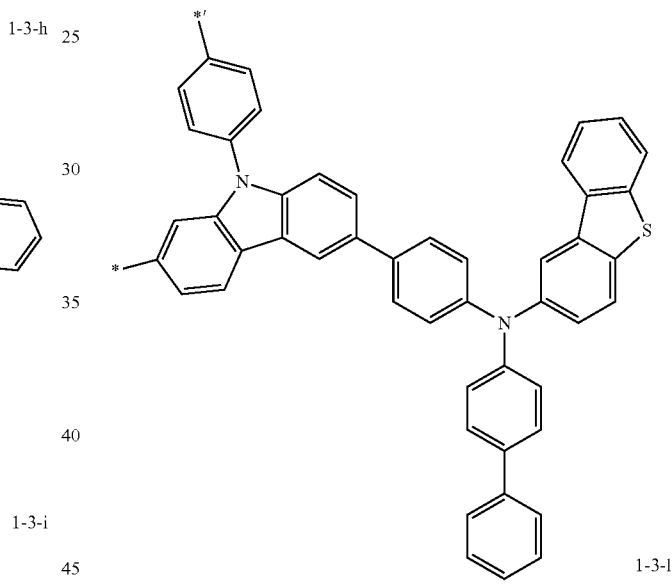
1-3-l
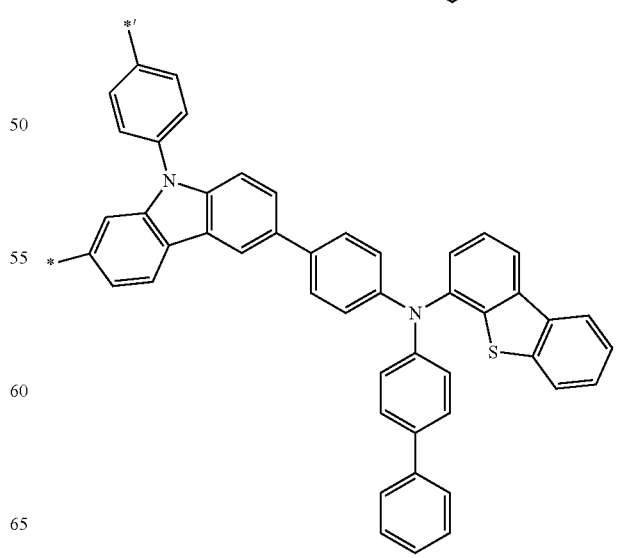

1-4-a
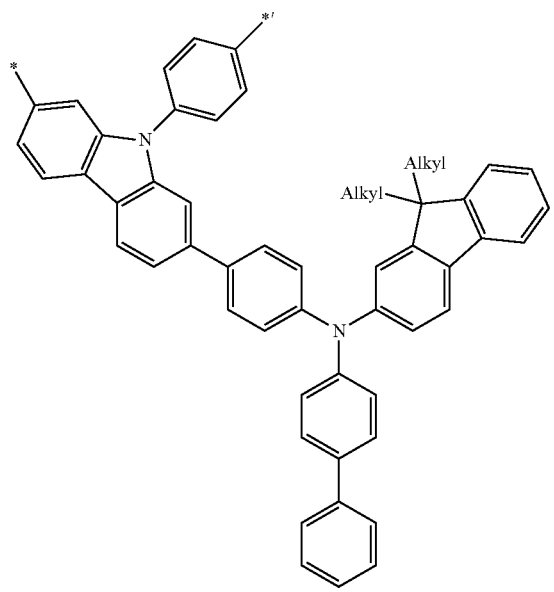
1-4-b
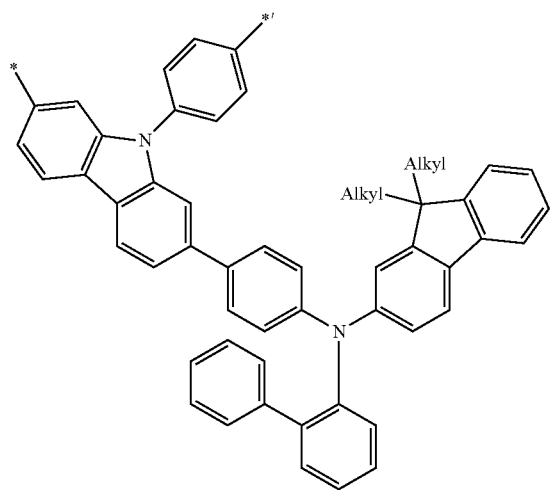
1-4-c
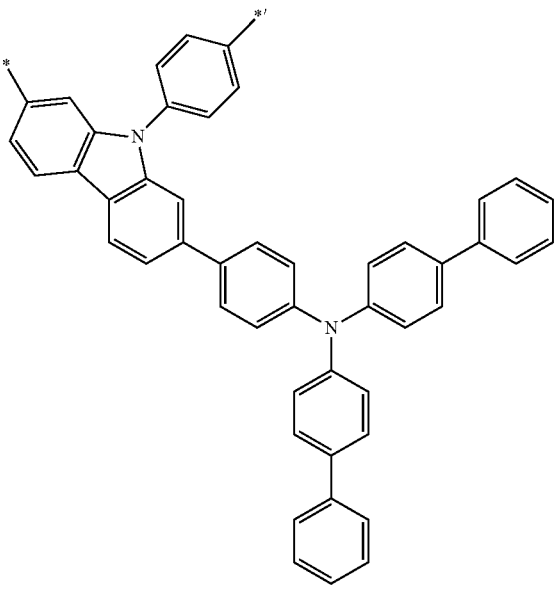
1-4-d
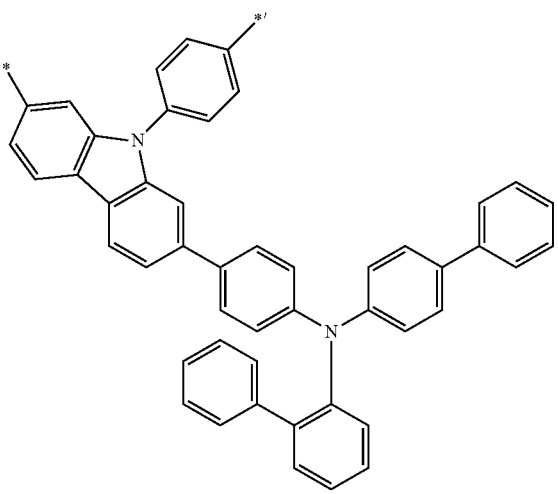

1-4-e
1-4-f
1-4-g
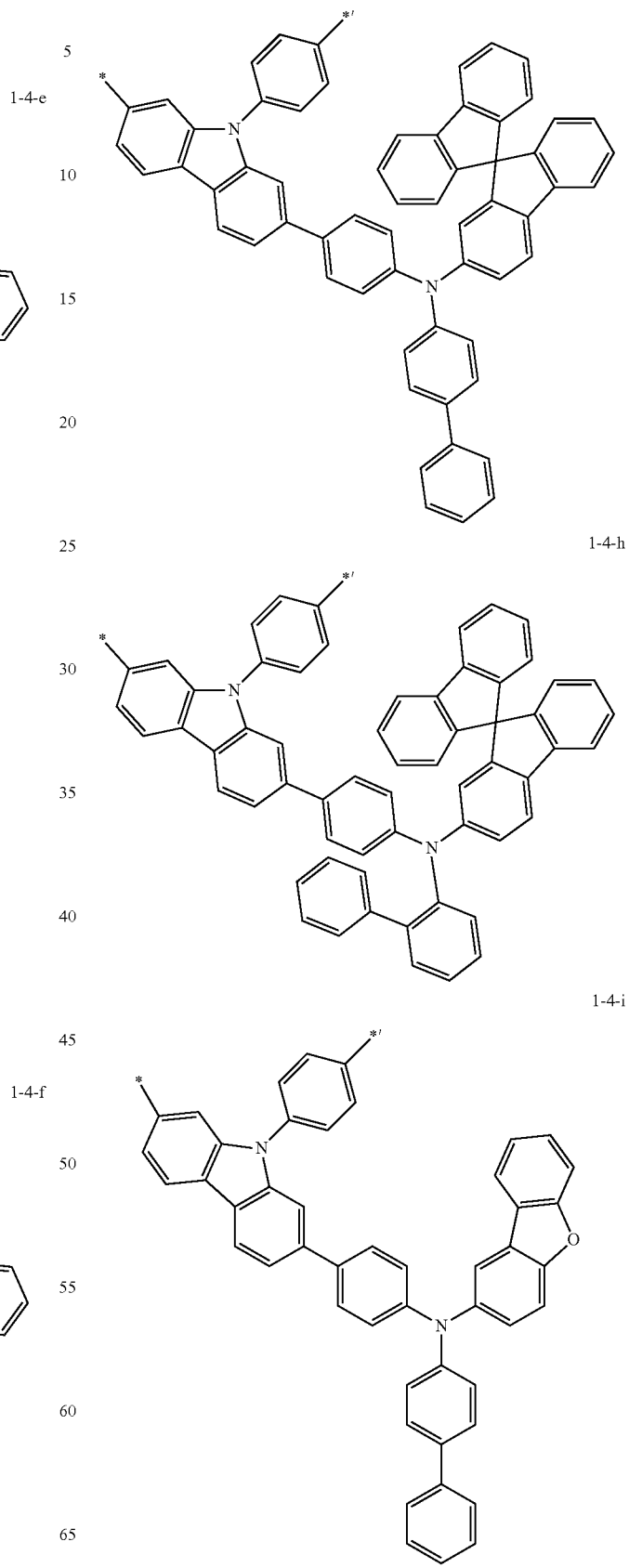
1-4-h
1-4-i 1-4-j

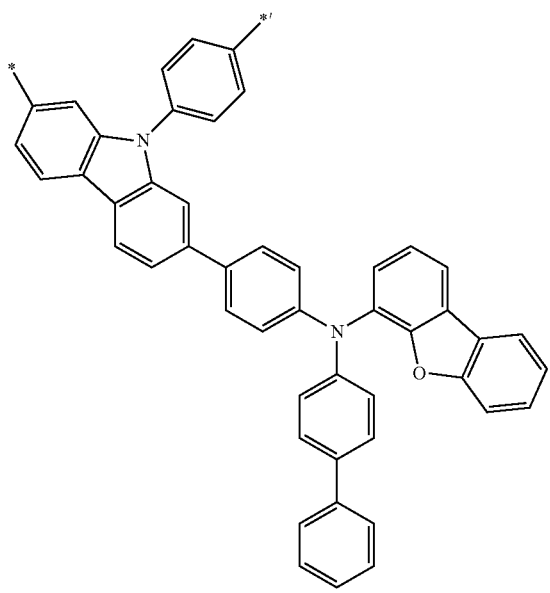

1-4-k

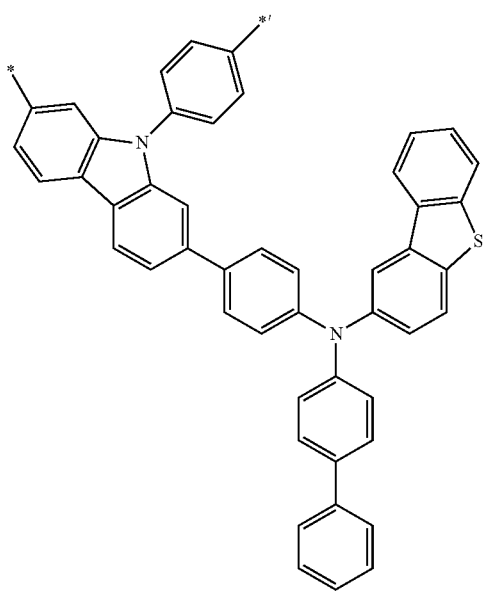

1-4-l

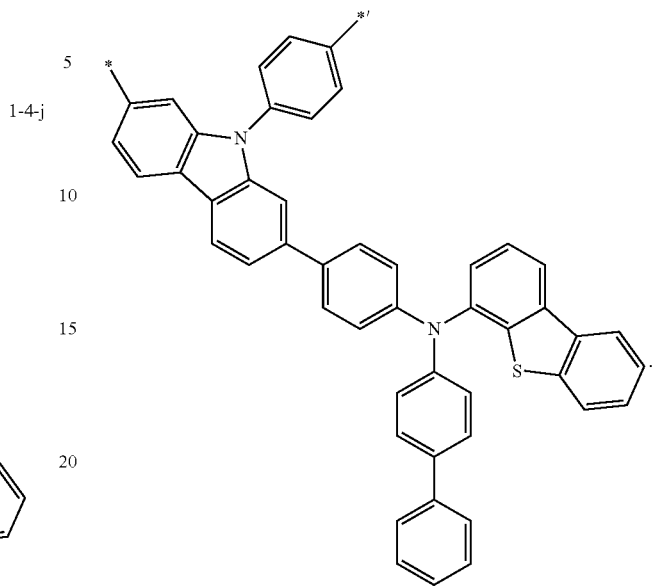

In Formulae 1-1-a to 1-1-r, 1-2-a to 1-2-l, 1-3-a to 1-3-l, and 1-4-a to 1-4-l, alkyl may be hydrogen, deuterium, —F, —Cl, —Br, —I, a hydroxyl group, a cyano group, a nitro group, an amino group, or a $C_1$-$C_{60}$ alkyl group, and

* and *' each indicate a binding site to a neighboring atom.

An amount of the first repeating unit in the polymer compound is not particularly limited, and may be adjusted by taking into account the hole transport capability of a layer formed using the polymer compound (for example, a hole injection layer or a hole transport layer). In an embodiment, the amount of the first repeating unit may be in a range of about 40 parts by weight to about 95 parts by weight, for example, about 40 parts by weight to about 90 parts by weight, based on 100 parts by weight of the polymer compound.

When the polymer compound includes two or more first repeating units having different structures, the amount of the first repeating unit means a total amount of the two or more first repeating units having different structures.

Second Repeating Unit

The polymer compound may further include a second repeating unit represented by Formula 2. For example, the polymer compound may include second repeating units having the same structure, or may include two or more second repeating units having different structures.

In an embodiment, the polymer compound may include two or more second repeating units having different structures.

Formula 2

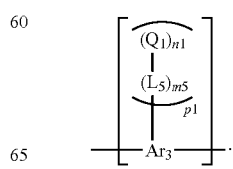

Ar₃ in Formula 2 may be a substituted or unsubstituted $C_5$-$C_{30}$ carbocyclic group or a substituted or unsubstituted $C_1$-$C_{30}$ heterocyclic group.

In an embodiment, Ar₃ may be selected from:

a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group; and a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group.

In one or more embodiments, Ar₃ may be a substituent represented by one of Formulae C-1 to C-4:

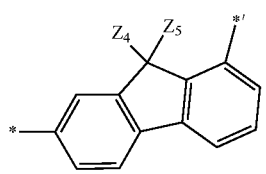

C-1

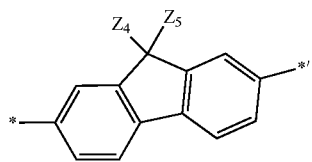

C-2

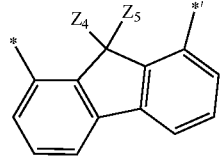

C-3

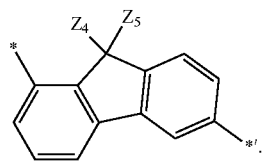

C-4

In Formulae C-1 to C-4, $Z_4$ and $Z_5$ may each independently be selected from -$(L_5)_{m5}$-$(Q_1)_{n1}$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, at least one of $Z_4$ and $Z_5$ may be -$(L_5)_{m5}$-$(Q_1)_{n1}$, and

* and *' each indicate a binding site to a neighboring atom.

In an embodiment, $Z_4$ and $Z_5$ may each be -$(L_5)_{m5}$-$(Q_1)_{n1}$, and are the same as described in connection with $Z_1$ in Formulae A-1 to A-6, and at least one of $Z_4$ and $Z_5$ may be -$(L_5)_{m5}$-$(Q_1)_{n1}$.

In an embodiment, Ar₄ may be a substituent represented by Formula C-2, but embodiments of the present disclosure are not limited thereto.

$L_5$ in Formula 2 may be selected from a single bond, a substituted or unsubstituted $C_1$-$C_{60}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In an embodiment, $L_5$ may be selected from:

a single bond, a $C_1$-$C_{60}$ alkylene group, a phenylene group, a naphthylene group, a fluorenylene group, a spiro-bifluorenyl group, a triphenylenylene group, and a carbazolylene group; and a $C_1$-$C_{60}$ alkylene group, a phenylene group, a naphthylene group, a fluorenylene group, a spiro-bifluorenyl group, a triphenylenylene group, and a carbazolylene group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a carbazole group, a fluorenyl group, and a triphenylenyl group.

m5 in Formula 2 may be an integer from 1 to 5, wherein, when m5 is two or more, two or more groups $L_5$ may be identical to or different from each other. For example, m5 may be 1 or 2, but embodiments of the present disclosure are not limited thereto.

$Q_1$ in Formula 2 may be a crosslinking group. The crosslinking group is not particularly limited as long as the crosslinking group can induce a crosslinking reaction by thermal energy or light energy, and the crosslinking group may be selected by taking into account the film-forming property of the polymer compound.

In an embodiment, $Q_1$ may be a monovalent crosslinking group including at least one selected from an ether group, a vinyl group, an acrylate group, a methacrylate group, a styryl group, an epoxy group, an oxetane group, and a benzocyclobutene group.

In an embodiment, $Q_1$ in Formula 2 may be a crosslinking group represented by one of Formulae Q-1 to Q-8:

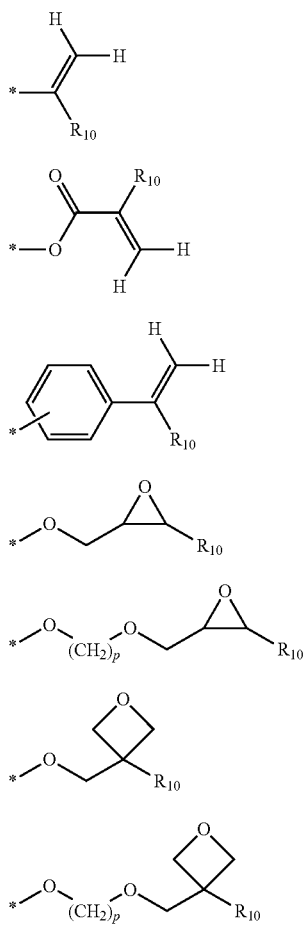

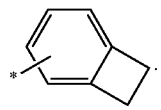

Q-8

In Formulae Q-1 to Q-8, $R_{10}$ may be hydrogen, deuterium, —F, —Cl, —Br, —I, a hydroxyl group, a cyano group, a nitro group, an amino group, or a $C_1$-$C_{10}$ alkyl group, and p may be an integer from 1 to 10.

In an embodiment, $R_{10}$ may be hydrogen, a methyl group, an ethyl group, a propyl group, an iso-butyl group, a sec-butyl group, a tert-butyl group, a pentyl group, an iso-amyl group, or a hexyl group, but embodiments of the present disclosure are not limited thereto.

In an embodiment, p may be an integer from 1 to 5, for example, 1 or 2.

In an embodiment, for example, a benzocyclobutene ring such as cyclo[4,2,0]octa-1,3,5-triene group may be used as $Q_1$ by taking into account the crosslinkability, the structural stability of the crosslinked structure, and the electrochemical stability of the second repeating unit:

cyclo[4,2,0]octa-1,3,5-triene group

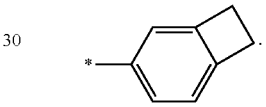

In one or more embodiments, a ring-type ether group such as an epoxy group or an oxetane group, or a vinyl ether group may be used as $Q_1$ by taking into account the crosslinkability of the second repeating unit.

p1 in Formula 2 may be an integer from 1 to 5, wherein, when p1 is two or more, two or more groups -$(L_5)_{m5}$-$(Q_1)_{n1}$ may be identical to or different from each other. In an embodiment, p1 may be 1 or 2.

In an embodiment, the second repeating unit may be represented by Formula 2-1 or 2-2:

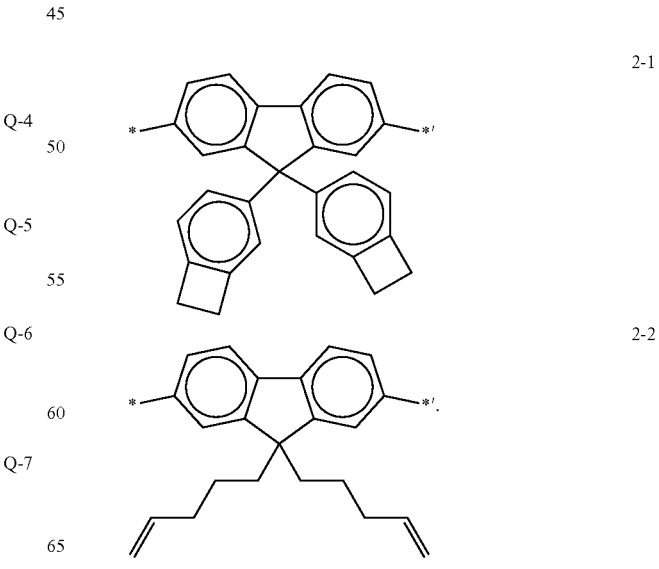

In Formulae 2-1 and 2-2,
* and *' each indicate a binding site to a neighboring atom.

An amount of the second repeating unit is not particularly limited, and may be adjusted by taking into the film-forming property of the second polymer compound. In an embodiment, the amount of the second repeating unit may be in a range of about 1 part by weight to about 15 parts by weight, for example, about 1 part by weight to about 10 parts by weight, based on 100 parts by weight of the polymer compound.

When the polymer compound includes two or more second repeating units having different structures, the amount of the second repeating unit means a total amount of the two or more second repeating units having different structures.

The second repeating unit represented by Formula 2 includes a crosslinking group ($Q_1$ in Formula 2). Therefore, by introducing the second repeating unit, the film-forming property may be improved by using solution coating.

Third Repeating Unit

The polymer compound may further include a third repeating unit represented by Formula 3. For example, the polymer compound may include third repeating units having the same structure, or may include two or more third repeating units having different structures:

   Formula 3

In Formula 3, $Ar_5$ may be a substituted or unsubstituted $C_5$-$C_{30}$ carbocyclic group or a substituted or unsubstituted $C_1$-$C_{30}$ heterocyclic group.

In Formula 3, the description provided in connection with $Ar_1$ to $Ar_3$ in Formula 2 or the description provided in connection with $Ar_4$ in Formula 3 may be applied to $Ar_5$.

In an embodiment, the third repeating unit may be represented by one of Formulae 4-1 and 4-2:

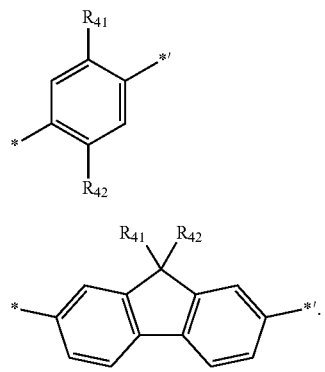

In Formulae 4-1 and 4-2,
$R_{41}$ and $R_{42}$ may each independently be hydrogen, deuterium, —F, —Cl, —Br, —I, a hydroxyl group, a cyano group, a nitro group, an amino group, or a $C_1$-$C_{60}$ alkyl group, and
* and *' each indicate a binding site to a neighboring atom.

In an embodiment, the third repeating unit may be represented by Formula 4-1, but embodiments of the present disclosure are not limited thereto.

An amount of the third repeating unit is not particularly limited, and may be adjusted by taking into account the solubility of the polymer compound in a solvent. In an embodiment, the amount of the third repeating unit may be in a range of about 1 part by weight to about 60 parts by weight, for example, about 10 parts by weight to about 50 parts by weight, based on 100 parts by weight of the polymer compound.

In one or more embodiments, the amount of the third repeating unit may be in a range of about 40 parts by weight to about 60 parts by weight based on 100 parts by weight of the polymer compound.

When the polymer compound includes two or more third repeating units having different structures, the amount of the third repeating unit means a total amount of the two or more third repeating units.

Since the polymer compound including the third repeating unit has excellent solubility in a solvent, the film formation using solution coating may be facilitated by introducing the third repeating unit into the polymer compound.

In an embodiment, the polymer compound may include only the first repeating unit, or may be a copolymer further including another repeating unit in addition to the first repeating unit.

In an embodiment, the polymer compound may include the first repeating unit and the second repeating unit. That is, the polymer compound may be a copolymer including the first repeating unit and the second repeating unit, or may be a copolymer further including another repeating unit in addition to the first repeating unit and the second repeating unit.

In an embodiment, the polymer compound may include the first repeating unit and the third repeating unit. That is, the polymer compound may be a bipolymer including the first repeating unit and the third repeating unit, or may be a copolymer further including another repeating unit in addition to the first repeating unit and the third repeating unit.

In an embodiment, the polymer compound may include the first repeating unit, the second repeating unit, and the third repeating unit. That is, the polymer compound may be a terpolymer including the first repeating unit, the second repeating unit, and the third repeating unit, or may be a copolymer further including another repeating unit in addition to the first repeating unit, the second repeating unit, and the third repeating unit.

When the polymer compound is the terpolymer including the first repeating unit, the second repeating unit, and the third repeating unit, an amount of the first repeating unit is in a range of about 40 parts by weight to about 95 parts by weight based on 100 parts by weight of the polymer compound, an amount of the second repeating unit may be in a range of about 5 parts by weight to about 15 parts by weight based on 100 parts by weight of the polymer compound, and an amount of the third repeating unit may be in a range of about 5 parts by weight to about 50 parts by weight based on 100 parts by weight of the polymer compound.

In an embodiment, the structure of the polymer compound is not particularly limited, and the polymer compound may be a random copolymer, an alternating copolymer, a periodic copolymer, or a block copolymer.

The weight average molecular weight (Mw) of the polymer compound is not particularly limited as long as the effects of the present disclosure can be obtained. In an embodiment, the weight average molecular weight (Mw) of the polymer compound may be in a range of about 10,000 Daltons (Da) to about 500,000 Da, for example, about 20,000 Da to about 350,000 Da. When the weight average molecular weight (Mw) is within this range, a layer having a uniform thickness may be formed by appropriately adjusting a viscosity of a composition including the polymer compound.

The number average molecular weight (Mn) of the polymer compound is not particularly limited as long as the effects of the present disclosure can be obtained. In an embodiment, the number average molecular weight (Mn) of the polymer compound may be in a range of about 10,000 Da to about 200,000 Da, for example, about 20,000 Da to about 100,000 Da. When the number average molecular weight (Mn) is within this range, a layer having a uniform thickness may be formed by appropriately adjusting a viscosity of a composition including the polymer compound.

In an embodiment, the molecular weight distribution (weight average molecular weight/number average molecular weight) of the polymer compound may be in a range of about 1.5 to about 5.0, for example, about 1.6 to about 4.5.

The number average molecular weight (Mn) and the weight average molecular weight (Mw) were measured by the following method. However, the method of measuring the number average molecular weight (Mn) and the weight average molecular weight (Mw) is not particularly limited, and known methods may be applied thereto.

Measurement of Number Average Molecular Weight (Mn) and Weight Average Molecular Weight (Mw)

The number average molecular weight (Mn) and the weight average molecular weight (Mw) were measured under the following conditions by gel permeation chromatography (GPC) using polystyrene as a standard sample.

Analysis apparatus: Prominance (manufactured by Shimadzu Corporation)
Column: PLgel MIXED-B (manufactured by Polymer Laboratories Inc.)
Column temperature: 40° C.
Flow rate: 1.0 milliliters per minute (mL/min)
Dose: 20 microliters (μL) (concentration: about 0.05 parts by weight, wt %)
Solvent: tetrahydrofuran (THF)
Detector: UV-VIS detector (SPD-10AV, manufactured by Shimadzu Corporation)
Standard sample: Polystyrene The main chain terminal of the polymer compound may be appropriately defined according to a type of a material used. For example, the main chain terminal of the polymer compound may be a hydrogen atom, but embodiments of the present disclosure are not limited thereto.

The polymer compound may be easily understood and prepared by those of ordinary skill in the art by referring to known organic synthesis methods or Examples provided below.

For example, the polymer compound may be prepared by using a copolymerization reaction by using at least one first monomer represented by Formula 11 and at least one second monomer represented by Formula 12 and/or at least one third monomer represented by Formula 13.

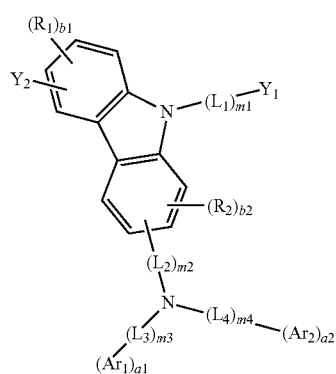

Formula 11

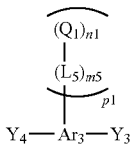

Formula 12

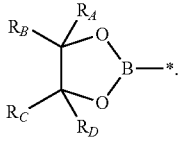

Formula 13

Formula 14

In Formulae 11 to 13, $L_1$, $L_2$, $L_3$, $L_4$, $L_5$, m1, m2, m3, m4, m5, $Ar_1$, $Ar_2$, a1, a2, $R_1$, $R_2$, b1, b2, $Ar_3$, $Q_1$, n1, p1, and $Ar_4$ are the same as described in Formulae 1 to 3, $Y_1$ to $Y_6$ may each independently be —F, —Cl, —Br, —I, or a substituent represented by Formula 14, wherein in Formula 14, $R_A$ to $R_D$ may each independently be a $C_1$-$C_3$ alkyl group, and

* indicates a binding site to a neighboring atom.

The first monomer, the second monomer, and the third monomer may be synthesized according to a known synthesis method, and the structures thereof may be identified by a known method, for example, NMR and LC-MS.

The polymer compound according to the embodiment includes a first repeating unit, and thus, when the polymer compound is applied to an organic light-emitting device, a triplet energy level is low and a driving voltage is low. Also, when the polymer compound according to the embodiment is used as a hole injection material or a hole transport material (in particular, a hole transport material), a high charge mobility may be achieved and current density may be improved. Thus, deterioration influence on electrons may be reduced to thereby improve a device lifespan (emission lifespan). Therefore, an organic light-emitting device including the polymer compound according to the embodiment may have excellent luminescent efficiency and durability.

Also, the polymer compound according to the embodiment further includes a second repeating unit having a crosslinking group, thereby improving stability of a coated film.

Furthermore, since the polymer compound according to the embodiment further includes a third repeating unit, the solubility in a solvent may be improved. Thus, when an organic light-emitting device is formed in a stacked structure, luminescent characteristics and stability may be improved.

The polymer compound may be used as a material for an organic light-emitting device and may provide a material for an organic light-emitting device, which has high current efficiency and high charge mobility according to a high triplet energy level.

Also, since the first repeating unit in the polymer compound has a flexible structure as described above, the polymer compound may have high solubility in a solvent and has high heat resistance, thereby facilitating film formation using solution coating.

At present, an organic light-emitting device is manufactured by a vapor deposition method and a wet method. The vapor deposition method facilitates multi-layered stacking and may easily optimize an energy diagram by stacking. Therefore, it is possible to improve luminescent efficiency and lifespan and achieve a low driving voltage. However, the biggest problem of the vapor deposition method is low productivity and low yield.

In this respect, since a process of manufacturing a light-emitting device by a wet method enables a printing process, it is possible to expect large scale and high productivity. However, the biggest problem of the wet method is the design of materials which can be laminated.

Hole transport materials that can be laminated by an existing coating method are developed based on a soluble-insoluble control technique, and may be largely divided into a hydrophilic control material, a polymer crosslinking type material, and a low molecular crosslinking type material. A polymer crosslinking type material is mainly developed in terms of the number of laminations, the purity of materials, and the like.

As an example of the hole transport material that can be laminated by the coating method, arylamine polymers are disclosed in Patent Documents 1 and 2.

Patent Document 1: JP 2016-084370 A
Patent Document 2: JP 2016-503087 A

However, the electrical characteristics when the polymer crosslinking type material is used as the hole transport material are highly dependent on optical properties of the constituent units, and in particular, hole transport capability and triplet energy level are highly dependent on the molecular weight. Therefore, when the molecular weight of the material increases, the hole mobility increases, but the triplet energy level decreases. Also, as in the case of the polymer compounds disclosed in Patent Documents 3 to 5, when the triplet energy level increases, the hole transport capability is deteriorated and the driving voltage increases.

Patent Document 3: International Patent Publication No. 2013-191086
Patent Document 4: International Patent Publication No. 2013-191088
Patent Document 5: JP 2014-065885 A Therefore, the inventors of the subject matter of the present application have studied a means for suppressing the deterioration of the hole transport while maintaining a high triplet energy level and also suppressing the increase of the driving voltage. As a result, the inventors have found that, when the polymer compound includes the first repeating unit represented by Formula 1, the polymer compound exhibited a high triplet energy level and excellent hole transport capability and suppressed the increase of the driving voltage.

Generally, as the triplet energy level is higher, a singlet energy level also increases. Thus, a highest occupied molecular orbital (HOMO) level related to the hole injection and transport is reduced and the driving voltage of the device is increased. In this regard, in the first repeating unit represented by Formula 1, a triarylamine structure is linked to one of positions 1 to 4 of a carbazole ring through a linker $L_2$, thereby suppressing the deepening of the HOMO level while maintaining the triplet energy level.

Therefore, the polymer compound according to the embodiment may have a high triplet energy level and excellent hole transport capability and may suppress the increase of the driving voltage. However, this mechanism is based on speculation, and the present disclosure is not limited to the above-described mechanism.

Composition for Manufacturing Light-Emitting Device

Another aspect of the present disclosure provides a composition for manufacturing a light-emitting device, which includes the polymer compound and a liquid medium.

The polymer compound or the material for manufacturing the light-emitting device, which includes the polymer compound, has high charge mobility, and thus, can be used as a hole injection material, a hole transport material, or an emission layer material. In an embodiment, the polymer compound and the light-emitting device material including the polymer compound may be used as a hole injection material or a hole transport material, for example, a hole transport material, in terms of hole transportability.

In an embodiment, the composition for manufacturing the light-emitting device may include the polymer compound and at least one selected from a hole transport material, an electron transport material, and a light-emitting material.

In an embodiment, the light-emitting material may be an organometallic complex compound or a semiconductor compound, but embodiments of the present disclosure are not limited thereto.

The composition for manufacturing the light-emitting device may include the polymer compound and a liquid medium. The composition for manufacturing the light-emitting device may be used for forming each layer of the light-emitting device by using solution coating.

The liquid medium may be a liquid medium (for example, a solvent) capable of dissolving the material for the light-emitting device. That is, the composition for manufacturing the light-emitting device may be a solution composition.

Examples of the liquid medium may include toluene, xylene, ethylbenzene, diethylbenzene, mesitylene, propylbenzene, cyclohexylbenzene, dimethoxybenzene, anisole, ethoxy toluene, phenoxytoluene, iso-propylbiphenyl, dimethylanisole, phenyl acetate, phenyl propionic acid, methyl benzoate, but ethyl benzoate, but embodiments of the present disclosure are not limited thereto.

The concentration of the material for the light-emitting device in the composition for manufacturing the light-emitting device may be adjusted according to usage.

In an embodiment, a method of manufacturing a light-emitting device, which includes a first electrode, a second electrode, and an organic layer disposed between the first electrode and the second electrode, wherein the organic layer includes an emission layer and the polymer compound, includes forming a layer including the polymer compound by solution coating using a composition including the polymer compound and the liquid medium.

Light-Emitting Device

An aspect of the present disclosure provides a light-emitting device including: a first electrode; a second electrode; and an intermediate layer disposed between the first electrode and the second electrode, wherein the intermediate layer includes an emission layer, and
wherein the intermediate layer includes the polymer compound described above.

In an embodiment, the intermediate layer may include an organic compound, a semiconductor compound, or a combination thereof.

For example, the intermediate layer may include an organic compound. When the intermediate layer includes the organic compound, the light-emitting device may be an organic light-emitting device (OLED).

In an embodiment, the organic compound may be a compound that emits light from triplet excitons, but embodiments of the present disclosure are not limited thereto.

For example, the intermediate layer may include the semiconductor compound. When the intermediate layer includes the semiconductor compound, the light-emitting device may be a quantum-dot light-emitting device (QLED).

In an embodiment, the semiconductor compound may be a quantum dot, but embodiments of the present disclosure are not limited thereto.

Organic Light-Emitting Device

Hereinafter, an organic light-emitting device among the light-emitting devices will be described in detail.

Hereinafter, with reference to FIG. 1, an embodiment of an organic light-emitting device will be described in detail. FIG. 1 is a schematic view of an organic light-emitting device according to an embodiment.

An organic light-emitting device 100 according to an example embodiment may include a substrate 110, a first electrode 120 disposed on the substrate 110, a hole injection layer 130 von the first electrode 120, a hole transport layer 140 disposed on the hole injection layer 130, an emission layer 150 disposed on the hole transport layer 140, an electron transport layer 160 disposed on the emission layer 150, an electron injection layer 170 disposed on the electron transport layer 160, and a second electrode 180 disposed on the electron injection layer 170.

In the organic light-emitting device 100, the polymer compound represented by Formula 1 may be, for example, included in at least one organic layer (e.g., at least one organic layer selected from the hole injection layer 130, the hole transport layer 140, the emission layer 150, the electron transport layer 160, and the electron injection layer 170 disposed between the first electrode 120 and the second electrode 180. In some embodiments, the polymer compound represented by Formula 1 may be included in the emission layer 150 as a hole transport host. In some embodiments, the polymer compound represented by Formula 1 may be included in an organic layer other than the emission layer 150. For example, the polymer compound represented by Formula 1 may be included in the hole injection layer 130 and/or the hole transport layer as a hole transport material.

An organic layer including the polymer compound represented by Formula 1 may be formed by, for example, solution coating. In some embodiments, the organic layer including the polymer compound represented by Formula 1 may be formed by solution coating, such as spin coating, casting, micro-gravure coating, gravure coating, bar coating, roll coating, wire bar coating, dip coating, spray coating, screen printing, flexographic printing, offset printing, or ink-jet printing.

In solution coating, a material for an organic light-emitting device including the polymer compound represented by Formula 1 may be coated to form an organic layer. In this case, the material for an organic light-emitting device may include a solvent. Examples of the material for an organic light-emitting device including the solvent include an ink composition used in ink-jet printing and a film-forming composition used in spin coating, but embodiments are not limited thereto.

Also, the solvent, which is included in the material for the organic light-emitting device and is use in the solution coating, is not particularly limited as long as the solvent can dissolve the polymer compound represented by Formula 1 and may be appropriately selected according to the type of the polymer compound. Examples of the solvent may include toluene, xylene, ethylbenzene, diethylbenzene, mesitylene, propylbenzene, cyclohexylbenzene, dimethoxybenzene, anisole, ethoxy toluene, phenoxytoluene, iso-propylbiphenyl, dimethylanisole, phenyl acetate, phenyl propionic acid, methyl benzoate, and ethyl benzoate, but embodiments of the present disclosure are not limited thereto. An amount of the solvent used is not particularly limited. The concentration of the polymer compound may be in a range of 0.1 wt % to about 10 wt %, for example, about 0.5 wt % to about 5 wt %, by taking into account the coatability thereof.

Also, a method of depositing layers other than the organic layer including the polymer compound is not particularly limited. The layers other than the organic layer including the polymer may be formed by, for example, vacuum deposition or solution coating Also, a method of depositing layers other than the organic layer including the polymer compound is not particularly limited. The layers other than the organic layer including the polymer may be formed by, for example, vacuum deposition or solution coating.

The substrate 110 may be any suitable substrate generally used in organic light-emitting devices. For example, the substrate 110 may be a glass substrate, a semiconductive substrate such as a silicon substrate, or a transparent plastic substrate, but embodiments of the present disclosure are not limited thereto.

The first electrode 120 may be formed on the substrate 110. The first electrode 120 may be, for example, an anode, and be formed of a material with a high work function selected from a metal, an alloy, or a conductive compound. For example, the first electrode 120 may be a transparent electrode including indium tin oxide ($In_2O_3$—$SnO_2$, ITO), indium zinc oxide ($In_2O_3$—ZnO), tin oxide ($SnO_2$), or zinc oxide (ZnO), each having excellent transparency and conductivity. The first electrode 120 may be a reflective electrode that may be formed by stacking magnesium (Mg) or aluminum (Al) on the transparent electrode.

The hole injection layer 130 may be formed on the first electrode 120. The hole injection layer 130 may facilitate hole injection from the first electrode 120. In some embodiments, the hole injection layer 130 may be formed to a thickness in a range of about 10 nanometers (nm) to about 1,000 nm, and in some embodiments, about 10 nm to about 100 nm.

The hole injection layer 130 may include a known hole injection material. Examples of the known hole injection material forming the hole injection layer 130 include poly (ether ketone)-containing triphenylamine (TPAPEK), 4-isopropyl-4'-methyl diphenyl iodonium tetrakis (pentafluorophenyl) borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methyl phenyl amino) triphenylamine (m-MTDATA), N,N'-di(1-naphthyl)-N,N'-diphenylbenzidine (NPB), 4,4',4"-tris (diphenyl amino) triphenylamine (TDATA), 4,4',4"-tris(N,N-2-naphthyl phenyl amino) triphenylamine (2-TNATA), polyaniline/dodecylbenzene sulphonic acid (PANI/DBSA), poly(3,4-ethylenedioxythiophene)/poly(4-styrene sulfonate (PEDOT/PSS), polyaniline/10-camphor sulfonic acid (PANI/CSA), and polyaniline/poly(4-styrene sulfonate (PANI/PSS).

The hole transport layer 140 may be formed on the hole injection layer 130. The hole transport layer 140 may facilitate hole transport. For example, the hole transport layer 140 may be formed to a thickness in a range of about 10 nm to about 150 nm. The hole transport layer 140 may include the polymer compound represented by Formula 1. Since the hole transport layer 140 includes the polymer compound according to the embodiment, the current efficiency and emission lifespan of the organic light-emitting device 100 may be improved. When a film is formed by wet deposition, a film may be efficiently formed to a large area by using the polymer compound.

The hole transport layer 140 may further include a known hole transport material. Examples of the known hole transport material include carbazole derivatives, e.g., 1,1-bis[(di-4-tolylamino)phenyl] cyclohexane (TAPC), N-phenylcarbazole, and polyvinylcarbazole, N,N'-bis(3-methylphenyl)-N,N'-diphenyl-[1,1-biphenyl]-4,4'-diamine (TPD), 4,4',4"-tris(N-carbazolyl) triphenylamine (TCTA), N,N'-di(1-naphthyl)-N,N'-diphenylbenzidine (NPB), and poly(9,9-dioctyl-fluorene-co-N-(4-butylphenyl)-diphenylamine (TFB).

The emission layer 150 may be formed on the hole transport layer 140. The emission layer 150 emits light by fluorescence or phosphorescence. The emission layer 150 may include a known electron transport host (ET-host) material and a known dopant material.

The emission layer 150 may be formed by solution coating, e.g., spin coating or ink-jet coating. The emission layer 150 may be, for example, formed to a thickness in a range of about 10 nm to about 60 nm.

In the organic light-emitting device 100 according to an embodiment, a dopant material included in the emission layer 150 may be capable of emitting light from triplet excitons (i.e., emission by phosphorescence). In this case, the organic light-emitting device 100 may have improved emission lifespan.

Examples of a HT-host material or an ET-host material in the emission layer 150 include tris(8-quinolinato)aluminum ($Alq_3$), 4,4'-bis(carbazol-9-yl)biphenyl (CBP), poly(n-vinylcarbazole (PVK), 9,10-di(naphthalene-yl)anthracene (ADN), 4,4',4"-tris(N-carbazolyl)triphenylamine (TCTA), 1,3,5-tris(N-phenyl-benzimidazol-2-yl)benzene (TPBI) 3-tert-butyl-9,10-di(naphth-2-yl)anthracene (TBADN), distyrylarylene (DSA), and 4,4'-bis(9-carbazole)-2,2'-dimethyl-biphenyl (dmCBP).

In addition, the emission layer 150 may include, as a dopant material, perylene and a derivative thereof, rubrene and a derivative thereof, coumarin and a derivative thereof, 4-dicyanomethylene-2-(p-dimethylaminostyryl)-6-methyl-4H-pyran (DCM) and a derivative thereof, an iridium complex, e.g., bis[2-(4,6-difluorophenyl)pyridinate]picolinate iridium (III) (Flrpic), bis(1-phenylisoquinoline)(acetylacetonate) iridium (III) ($Ir(piq)_2(acac)$), and tris(2-phenylpyridine) iridium (III) ($Ir(ppy)_3$), an osmium complex, and a platinum complex. For example, the light-emitting material may be an organometallic light-emitting complex compound.

The electron transport layer 160 may be formed on the emission layer 150. The electron transport layer 160 may serve to transport electrons, and may be formed by vacuum-deposition, spin coating, or ink-jet printing. The electron transport layer 160 may be, for example, formed to a thickness in a range of about 15 nm to about 50 nm.

The electron transport layer 160 may include a known electron transport material. Examples of the known electron transport material include tris(8-quinolinato) aluminum ($Alq_3$) and a compound including a nitrogen-containing aromatic ring. Examples of the compound including a nitrogen-containing aromatic ring include a compound including a pyridine ring such as 1,3,5-tri[(3-pyridyl)-phen-3-yl]benzene, a compound including a triazine ring such as 2,4,6-tris(3'-(pyridin-3-yl)biphenyl-3-yl)-1,3,5-triazine, and a compound including an imidazole ring such as 2-(4-(N-phenylbenzimidazolyl-1-yl-phenyl)-9,10-dinaphthylanthracene. In some embodiments, as an electron transport material, a commercially available item may also be used. Examples of the commercially available item include KLET-01, KLET-02, KLET-03, KLET-10, and KLET-M1 (available from Chemipro Kasei Corporation).

The electron injection layer 170 may be formed on the electron transport layer 160. The electron injection layer 170 may facilitate electron injection from the second electrode 180, and may be formed by vacuum-deposition. In some embodiments, the electron injection layer 170 may be formed to a thickness in a range about 0.3 nm to about 9 nm. The electron injection layer 170 may include a known electron injection material. For example, the electron injection layer 170 may be formed of a lithium compound, e.g., (8-hydroxyquinolinato)lithium (LiQ) and lithium fluoride (LiF), sodium chloride (NaCl), cesium fluoride (CsF), lithium oxide ($Li_2O$), or barium oxide (BaO).

The second electrode 180 may be formed on the electron injection layer 170. The second electrode 180 may be a cathode, and be formed of a material with a low work function selected from a metal, an alloy, and a conductive compound. For example, the second electrode 180 may be formed as a reflective electrode including a metal, e.g., lithium (Li), magnesium (Mg), aluminum (Al), or calcium (Ca), or an alloy, e.g., an aluminum-lithium (Al—Li) alloy, a magnesium-indium (Mg—In) alloy, or a magnesium-silver (Mg—Ag) alloy. In some embodiments, the second electrode 180 may be formed as a transparent electrode having a thickness of 20 nm or less and including a thin film of the metal or the alloy, or a transparent conductive film including indium tin oxide ($In_2O_3$—$SnO_2$) or indium zinc oxide ($In_2O_3$—ZnO).

Since the organic light-emitting device 100 according to an embodiment includes an organic layer including the bicarbazole compound represented by Formula 1, luminous efficiency and emission lifespan thereof may improve.

Furthermore, a stacking structure of the organic light-emitting device 100 according to an embodiment is not limited to the foregoing description. The organic light-emitting device 100 according to an embodiment may have a different stacking structure known in the art. For example, the organic light-emitting device 100 may not include at least one selected from the hole injection layer 130, the hole transport layer 140, the electron transport layer 160, and the electron injection layer 170 or may further include another layer. In some embodiments, each layer of the organic light-emitting device 100 may be formed as a single layer or as multiple layers.

For example, in order to prevent diffusion of excitons or holes to the electron transport layer 160, the organic light-emitting device 100 may further include a hole blocking layer between the hole transport layer 140 and the emission layer 150. The hole blocking layer may be formed using, for example, an oxadiazole derivative, a triazole derivative, or a phenanthroline derivative.

Light-Emitting Devices Other than Organic Light-Emitting Device

The polymer compound may be applied to light-emitting devices other than the organic light-emitting device. The light-emitting devices other than the organic light-emitting device, to which the polymer compound is applicable, are not particularly limited, and may be, for example, a quantum-dot light-emitting device (see, for example, JP 2010-199067 A), an organic perovskite light-emitting device, or an inorganic perovskite light-emitting device.

Quantum-Dot Light-Emitting Device

Hereinafter, a quantum-dot light-emitting device will be described as an example of the light-emitting devices other than the organic light-emitting device. The quantum-dot light-emitting device may be manufactured by a quantum-dot emission layer instead of the emission layer 150 of the organic light-emitting device 100.

The quantum-dot emission layer may include a plurality of quantum dots arranged in a single layer or multiple layers. The term "quantum dot" used herein refers to a particle of a predetermined size which has a quantum confinement effect. In an embodiment, the quantum dot may have a diameter of about 1 nm to about 10 nm. Also, the quantum dot is an example of an inorganic nanoparticle included in the light-emitting material in the composition including the polymer compound according to the embodiment.

The quantum dots arranged in the quantum-dot emission layer may be synthesized by a wet chemical process, a metal organic chemical vapor deposition (MOCVD) process, a molecular beam epitaxy (MBE) process, or other similar processes. Among them, the wet chemical process is a method of adding a precursor material to an organic solvent and growing particles.

In the wet chemical process, when a quantum dot crystal is grown, the organic solvent naturally acts as a dispersant coordinated to the surface of the quantum dot crystal, and thus, the growth of the crystal may be adjusted. Therefore, the wet chemical process may easily control the growth of inorganic nanoparticles and reduce costs, as compared with vapor deposition such as an MOCVD or an MBE.

An energy band bap may be controlled by adjusting the size of the quantum dot, thereby obtaining various wavelength bands in the quantum-dot emission layer. Thus, it is possible to provide a display that emits light of different wavelengths by using quantum dots having different sizes. The sizes of the quantum dots may be selected to emit red light, green light, and blue light so as to constitute a color display. Also, the sizes of the quantum dots may be combined so that light of various colors emits white light.

The quantum dot may include a semiconductor material selected from a group II-VI semiconductor compound, a group III-V semiconductor compound, a group IV-VI semiconductor compound, a group IV element or compound, and a combination thereof.

The group II-VI semiconductor compound is not particularly limited, and may be, for example, a 2-element compound selected from CdSe, CdTe, ZnS, ZnSe, ZnTe, ZnO, HgS, HgSe, HgTe, and a mixture thereof, a 3-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof, and a 4-element compound selected from CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V semiconductor compound is not particularly limited, and may be, for example, a 2-element compound selected from GaN, GaP, GaAs, GaSb, AlN, AlP, AlAs, AlSb, InN, InP, InAs, InSb, and a mixture thereof, a 3-element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a 4-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlAs, InAlPSb, and a mixture thereof.

The group IV-VI semiconductor compound is not particularly limited, and may be, for example, a 2-element compound selected from SnS, SnSe, SnTe, PbS, PbSe, PbTe, and a mixture thereof, a 3-element compound selected from SnSeS, SnSeTe, SnSTe, PbSeS, PbSeTe, PbSTe, SnPbS, SnPbSe, SnPbTe, and a mixture thereof, and a 4-element compound selected from SnPbSSe, SnPbSeTe, SnPbSTe, and a mixture thereof.

The group IV element or compound is not particularly limited, and may be, for example, a 1-element compound selected from Si, Ge, and a mixture thereof, and a 2-element compound selected from SiC, SiGe, and a mixture thereof.

The quantum dot may have a uniform single structure or a core-shell double structure. The core and the shell may include different materials. Materials constituting the core and the shell may be different semiconductor compounds. However, an energy band gap of the material constituting the shell may be larger than an energy band gap of the material constituting the core.

For example, the case of manufacturing the quantum dot having a structure including a core (CdSe) and a shell (ZnS) will be described. First, crystals are generated by injecting a core (CdSe) precursor material such as dimethylcadmium ($(CH_3)_2Cd$) and trioctylphosphine selenide (TOPSe) in an organic solvent using trioctylphosphine oxide (TOPO) as a surfactant. At this time, in order to grow the crystals to a constant size, the shell is formed on the surface of the already formed core by injecting a shell (ZnS) precursor material after being maintained for a predetermined time at a high temperature. In this manner, a CdSe/ZnS quantum dot capped with TOPO may be manufactured.

As such, the polymer compound according to the embodiment may be used in light-emitting devices other than the organic light-emitting device.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, an n-propyl group, an iso-propyl group, an n-butyl group, an iso-butyl group, a sec-butyl group, a tert-butyl group, an n-pentyl group, an iso-pentyl group, a tert-pentyl group, a neo-pentyl group, a 1,2-dimethylpropyl group, an n-hexyl group, an iso-hexyl group, a 1,3-dimethylbutyl group, a 1-iso-propylpropyl group, a 1,2-dimethylbutyl group, an n-heptyl group, a 1,4-dimethylpentyl group, a 3-ethylpentyl group, a 2-methyl-1-iso-propylpropyl group, a 1-ethyl-3-methylbutyl group, an n-octyl group, a 2-ethylhexyl group, a 3-methyl-1-iso-propylbutyl group, a 2-methyl-1-iso-propyl group, a 1-tert-butyl-2-methylpropyl group, an n-nonyl group, a 3,5,5-trimethyldecyl group, an n-decyl group, an iso-decyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, and an n-tetracosyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, a propoxy group, an iso-propoxy group, an n-butoxy group, an iso-butoxy group, a sec-butoxy group, a tert-butoxy group, an n-pentoxy group, an iso-pentoxy group, a tert-pentoxy group, a neo-pentoxy group, an n-hexyloxy group, an iso-hexyl group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, and a 3-ethylpentyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group," as used herein, refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_2$-$C_{10}$ heterocycloalkenyl group are a 2,3-dihydrofuranyl group, and a 2,3-dihydrothiophenyl group. The term "$C_1$-$C_{10}$ heterocycloalkenylene group," as used herein, refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, in addition to 1 to 60 carbon atoms. The term "$C_1$-$C_{60}$ heteroarylene group" as used herein refers to a divalent group having a carbocyclic aromatic system that has at least one heteroatom selected from N, O, P, Si, and S as a ring-forming atom, in addition to 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group," used herein, indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

The term "monovalent non-aromatic condensed polycyclic group" as used herein refers to a monovalent group having two or more rings condensed to each other, only carbon atoms (for example, the number of carbon atoms may be in a range of 8 to 60) as a ring-forming atom, and no aromaticity in its entire molecular structure. Non-limiting examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom selected from N, O, P, Si, and S, other than carbon atoms (for example, the number of carbon atoms may be in a range of 2 to 60), as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

At least one substituent of the substituted $C_1$-$C_{60}$ alkylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, —NCS, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, —NCS, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$) and —C(=O)($Q_{11}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), and —C(=O)($Q_{21}$); and —Si($Q_{31}$)($Q_{32}$)($Q_{33}$), —N($Q_{31}$)($Q_{32}$) and —C(=O)($Q_{31}$), wherein $Q_{11}$ to $Q_{13}$, $Q_{21}$ to $Q_{23}$, and $Q_{31}$ to $Q_{33}$ may each independently selected from hydrogen, deuterium, a $C_1$-$C_{20}$ alkyl group, a $C_1$-$C_{20}$ alkoxy group, a phenyl group, a pyridinyl group, a pyrimidinyl group, a triazinyl group, a biphenyl group, a phenylpyridinyl group, a phenylpyrimidinyl group, a phenyltriazinyl group, a diphenylpyridinyl group, a diphenylpyrimidinyl group, a diphenyltriazinyl group, a pyridinylphenyl group, a dipyridinylphenyl group, a pyrimidinylphenyl group, a dipyrimidinylphenyl group, a triazinylphenyl group, a ditriazinylphenyl group, a fluorenyl group, a spirobifluorenyl group, a dimethylfluorenyl group, a diphenylfluorenyl group, a carbazolyl group, a phenylcarbazolyl group, a biphenylcarbazolyl group, a dibenzofuranyl group, phenyldibenzofuranyl group, a diphenyldibenzofuranyl group, a dibenzothiophenyl group, a phenyldibenzothiophenyl group, and a diphenyldibenzothiophenyl group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

The term "biphenyl group" as used herein refers to a monovalent group in which two benzene groups are linked via a single bond.

The term "terphenyl group" as used herein refers to a monovalent group in which three benzene groups are linked via a single bond.

Symbols * and *' as used herein, unless defined otherwise, each refer to a binding site to a neighboring atom in a corresponding formula.

Embodiments of the present disclosure have been described with reference to the accompanying drawings, but the present disclosure is not limited thereto. It is apparent to those of ordinary skill in the art that various modifications or changes can be made thereto without departing from the technical idea set forth in the claims. It is understood that such modifications and changes also fall within the technical spirit and scope of the present disclosure.

Further, in Examples and Comparative Examples provided below, operations were carried out at room temperature (25° C.), unless otherwise indicated. Also, "%" and "parts" refer to "wt %" and "parts by weight", respectively, unless otherwise indicated.

The wording "'B' was used instead of 'A'" used in describing Synthesis Examples means that a molar equivalent of 'A' was identical to a molar equivalent of 'B'.

EXAMPLES

Synthesis Example 1: Synthesis Compound 1

8.08 grams (g) (20.0 millimoles, mmol) of 1,4-dihexyl-2,5-dibromobenzene, 12.19 g (48.0 mmol) of bis(pinacolato)diboron, 0.98 g (1.2 mmol) of $PdCl_2$(dppf), 11.78 g (120.0 mmol) of potassium acetate, and 100 milliliters (mL) of 1,4-dioxane were mixed in a 300-mL flask in an argon atmosphere, and the mixture was heated and stirred for 6 hours under reflux.

After the reaction was completed, toluene and water were added to the reaction mixture, followed by liquid separation and washing with water. Sodium sulfate and activated charcoal were added thereto and filtering was performed thereon through Celite. A filtrate obtained therefrom was concentrated to obtain 11.94 g of a crude product. The obtained product was recrystallized with hexane, and the crystals were washed with methanol. The obtained crystals having white needle shapes were dried under reduced pressure to obtain 4.23 g of Compound 1 (yield: 42%). The structure of the obtained compound 1 was identified by $^1$H-NMR.

Compound 1

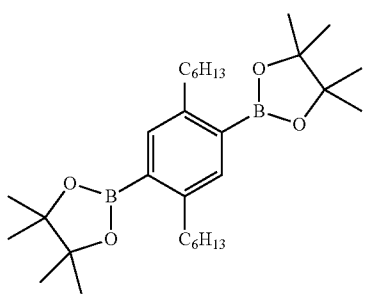

Synthesis Example 2: Synthesis of Compound 2

22.7 g (70.0 mmol) of 2,7-dibromofluorene, 21.9 g (147.0 mmol) of 5-bromo-1-pentene, 16.7 g (297.6 mmol) of potassium hydroxide, 1.2 g (7.2 mmol) of potassium iodide, and 170 mL of dimethylsulfoxide (DMSO) were mixed in a 500-mL four-neck flask in an argon atmosphere, and the mixture was heated to a temperature of 80° C. for 4 hours.

After the reaction was completed, the reaction mixture was cooled to room temperature. Then, liquid separation was performed thereon by mixing 300 mL of water and 300 mL of toluene. An organic layer obtained therefrom was washed five times by using 300 mL of saturated brine. The obtained organic layer was dried by using sodium sulfate. Then, the residue obtained therefrom was purified by column chromatography and recrystallization to obtain 24.1 g of a white solid (yield: 75%). The structure of the obtained compound 2 was identified by $^1$H-NMR.

Compound 2

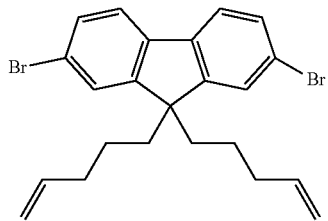

Synthesis Example 3: Synthesis of Compound 3

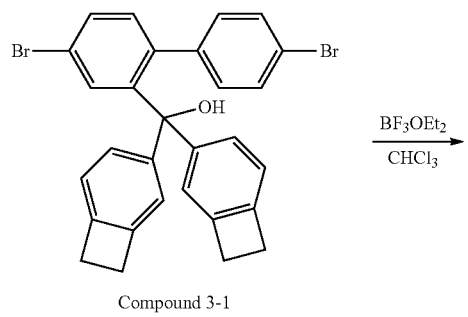

Compound 3-1

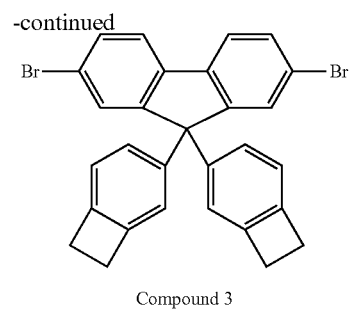

Compound 3

5.0 g (9.1 mmol) of Compound 3-1 and 24 mL of chloroform were added in an argon atmosphere and cooled to a temperature of 0° C. in an ice-bath, and 7.0 mL of $BF_3 \cdot Et_2O$ was added dropwise thereto. After the reaction mixture was stirred for 1 hour, 7.0 mL of $BF_3 \cdot Et_2O$ was added thereto, and the reaction mixture was further stirred for 1 hour. Then, the reaction mixture was stirred at room temperature for 5 hours. 100 mL of water was added thereto, the mixture was stirred and transferred to a separatory funnel. Then, an organic layer was extracted therefrom three times by using 50 mL of chloroform. The combined extracted organic layers were dried by using sodium sulfate, a solution was concentrated, and 30 mL of chloroform was added thereto. Crystals were obtained by adding 300 mL of methanol thereto while heating under reflux, and obtained crystals were filtered. The crystals were added to 20 mL of chloroform and heated, and 200 mL of methanol was added thereto and stirred at room temperature for 2 hours. The generated crystals were filtered and dried to obtain 2.0 g (yield: 75%) of Compound 3. The structure of the obtained Compound 3 was identified by $^1$H-NMR.

Synthesis Example 4: Synthesis of Compound 6

4-1. Synthesis of Compound 4

195 mL of dehydrated 1,4-dioxane was added to 10.0 g (19.36 mmol) of 2-amino-N-[(1,1'-biphenyl)-4-yl]-N-(4-bromophenyl)-9,9-dimethylfluorene, 7.38 g (29.04 mmol) of bis(pinacolato)diboron, and 5.70 g (58.09 mmol) of potassium acetate in an argon atmosphere, and the reaction mixture was stirred for 30 minutes. Then, 0.22 g (0.27 mmol) of bis[(diphenylphosphino)ferrocene]dichloropalladium was added thereto, and the mixture was heated and stirred for 3 hours under reflux.

After the reaction was completed, the reaction mixture was cooled to room temperature and filtered through Celite, and a filtrate was concentrated. A concentrated residue obtained therefrom was charged with methanol and washed to obtain 9.08 g of a solid (Compound 4) (yield: 79%).

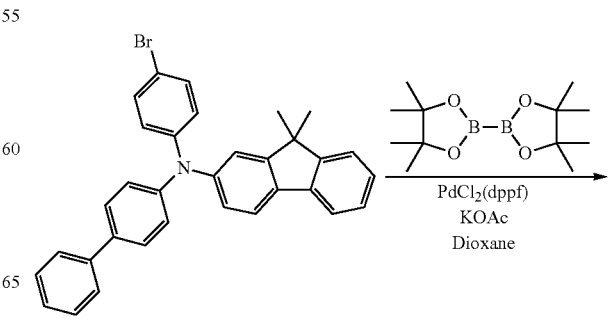

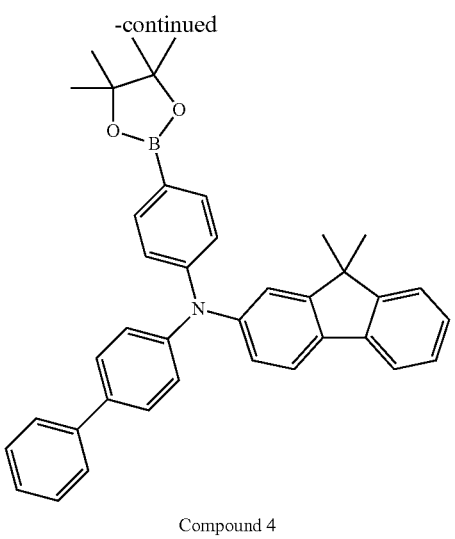

Compound 4

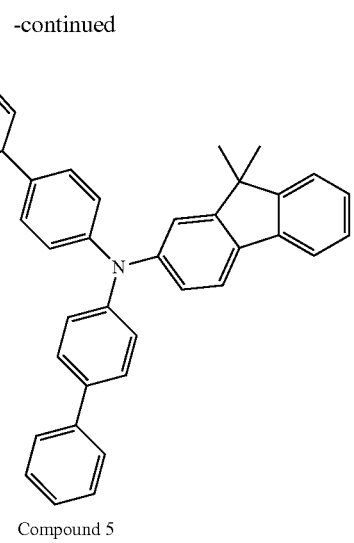

Compound 5

4-2. Synthesis of Compound 5

200 mL of 1,4-dioxane and 100 mL (14.0 mmol) of 2 molar (M) Na₂CO₃ aqueous solution were added to 5.20 g (14.0 mmol) of 3-bromo-6-iodine carbazole, 8.00 g (14.2 mmol) of Compound 4, and 0.161 g (0.14 mmol) of Pd[PPh₃]₄ in an argon atmosphere, and the reaction mixture was heated and stirred for 6 hours under reflux.

After the reaction was completed, the sample was transferred to a separatory funnel, and an organic layer was extracted therefrom by using toluene. The extracted organic layer was dried by using MgSO₄ and then filtered and concentrated. A concentrated residue obtained therefrom was purified by silica gel column chromatography to obtain 5.56 g of a white solid (Compound 5) (yield: 58%).

4-3. Synthesis of Compound 6

20 mL of dehydrated 1,4-dioxane was added to 1.41 g (5.0 mmol) of m-iodobromobenzene, 3.00 g (4.4 mmol) of Compound 5, 0.045 g (0.24 mmol) of copper iodide, and 0.58 g (6.1 mmol) of sodium tert-butoxide in an argon atmosphere, and the reaction mixture was stirred at room temperature for 30 minutes. Then, 0.124 g (1.09 mmol) of trans-1,2-cyclohexanediamine was added thereto, and the reaction mixture was heated and stirred for 8 hours under reflux.

After the reaction was completed, the reaction mixture was cooled to room temperature and filtered through Celite, and a filtrate was concentrated. A concentrated residue obtained therefrom was purified by silica gel column chromatography to obtain 2.59 g of a light yellow solid (Compound 6) (yield: 70%).

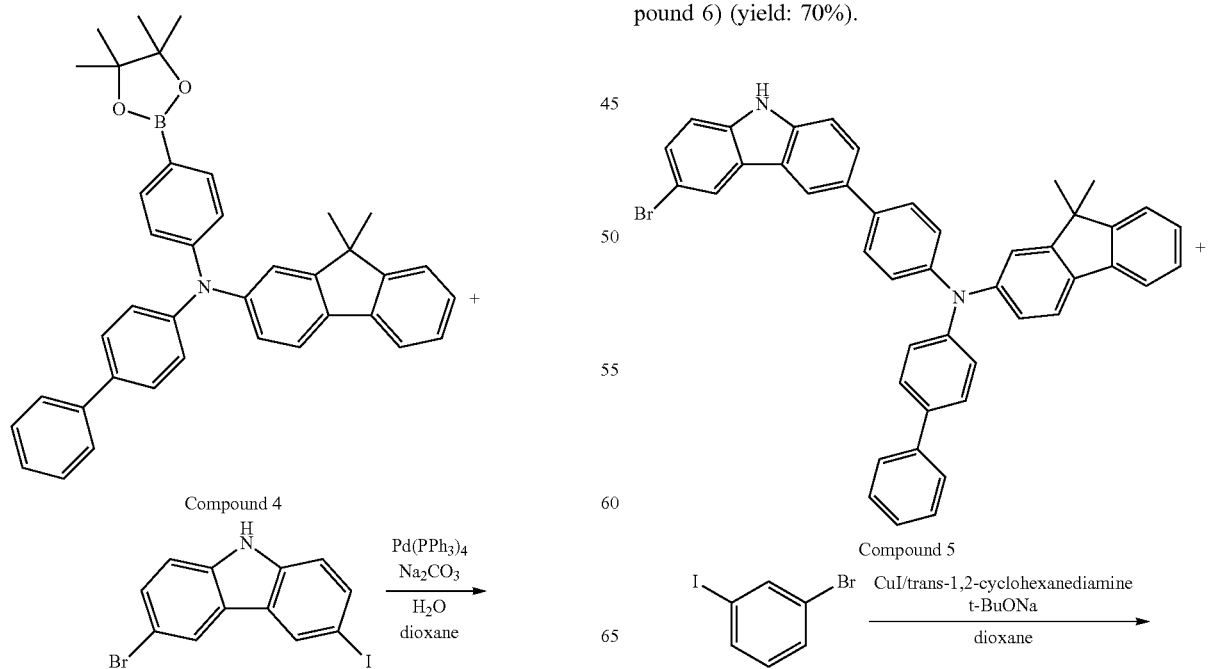

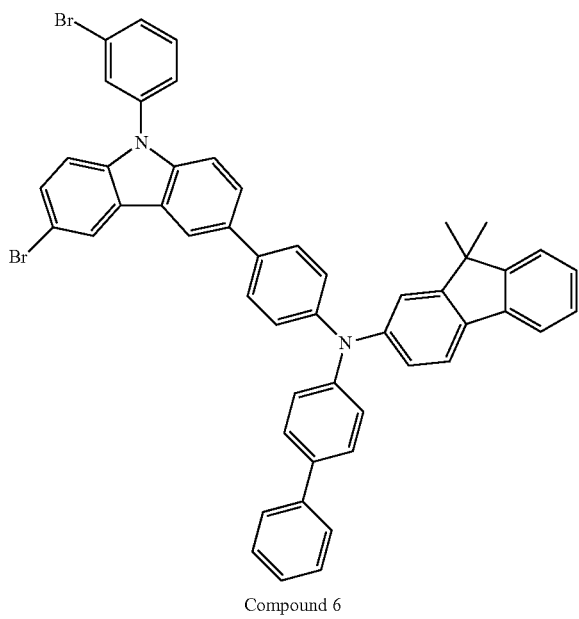

Compound 6

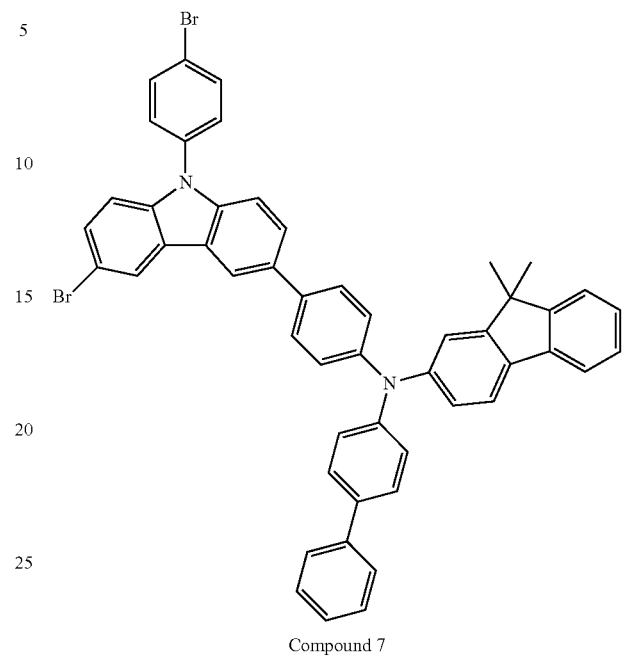

Compound 7

Synthesis Example 5: Synthesis of Compound 7

2.28 g of a light yellow solid (Compound 7) (yield: 62%) was obtained in the same manner as in Synthesis of Compound 6, except that 2.00 g (7.07 mmol) of p-iodinebromobenzene was used instead of m-iodinebromobenzene.

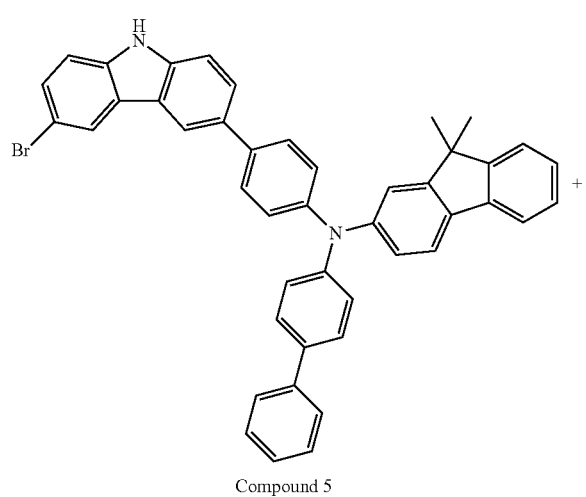

Compound 5

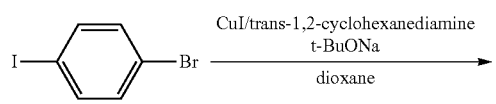

Synthesis Example 6: Synthesis of Compound 12

6-1. Synthesis of Compound 8

20 mL of anhydrous xylene was added to 2.00 g (8.1 mmol) of N-phenyl-4-phenylamine, 3.99 g (8.5 mmol) of 2-bromo-9,9-dioctylfluorene, 0.036 g (0.04 mmol) of $Pd_2(dba)_3$, 0.023 g (0.08 mmol) of $P(tBu)_3 \cdot HBF_4$, and 1.05 g (10.96 mmol) of sodium tert-butoxide in an argon atmosphere, and the reaction mixture was heated and stirred for 8 hours.

After the reaction was completed, the reaction mixture was cooled to room temperature and filtered through Celite, and a filtrate was concentrated. A Compound 8

6-2. Synthesis of Compound 9

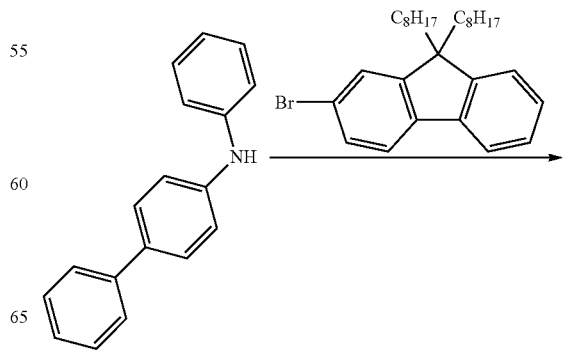

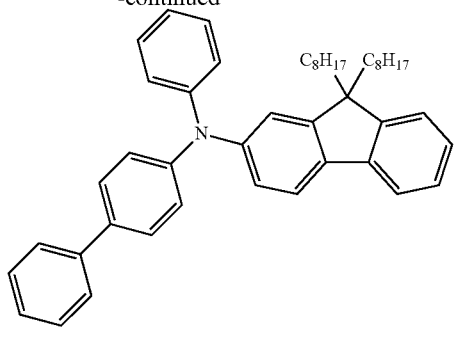

Compound 8

2.00 g (3.1 mmol) of Compound 8 and 40 m of dimethylformamide (DMF) were added to an argon-substituted four-neck flask in an argon atmosphere and cooled in ice water. 0.62 g (3.5 mmol) of N-bromosuccinimide that was dissolved in 20 mL of DMF was added dropwise thereto and stirred for 2 hours. 150 mL of toluene was added thereto, and the reaction mixture was washed with water and dried by using magnesium sulfate. A solvent was distilled under reduced pressure and a residue obtained therefrom was purified by column chromatography to obtain 1.65 g of a solid (Compound 9) (yield: 75%).

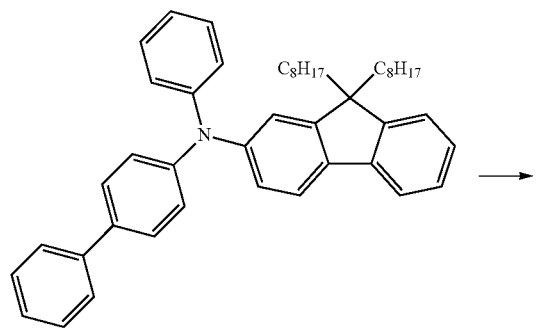

Compound 8

Compound 9

6-3. Synthesis of Compound 10

0.73 g of a solid (Compound 10) (yield: 46%) was obtained in the same manner as in Synthesis of Compound 4, except that 1.50 g (2.1 mmol) of Compound 9 was used instead of 2-amino-N-[(1,1'-biphenyl)-4-yl]-N-(4-bromophenyl)-9,9-dimethyl fluorene.

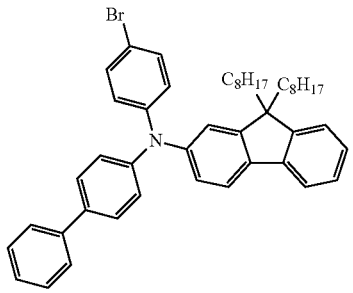

Compound 9

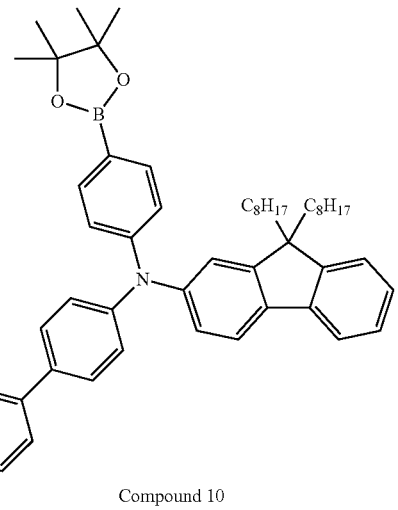

Compound 10

6-4. Synthesis of Compound 11

0.46 g of a solid (Compound 11) (yield: 58%) was obtained in the same manner as in Synthesis of Compound 5, except that 0.70 g (0.92 mmol) of Compound 10 was used instead of Compound 4.

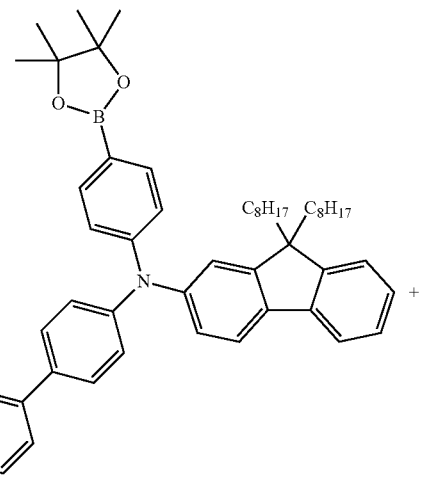

Compound 10

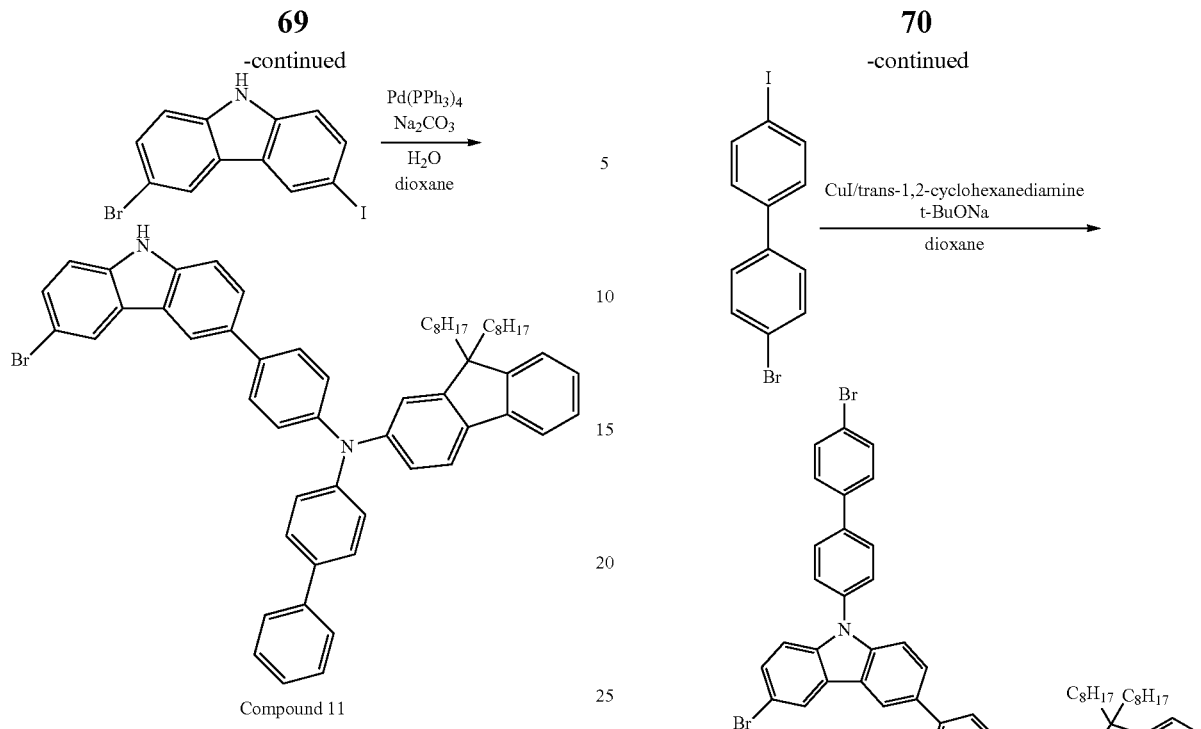

Compound 11

6-5. Synthesis of Compound 12

20 mL of dehydrated 1,4-dioxane was added to 0.19 g (0.55 mmol) of 4-bromo-4'-iodine biphenyl, 0.46 g (0.52 mmol) of Compound 11, 0.0053 g (0.028 mmol) of copper iodide, and 0.069 g (0.72 mmol) of sodium tert-butoxide in an argon atmosphere, and the reaction mixture was stirred at room temperature for 30 minutes. Then, 0.014 g (0.128 mmol) of trans-1,2-cyclohexanediamine was added thereto, and the reaction mixture was heated and stirred for 8 hours under reflux.

After the reaction was completed, the reaction mixture was cooled to room temperature and filtered through Celite, and a filtrate was concentrated. A concentrated residue obtained therefrom was purified by silica gel column chromatography to obtain 0.44 g of a light yellow solid (Compound 12) (yield: 77%).

Compound 12

Synthesis Example 7: Synthesis of Compound 17

7-1. Synthesis of Compound 13

6.26 g (19.49 mmol) of N-(4-biphenylyl)-2-phenylamine (product of Tokyo Kasei), 6.06 g (21.44 mmol) of 1-bromo-4-iodine benzene, 0.19 g (0.97 mmol) of copper(I) iodide, 0.49 g (4.29 mmol) of trans-1,2-cyclohexanediamine, 3.75 g (38.97 mmol) of sodium tert-butoxide, and 60 mL of dioxane were added to a reaction vessel in an argon atmosphere and stirred at a temperature of 90° C. for 6 hours.

After the reaction was completed, the reaction mixture was cooled to room temperature, and impurities were filtered and separated therefrom through Celite. A solvent was distilled therefrom, and a residue obtained therefrom was purified by column chromatography to obtain 6.68 g of a solid (Compound 13) (yield: 72%).

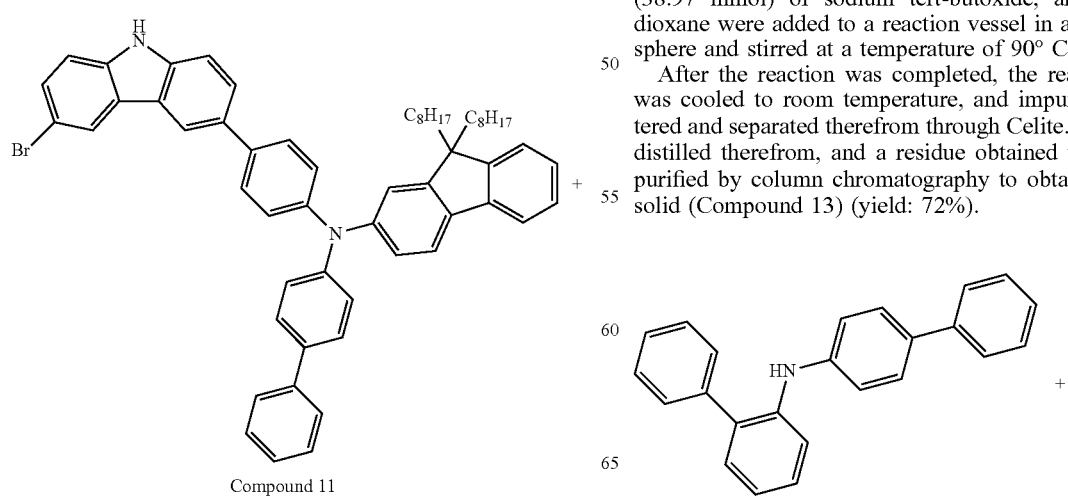

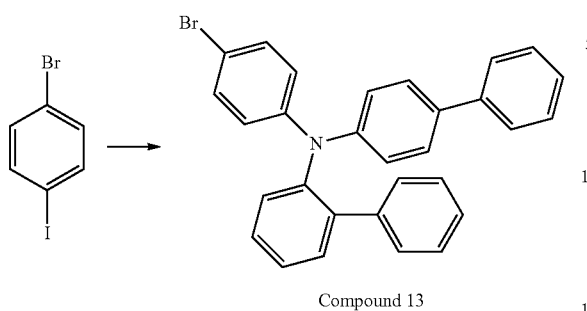

Compound 13

7-2. Synthesis of Compound 14

1.17 g of a solid (Compound 14) (yield: 56%) was obtained in the same manner as in Synthesis of Compound 4, except that 1.90 g (4.0 mmol) of Compound 13 was used instead of 2-amino-N-[(1,1'-biphenyl)-4-yl]-N-(4-bromophenyl)-9,9-dimethylfluorene.

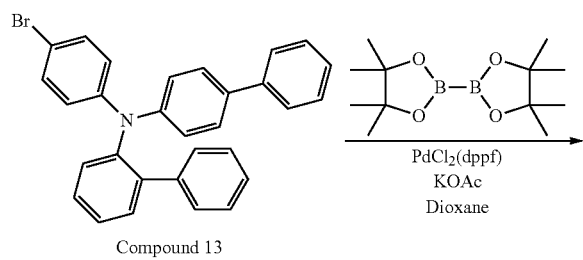

Compound 14

7-3. Synthesis of Compound 15

4.5 g (20 mmol) of N-iodinosuccinimide (NIS) was added in a small amount to 600 mL of acetic acid solution in which 5.16 g (21 mmol) of 2-bromocarbazole was dissolved, and the reaction mixture was stirred at room temperature for 12 hours. The reaction mixture was added dropwise to 1,200 mL of water, and a precipitate was filtered and removed therefrom. A filtrate was washed with water and dissolved in 200 mL of ethyl acetate. The solution was washed with an aqueous solution of sodium hydrogencarbonate, water, and saturated brine, and dried by using $MgSO_4$. The solution was filtered and concentrated to obtain 5.85 g of a solid (Compound 15) (yield: 75%).

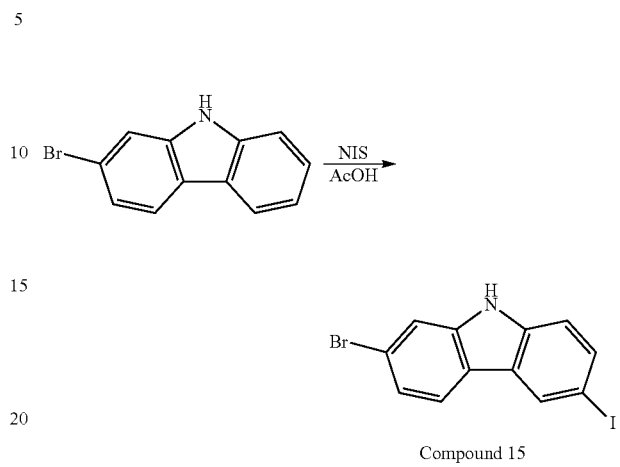

Compound 15

7-4. Synthesis of Compound 16

200 mL of 1,4-dioxane and 100 mL (14.0 mmol) of 2 M $Na_2CO_3$ aqueous solution were added to 5.20 g (14.0 mmol) of Compound 15, 9.11 g (14.2 mmol) of Compound 14, and 0.161 g (0.14 mmol) of $Pd(PPh_3)_4$ in an argon atmosphere, and the reaction mixture was heated and stirred for 6 hours under reflux. After the reaction was completed, the sample was transferred to a separatory funnel and an organic layer was extracted therefrom by using toluene. The extracted organic layer was dried by using $MgSO_4$ and then filtered and concentrated. A concentrated residue obtained therefrom was purified by silica gel column chromatography to obtain 4.94 g of a white solid (Compound 16) (yield: 55%).

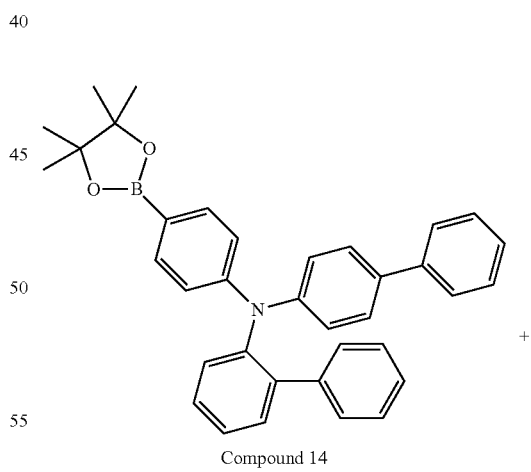

Compound 14

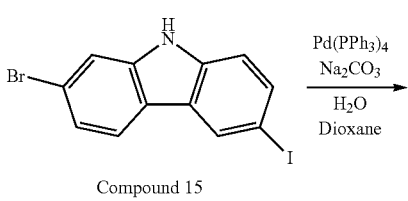

Compound 15

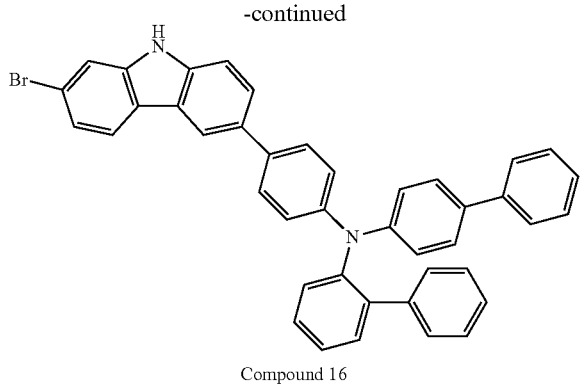

Compound 16

7-5. Synthesis of Compound 17

2.10 g of a light yellow solid (Compound 17) (yield: 68%) was obtained in the same manner as in Synthesis of Compound 7, except that 2.50 g (3.89 mmol) of Compound 16 was used instead of Compound 5.

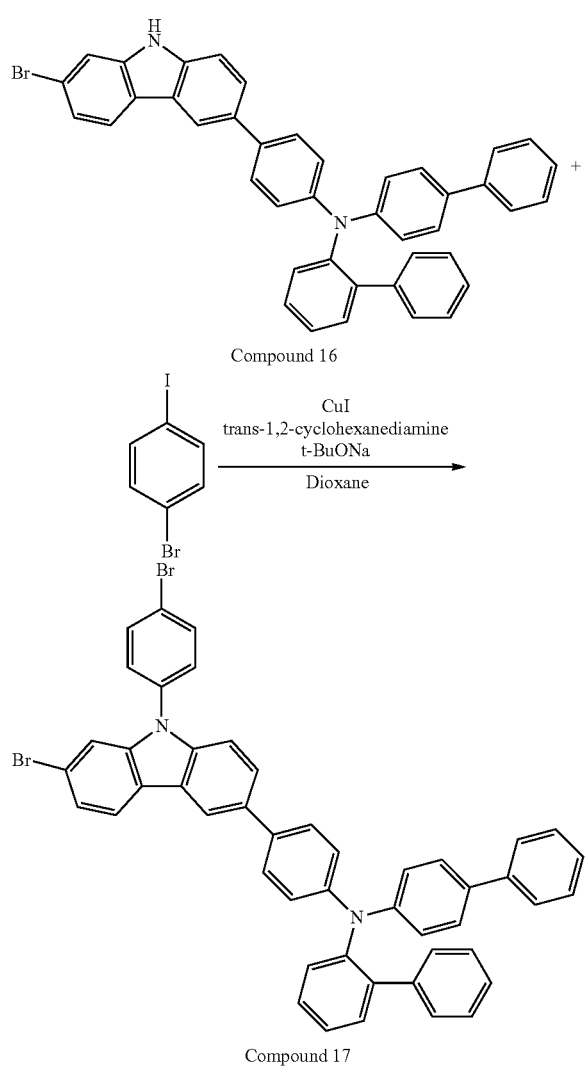

Compound 17

Synthesis Example 8: Synthesis of Compound 22

8-1. Synthesis of Compound 13

50 mL of dehydrated toluene was added to 1.69 g (10.0 mmol) of 2-aminobiphenyl, 3.23 g (10.0 mmol) of 4-(4-bromophenyl)dibenzofuran (product of Tokyo Kasei), and 1.92 g (20.0 mmol) of sodium tert-butoxide in an argon atmosphere and stirred. 45 mg (0.2 mmol) of palladium acetate and 40 mg (0.2 mmol) of tri-t-butylphosphine were added thereto and reacted at a temperature of 80° C. for 8 hours.

After the reaction was completed, the reaction mixture was cooled to room temperature and filtered through Celite/silica gel. A filtrate was concentrated under reduced pressure, and a concentrated residue obtained therefrom was purified by silica gel column chromatography to obtain 2.51 g of a solid (Compound 18) (yield: 61%).

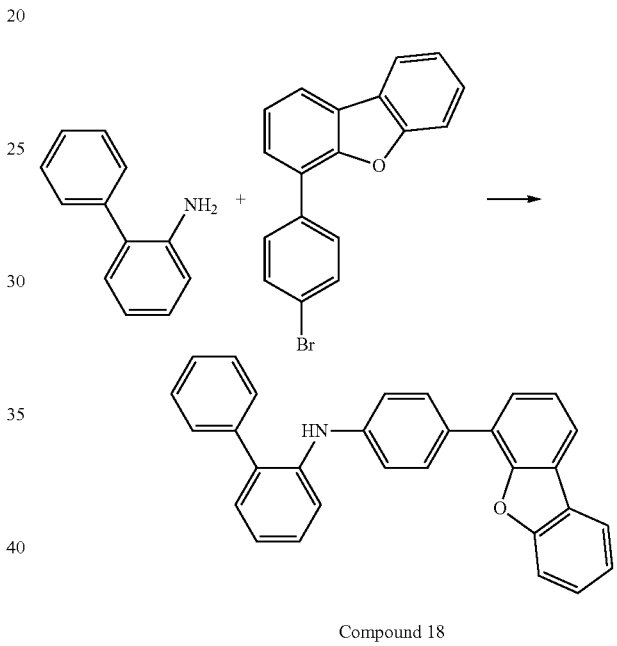

Compound 18

8-2. Synthesis of Compound 19

1.65 g of a light yellow solid (Compound 19) (yield: 60%) was obtained in the same manner as in Synthesis of Compound 13, except that 2.00 g (4.86 mmol) of Compound 18 was used instead of N-(4-biphenylyl)-2-phenylamine (product of Tokyo Kasei).

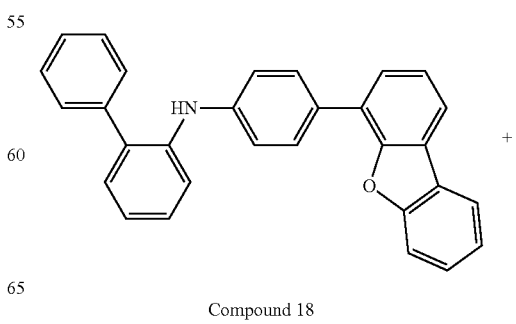

Compound 18

-continued

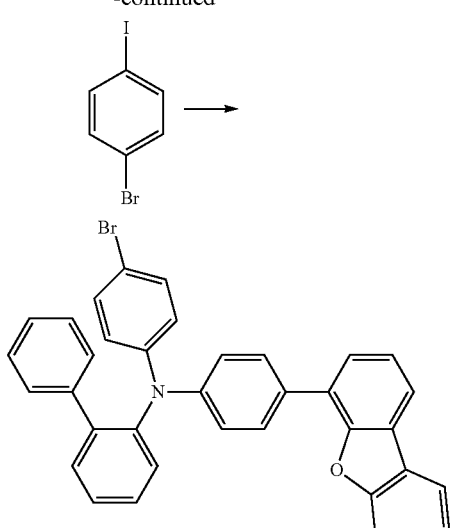

Compound 19

8-3. Synthesis of Compound 20

1.37 g of a solid (Compound 20) (yield: 56%) was obtained in the same manner in Synthesis of Compound 14, except that 2.26 g (4.0 mmol) of Compound 19 was used instead of Compound 13.

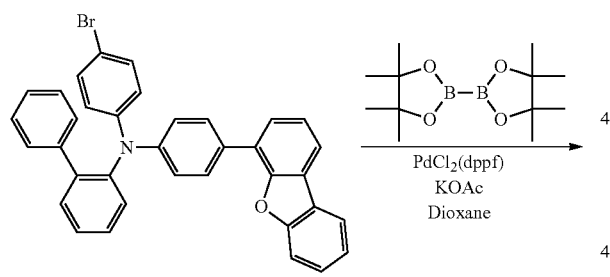

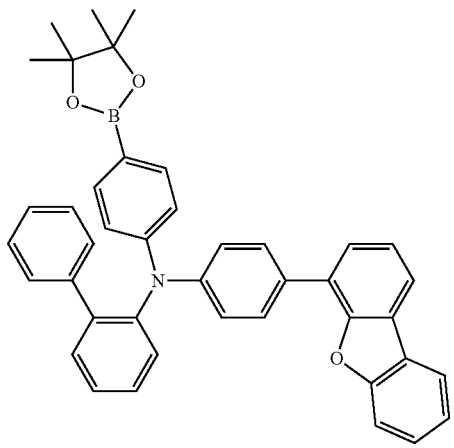

Compound 20

8-4. Synthesis of Compound 21

30 mL of 1,4-dioxane and 14 mL (0.02 mmol) of 2 M $Na_2CO_3$ aqueous solution were added to 1.22 g (2.0 mmol) of Compound 20, 0.81 g (2.5 mmol) of 2,7-dibromocarbazole (Tokyo Kasei), and 0.023 g (0.02 mmol) of $Pd(PPh_3)_4$ in an argon atmosphere, and the reaction mixture was heated and stirred for 6 hours under reflux.

After the reaction was completed, the sample was transferred to a separatory funnel and an organic layer was extracted therefrom by using toluene. The extracted toluene was dried by using $MgSO_4$ and then filtered and concentrated. A concentrated residue obtained therefrom was purified by silica gel column chromatography to obtain 0.41 g of a white solid (Compound 21) (yield: 28%).

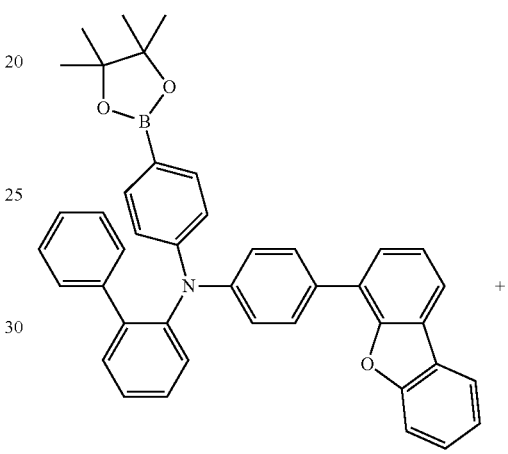

Compound 20

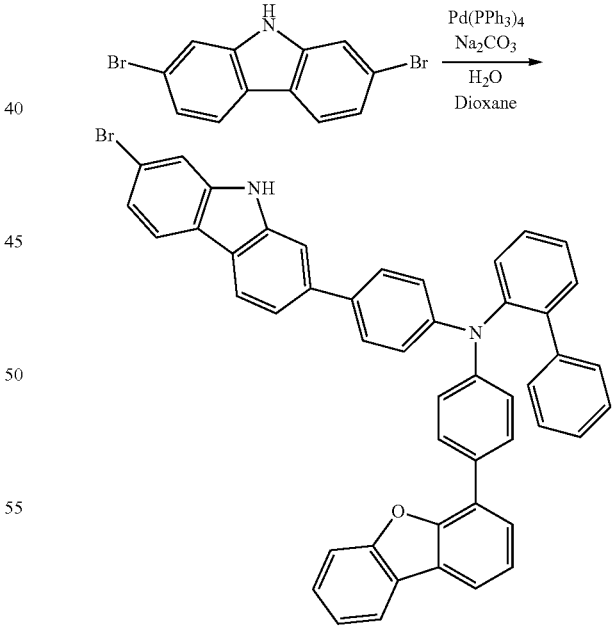

Compound 21

8-5. Synthesis of Compound 22

0.71 g of a light yellow solid (Compound 22) (yield: 59%) was obtained in the same manner as in Synthesis of Compound 17, except that 1.00 g (1.36 mmol) of Compound 21 was used instead of Compound 16.
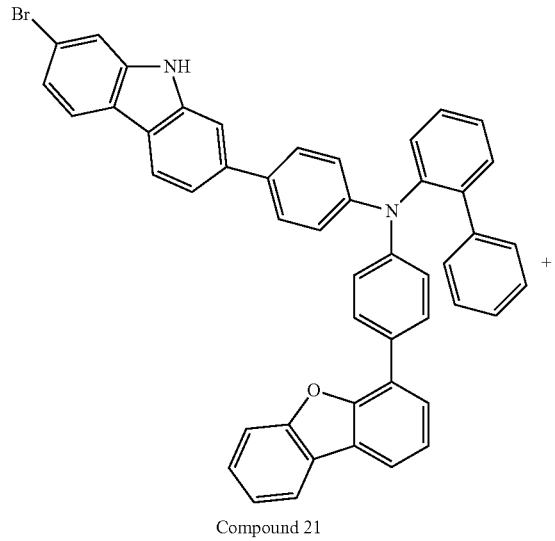
Compound 21
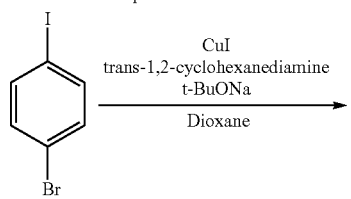
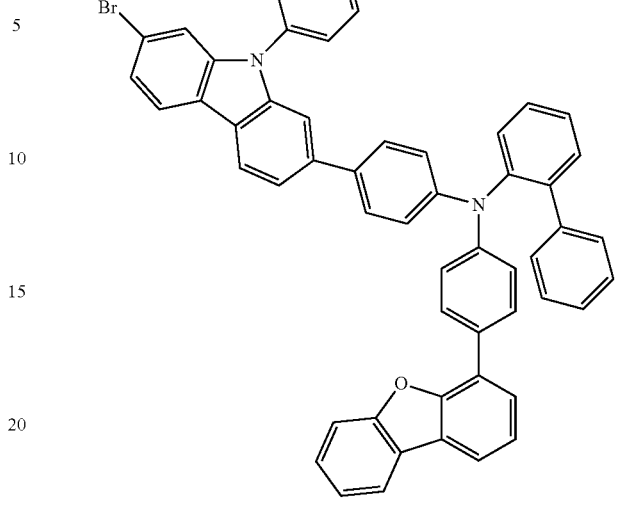
Compound 22
Example 1: Synthesis of Polymer Compound A-1
Polymer Compound A-1 including a repeating unit (A) and a repeating (B) having the following compositions was synthesized by using Compound 1, Compound 2, Compound 3, and Compound 6, which were synthesized in Synthesis Examples.
(A)
(B)
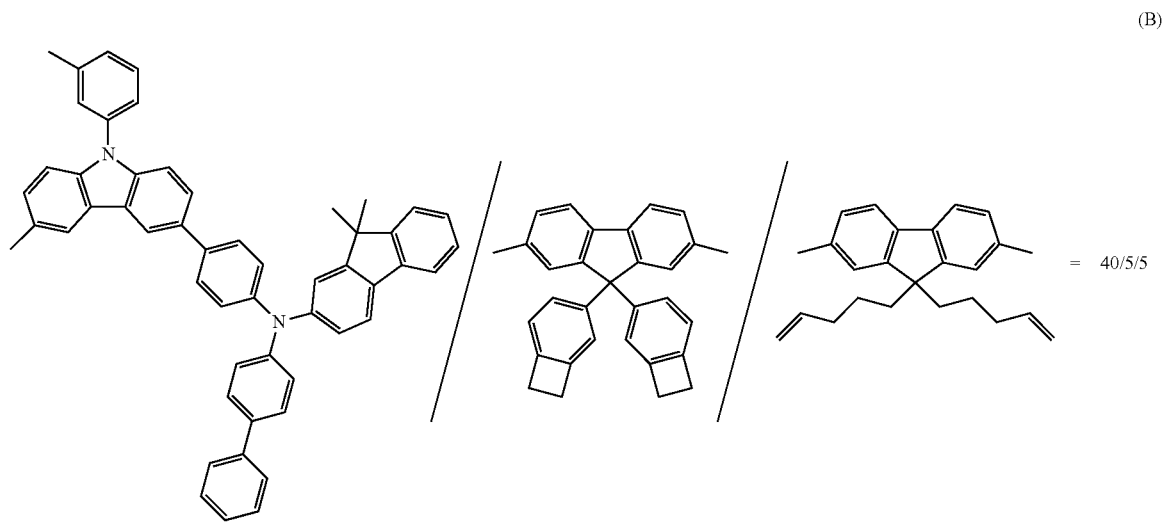
= 40/5/5

1.49 g (3.0 mmol) of Compound 1, 0.138 g (0.30 mmol) of Compound 2, 0.159 g (0.30 mmol) of Compound 3, 2.01 g (2.40 mmol) of Compound 6, 2.15 mg of palladium acetate, 20.25 mg of tris(2-methoxyphenyl)phosphine, 45 mL of toluene, and 11.42 g of 20 parts by weight (wt %) tetraethylammonium hydroxide aqueous solution were added to a four-neck flask in an argon atmosphere and refluxed for 7 hours. Then, 23.30 mg (0.57 mmol) of phenyl boronic acid, 2.15 mg of palladium acetate, 10.12 mg of tris(2-methoxyphenyl)phosphine, and 11.42 g of 20 wt % tetraethylammonium hydroxide aqueous solution were added thereto and heated for 7 hours under reflux. Then, a water layer was removed, and 5.4 g (23.97 mmol) of N,N-diethyldithiocarbamate sodium trihydrate and 50 mL of ion-exchange water were added thereto and stirred at a temperature of 85° C. for 2 hours. After an organic layer was separated from the water layer, the organic layer was sequentially washed with water, 3 wt % of acetic acid aqueous solution, and water again. The organic layer was poured into methanol, and a polymer compound was precipitated, filtered and dried to obtain a solid. The solid was dissolved in toluene and passed through column chromatography charged with silica and alumina, and thus, a solvent was distilled under reduced pressure. A liquid obtained therefrom was poured into methanol, and a precipitated solid was filtered, separated, and dried to obtain Polymer Compound A-1

From the ratio of monomers, it was estimated that the obtained Polymer Compound A-1 was a polymer compound in which the repeating unit (A) having the above composition (the repeating unit derived from Compound 1: the repeating unit derived from Compound 6: the repeating unit derived from Compound 3: the repeating unit derived from Compound 2 was 50:40:5:5 (molar ratio)) and the repeating unit (B) were alternately polymerized. Also, it was estimated by size exclusion chromatography (SEC) that the weight average molecular weight (Mw) and the molecular weight distribution (Mw/Mn) of Polymer Compound A-1 were Mw=200,000 Daltons and Mw/Mn=4.0.

Example 2: Synthesis of Polymer Compound A-2

Polymer Compound A-2 including a repeating unit (A) and a repeating (B) having the following compositions was synthesized by using Compound 1, Compound 2, Compound 3, and Compound 12, which were synthesized in Synthesis Examples.

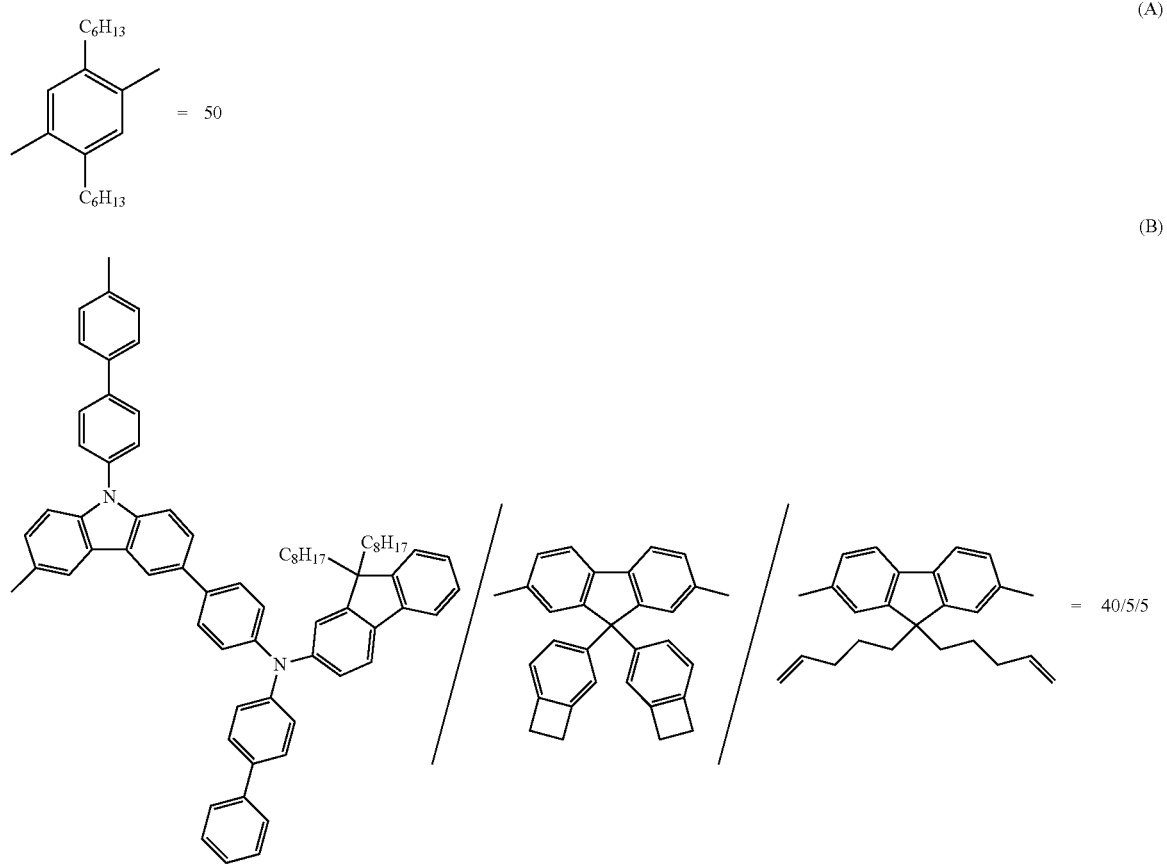

1.49 g (3.0 mmol) of Compound 1, 0.138 g (0.30 mmol) of Compound 2, 0.159 g (0.30 mmol) of Compound 3, 2.66 g (2.40 mmol) of Compound 12, 2.15 mg of palladium acetate, 20.25 mg of tris(2-methoxyphenyl)phosphine, 45 mL of toluene, and 11.42 g of 20 wt % tetraethylammonium hydroxide aqueous solution were added to a four-neck flask in an argon atmosphere and refluxed for 7 hours. Then, 23.30 mg (0.57 mmol) of phenyl boronic acid, 2.15 mg of palladium acetate, 10.12 mg of tris(2-methoxyphenyl)phosphine, and 11.42 g of 20 wt % tetraethylammonium hydroxide aqueous solution were added thereto, and the mixture was heated for 7 hours under reflux. Then, a water layer was removed, and 5.4 g (23.97 mmol) of N,N-diethyldithiocarbamate sodium trihydrate and 50 mL of ion-exchange water were added thereto, and the mixture was stirred at a temperature of 85° C. for 2 hours. After an organic layer was separated from the water layer, the organic layer was sequentially washed with water, 3 wt % of acetic acid aqueous solution, and water. The organic layer was poured into methanol, and a polymer compound was precipitated, filtered and dried to obtain a solid. The solid was dissolved in toluene and passed through column chromatography charged with silica and alumina, and thus, a solvent was distilled under reduced pressure. A liquid obtained therefrom was poured into methanol, and a precipitated solid was filtered, separated, and dried to obtain Polymer Compound A-2.

From the ratio of monomers, it was estimated that the obtained Polymer Compound A-2 was a polymer compound in which the repeating unit (A) having the above composition (the repeating unit derived from Compound 1: the repeating unit derived from Compound 12: the repeating unit derived from Compound 3: the repeating unit derived from Compound 2 was 50:40:5:5 (molar ratio)) and the repeating unit (B) were alternately polymerized. Also, it was estimated by SEC that the weight average molecular weight (Mw) and the molecular weight distribution (Mw/Mn) of Polymer Compound A-2 were Mw=110,000 Daltons and Mw/Mn=3.1.

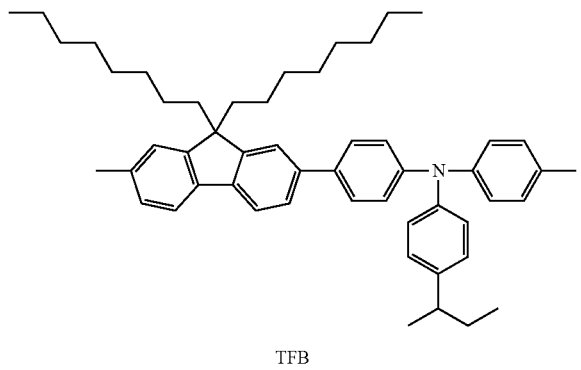

TFB

Example 3: Synthesis of Polymer Compound A-3

Polymer Compound A-3 including a repeating unit (A) and a repeating (B) having the following compositions was synthesized by using Compound 1 and Compound 6, which were synthesized in Synthesis Examples.

0.998 g (2.0 mmol) of Compound 1, 1.68 g (2.0 mmol) of Compound 6, 2.15 mg of palladium acetate, 20.25 mg of tris(2-methoxyphenyl)phosphine, 30 mL of toluene, and 7.61 g of 20 wt % tetraethylammonium hydroxide aqueous solution were added to a four-neck flask in an argon atmosphere and refluxed for 4 hours. Then, 23.30 mg (0.57 mmol) of phenyl boronic acid, 2.15 mg of palladium acetate, 10.12 mg of tris(2-methoxyphenyl)phosphine, and 11.42 g of 20 wt % tetraethylammonium hydroxide aqueous solution were added thereto and heated for 7 hours under reflux. Then, a water layer was removed, and 5.4 g (23.97 mmol) of N,N-diethyldithiocarbamate sodium trihydrate and 40 mL of ion-exchange water were added thereto and stirred at a temperature of 85° C. for 2 hours. After an organic layer was separated from the water layer, the organic layer was sequentially washed with water, 3 wt % of acetic acid aqueous solution, and water again. The organic layer was poured to methanol, and a polymer compound was precipitated, filtered and dried to obtain a solid. The solid was dissolved in toluene and passed through column chromatography charged with silica and alumina, and thus, a solvent was distilled under reduced pressure. A liquid obtained therefrom was poured into methanol, and a precipitated solid was filtered, separated, and dried to obtain Polymer Compound A-3.

From the ratio of monomers, it was estimated that the obtained Polymer Compound A-3 was a polymer compound in which the repeating unit (A) having the above composition (the repeating unit derived from Compound 1: the repeating unit derived from Compound 6 was 50:50 (molar ratio)) and the repeating unit (B) were alternately polymerized. Also, it was estimated by SEC that the weight average molecular weight (Mw) and the molecular weight distribution (Mw/Mn) of Polymer Compound A-3 were Mw=34,000 Daltons and Mw/Mn=1.5.

Example 4: Synthesis of Polymer Compound A-4

Polymer Compound A-4 including a repeating unit (A) and a repeating (B) having the following compositions was synthesized by using Compound 1 and Compound 7, which were synthesized in Synthesis Examples.

0.998 g (2.0 mmol) of Compound 1, 1.68 g (2.0 mmol) of Compound 7, 2.15 mg of palladium acetate, 20.25 mg of tris(2-methoxyphenyl)phosphine, 30 mL of toluene, and 7.61 g of 20 wt % tetraethylammonium hydroxide aqueous solution were added to a four-neck flask in an argon atmosphere and refluxed for 4 hours. Then, 23.30 mg (0.57 mmol) of phenyl boronic acid, 2.15 mg of palladium acetate, 10.12 mg of tris(2-methoxyphenyl)phosphine, and 11.42 g of 20 wt % tetraethylammonium hydroxide aqueous solution were added thereto and heated for 7 hours under reflux. Then, a water layer was removed, and 5.4 g (23.97 mmol) of N,N-diethyldithiocarbamate sodium trihydrate and 40 mL of ion-exchange water were added thereto and stirred at a temperature of 85° C. for 2 hours. After an organic layer was separated from the water layer, the organic layer was sequentially washed with water, 3 wt % of acetic acid aqueous solution, and water. The organic layer was poured into methanol, and a polymer compound was precipitated, filtered and dried to obtain a solid. The solid was dissolved in toluene and passed through column chromatography charged with silica and alumina, and thus, a solvent was distilled under reduced pressure. A liquid obtained therefrom was poured into methanol, and a precipitated solid was filtered, separated, and dried to obtain Polymer Compound A-4.

From the ratio of monomers, it was estimated that the obtained Polymer Compound A-4 was a polymer compound in which the repeating unit (A) having the above composition (the repeating unit derived from Compound 1: the repeating unit derived from Compound 7 was 50:50 (molar ratio)) and the repeating unit (B) were alternately polymerized. Also, it was estimated by SEC that the weight average molecular weight (Mw) and the molecular weight distribution (Mw/Mn) of Polymer Compound A-4 were Mw=42,000 Daltons and Mw/Mn=2.1.

Example 5: Synthesis of Polymer Compound A-5

Polymer Compound A-5 including a repeating unit (A) and a repeating (B) having the following compositions was synthesized by using 2,7-bis(4,4,5,5-tetramethyl-1,3,2-dioxaborolane-2-yl)-9,9-dioctylfluorene (product of Tokyo Kasei) and Compound 17 synthesized in Synthesis Example.

(A)

[Structure: 9,9-dioctylfluorene unit with C₈H₁₇ groups] = 50

(B)

[Structure: carbazole-substituted diarylamine unit] = 50

1.285 g (2.0 mmol) of 2,7-bis(4,4,5,5-tetramethyl-1,3,2-dioxaborolane-2-yl)-9,9-dioctylfluorene (product of Tokyo Kasei), 1.59 g (2.0 mmol) of Compound 17, 2.15 mg of palladium acetate, 20.25 mg of tris(2-methoxyphenyl)phosphine, 30 mL of toluene, and 7.61 g of 20 wt % tetraethylammonium hydroxide aqueous solution were added to a four-neck flask in an argon atmosphere and refluxed for 4 hours. Then, 23.30 mg (0.57 mmol) of phenyl boronic acid, 2.15 mg of palladium acetate, 10.12 mg of tris(2-methoxyphenyl)phosphine, and 11.42 g of 20 wt % tetraethylammonium hydroxide aqueous solution were added thereto and heated for 7 hours under reflux. Then, a water layer was removed, and 5.4 g (23.97 mmol) of N,N-diethyldithiocarbamate sodium trihydrate and 40 mL of ion-exchange water were added thereto and stirred at a temperature of 85° C. for 2 hours. After an organic layer was separated from the water layer, the organic layer was sequentially washed with water, 3 wt % of acetic acid aqueous solution, and water. The organic layer was poured into methanol, and a polymer compound was precipitated, filtered and dried to obtain a solid. The solid was dissolved in toluene and passed through column chromatography charged with silica and alumina, and thus, a solvent was distilled under reduced pressure. A liquid obtained therefrom was poured into methanol, and a precipitated solid was filtered, separated, and dried to obtain Polymer Compound A-5.

From the ratio of monomers, it was estimated that the obtained Polymer Compound A-5 was a polymer compound in which the repeating unit (A) having the above composition (the repeating unit derived from 2,7-bis(4,4,5,5-tetramethyl-1,3,2-dioxaborolane-2-yl)-9,9-dioctylfluorene: the repeating unit derived from Compound 17 was 50:50 (molar ratio)) and the repeating unit (B) were alternately polymer-ized. Also, it was estimated by SEC that the weight average molecular weight (Mw) and the molecular weight distribution (Mw/Mn) of Polymer Compound A-5 were Mw=61,000 Daltons and Mw/Mn=2.5.

Example 6: Synthesis of Polymer Compound A-6

Polymer Compound A-6 including a repeating unit (A) and a repeating (B) having the following compositions was synthesized by using 2,7-bis(4,4,5,5-tetramethyl-1,3,2-dioxaborolane-2-yl)-9,9-dioctylfluorene (product of Tokyo Kasei) and Compound 22 synthesized in Synthesis Example.

1.285 g (2.0 mmol) of 2,7-bis(4,4,5,5-tetramethyl-1,3,2-dioxaborolane-2-yl)-9,9-dioctylfluorene (product of Tokyo Kasei), 1.77 g (2.0 mmol) of Compound 22, 2.15 mg of palladium acetate, 20.25 mg of tris(2-methoxyphenyl)phosphine, 30 mL of toluene, and 7.61 g of 20 wt % tetraethylammonium hydroxide aqueous solution were added to a four-neck flask in an argon atmosphere and refluxed for 4 hours. Then, 23.30 mg (0.57 mmol) of phenyl boronic acid, 2.15 mg of palladium acetate, 10.12 mg of tris(2-methoxyphenyl)phosphine, and 11.42 g of 20 wt % tetraethylammonium hydroxide aqueous solution were added thereto and heated for 7 hours under reflux. Then, a water layer was removed, and 5.4 g (23.97 mmol) of N,N-diethyldithiocarbamate sodium trihydrate and 40 mL of ion-exchange water were added thereto and stirred at a temperature of 85° C. for 2 hours. After an organic layer was separated from the water layer, the organic layer was sequentially washed with water, 3 wt % of acetic acid aqueous solution, and water. The organic layer was poured into methanol, and a polymer compound was precipitated, filtered and dried to obtain a solid. The solid was dissolved in toluene and passed through column chromatography charged with silica and alumina, and thus, a solvent was distilled under reduced pressure. A liquid obtained therefrom was poured into methanol, and a precipitated solid was filtered, separated, and dried to obtain Polymer Compound A-6.

From the ratio of monomers, it was estimated that the obtained Polymer Compound A-6 was a polymer compound in which the repeating unit (A) having the above composition (the repeating unit derived from 2,7-bis(4,4,5,5-tetramethyl-1,3,2-dioxaborolane-2-yl)-9,9-dioctylfluorene: the repeating unit derived from Compound 22 was 50:50 (molar ratio)) and the repeating unit (B) were alternately polymer-ized. Also, it was estimated by SEC that the weight average molecular weight (Mw) and the molecular weight distribution (Mw/Mn) of Polymer Compound A-6 were Mw=52,000 Daltons and Mw/Mn=2.6.

Evaluation Example 1: Measurement of Triplet Energy Level

The triplet energy levels (electron volts, eV) Polymer Compounds A-1 and A-2 obtained in Example 1 and 2 and poly[(9,9-dioctylfluorenyl-2,7-diyl)-co-(4,4'-(N-(4-sec-butyl phenyl)diphenylamine) (TFB) (product of Luminescence Technology Corp.) (Comparative Example 1) having the following repeating unit were measured by using the following method. Results thereof are shown in Table 1.

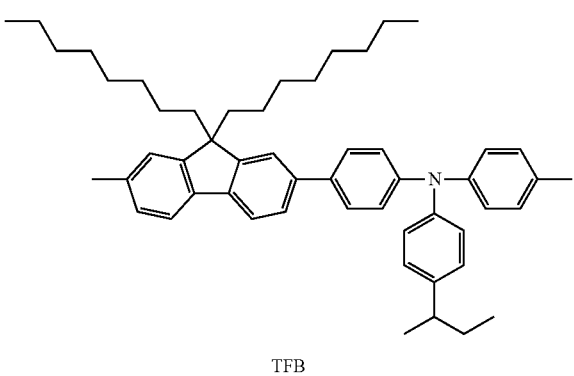

TFB

A coating solution was prepared by dissolving each compound in toluene such that the concentration thereof was 3.2 wt %. The coating solution was spin-coated at a rotating speed of 1,600 revolutions per minute (rpm) and dried at a temperature of 250° C. for 60 minutes to obtain a film (sample) having a thickness of about 70 nm (dry film thickness). The sample was cooled to 77 Kelvins (K) (−196° C.) and a photoluminescence (PL) spectrum was measured. The triplet energy level (eV) was calculated from the peak value of the shortest wave side of the PL spectrum, and results thereof are shown in Table 1.

TABLE 1

| | Polymer Compound | Mn (×10$^4$) | Mw (×10$^4$) | Triplet energy level (eV) |
|---|---|---|---|---|
| Example 1 | A-1 | 5.0 | 20.0 | 2.53 |
| Example 2 | A-2 | 3.5 | 11.0 | 2.47 |
| Comparative Example 1 | TFB | 8.6 | 18.3 | 2.30 |

From Table 1, it is confirmed that the Polymer Compounds A-1 and A-2 according to the embodiment have a significantly high triplet energy level, as compared with the existing polymer compound TFB.

Example 7: Manufacture of Organic Light-Emitting Device Device-1

As a first electrode (anode), a hole injection layer was formed on an ITO glass substrate, on which stripe-shaped indium tin oxide (ITO) was deposited to a film thickness of 150 nm, by spin coating, such that poly(3,4-ethylene dioxythiophene)/poly(4-styrene sulfonate) (PEDOT/PSS) (product of Sigma-Aldrich) had a dry film thickness of 30 nm.

Then, Polymer Compound A-1 (hole transport material A-1) synthesized in Example 1 was dissolved in xylene (solvent) at a concentration of 1 wt % to prepare a coating liquid for forming a hole transport layer. The coating liquid for forming the hole transport layer was applied on the hole injection layer by spin coating, so that a thickness (dry film thickness) was 30 nm, and then heated at a temperature of 230° C. for 1 hour to form a hole transport layer having a thickness (dry film thickness) of 30 nm on the hole injection layer.

Also, a toluene solution including Compound h-1 (6,9-diphenyl-9'-(5'-phenyl-[1,1':3',1''-terphenyl]-3-yl)3,3'-bis [9H-carbazole) and Compound h-2 (3,9-diphenyl-5-(3-(4-phenyl-6-(5'-phenyl-[1,1': 3',1''-terphenyl]-3-yl)-1,3,5-triazine-2-yl)phenyl)-9H-carbazole) as a host material having the following structures and tris(2-(3-p-xylyl)phenyl)pyridine iridium (III) as a dopant material on the hole transport layer was prepared. At this time, the toluene solution was prepared so that the concentration of Compound h-1 was 0.49 grams per millimeter (g/mL), and the concentration of Compound h-2 was 0.05 g/mL. Also, a doping amount of the dopant material was adjusted to be 10 wt % based on the total weight of an emission layer. The prepared toluene solution was applied on the hole transport layer by spin coating so that a dry film thickness was 30 nm, thereby forming an emission layer on the hole transport layer.

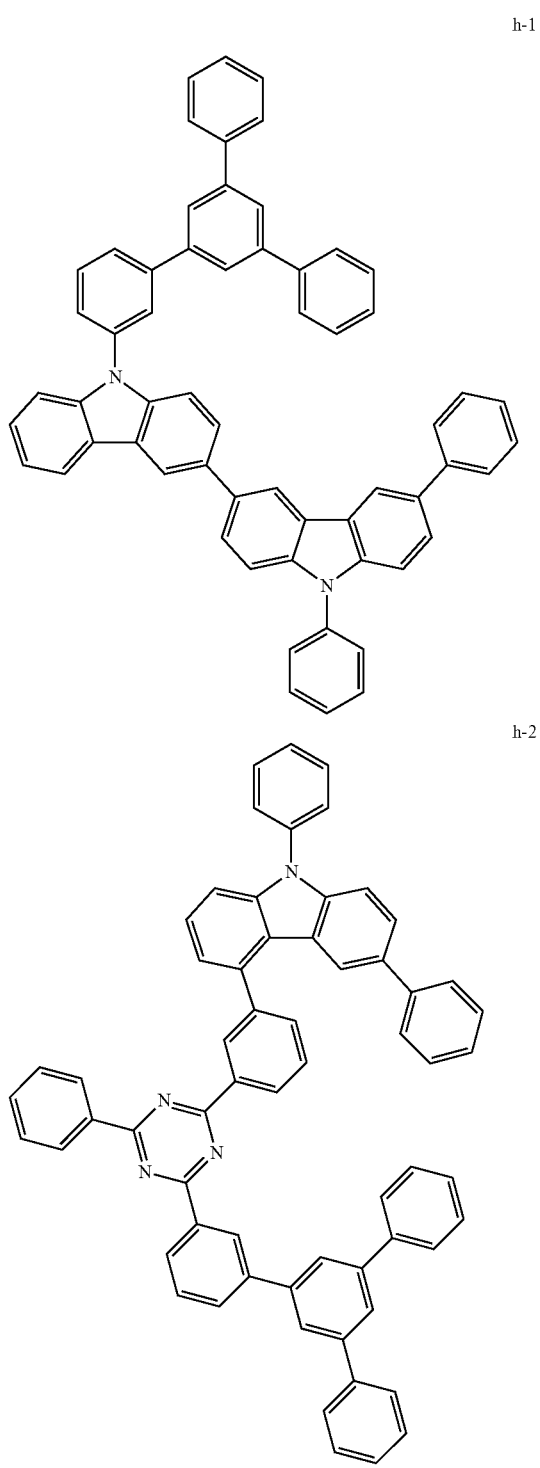

Then, (8-quinolinolato)lithium (LiQ) and KLET-03 (product of Chemipro Kasei) were co-deposited on the emission layer in a vacuum deposition apparatus, thereby forming an electron transport layer having a thickness of 50 nm. Also, lithium fluoride (LiF) was vacuum-deposited on the electron transport layer in the vacuum deposition apparatus, thereby forming an electron injection layer having a thickness of 1 nm.

Aluminum (Al) was vacuum-deposited on the electron injection layer in the vacuum deposition apparatus, thereby forming a second electrode (cathode) having a thickness of 100 nm. In this manner, an organic light-emitting device Device-1 was manufactured.

Example 8: Manufacture of Organic Light-Emitting Device Device-2

An organic light-emitting device Device-2 was manufactured in the same manner as in Example 7, except that Polymer Compound A-2 synthesized in Example 2 was used instead of Polymer Compound A-1 in forming a hole transport layer.

Comparative Example 2: Manufacture of Organic Light-Emitting Device Device-3

An organic light-emitting device Device-3 was manufactured in the same manner as in Example 7, except that poly[(9,9-dioctylfluorenyl-2,7-diyl)-co-(4,4'-(N-(4-sec-butylphenyl) diphenylamine) (TFB) (product of Luminescence Technology Corp.) having the following repeating unit was used instead of Compound A-1 (hole transport material A-1) in forming a hole transport layer.

Evaluation Example 2: Evaluation of Driving Voltage and Durability (Emission Lifespan)

The driving voltage and durability (emission lifespan) of the organic light-emitting devices Device-1 and Device-2 manufactured according to Examples 7 and 8 and the organic light-emitting device Device-3 manufactured according to Comparative Example 2 were evaluated by using the following method. Results thereof are shown in Table 2.

First, when a predetermined voltage was applied to the organic light-emitting devices by using a DC constant voltage source (source meter, manufactured by KEYENCE), a current started to flow through the respective organic light-emitting devices at a constant voltage, and the organic light-emitting devices emitted light. The voltage at this time was set as a driving voltage (V). While the light emission of the organic light-emitting device was measured by using a luminance measurement apparatus (SR-3, manufactured by Topcom), a current applied to the organic light-emitting device was gradually increased. A current at which luminance reached 6,000 candelas per square meter (cd/m²) was constantly maintained.

The emission lifespan (hours, hr) indicates an amount of time that lapsed when luminance measured by a luminance measurement apparatus was reduced to 95% of initial luminance (100%).

TABLE 2

| | organic light-emitting device | hole transport material | Driving voltage (V) | Current efficiency (cd/A) | Emission lifespan (time) |
|---|---|---|---|---|---|
| Example 7 | Device-1 | A-1 | 5.66 | 66 | 250 |
| Example 8 | Device-2 | A-2 | 5.48 | 64 | 225 |
| Comparative Example 2 | Device-3 | TFB | 6.44 | 20 | 10 |

From Table 2, it is confirmed that the organic light-emitting devices Device-1 and Device-2 including the polymer compounds of Examples 1 and 3 as the hole transport material are excellent in terms of both driving voltage and durability (emission lifespan), as compared with the organic light-emitting device Device-3 including the existing hole transport material (TFB). Therefore, it is confirmed that the polymer compounds may be suitably used as the light-emitting material, in particular, the hole transport material.

Also, it is confirmed that the use of Polymer Compounds A-1 to A-6 of Examples 1 to 6 enables a hole transport material to be formed by using coating, and thus, Polymer Compounds A-1 to A-6 of Examples 1 to 6 are suitable for mass production.

Example 9: Manufacture of Quantum-Dot Light-Emitting Device Device-4

An ITO glass substrate patterned as a first electrode (anode) was sequentially cleaned with neutral detergent, deionized water, and iso-propyl alcohol, and then UV-ozone-treated. PEDOT/PSS (manufactured by Sigma-Aldrich) was applied on the ITO glass substrate by spin coating, so that a dry film thickness was 30 nm, thereby forming a hole injection layer.

Figure 2:
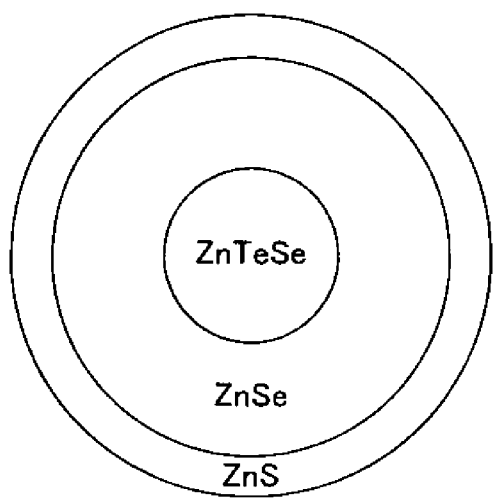
FIG. 2 is a cross-sectional view schematically illustrating a structure of a quantum dot of Example 9.
Figure 3:
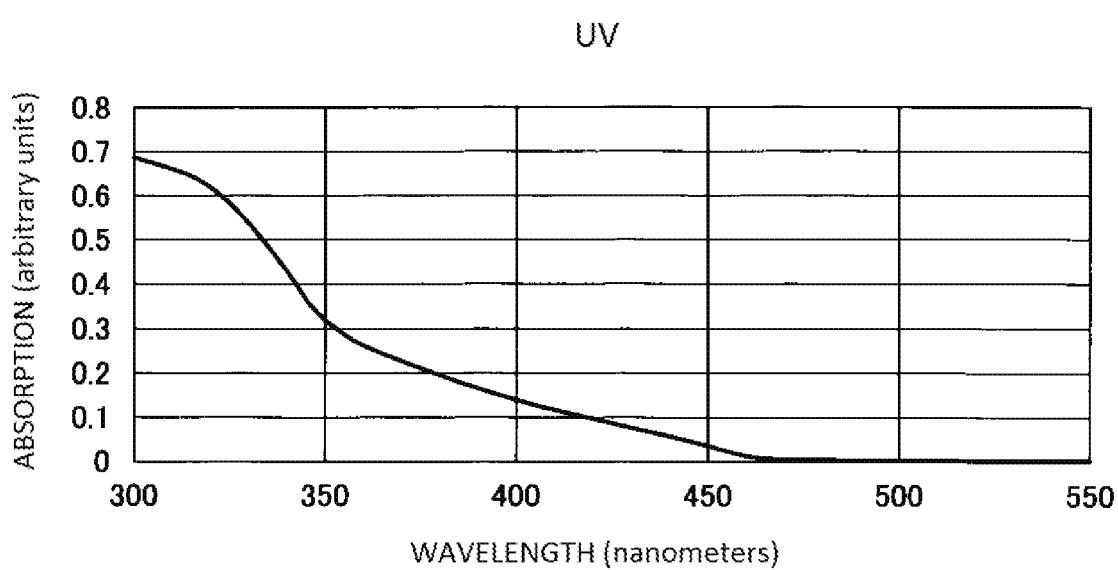
FIG. 3 is a graph of absorption (arbitrary units) versus wavelength (nanometers), showing an ultraviolet (UV) absorption spectrum of the quantum dot of Example 9.
Figure 4:
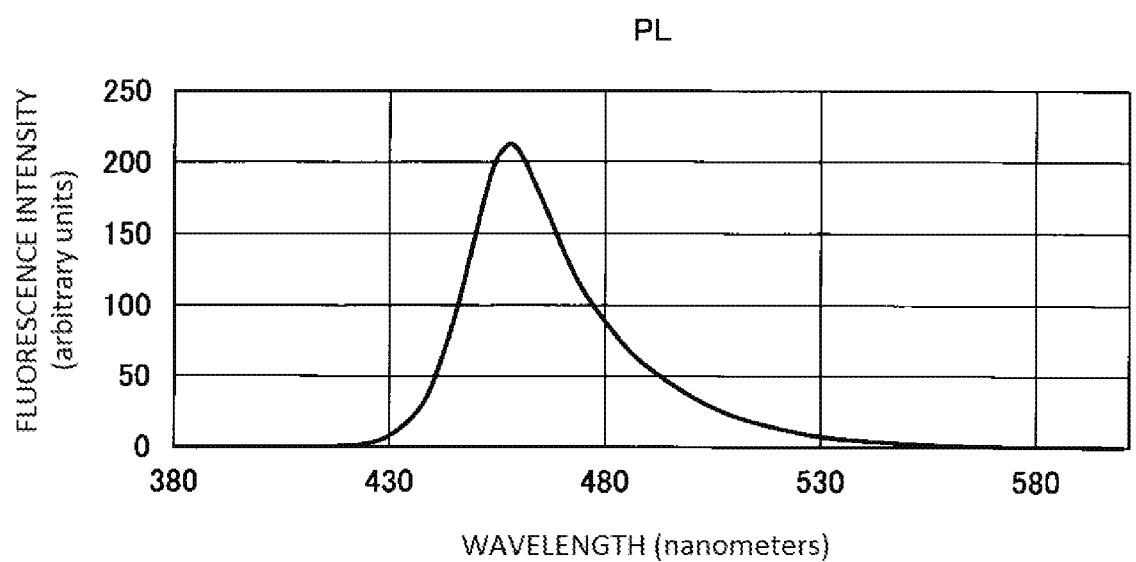
FIG. 4 is a graph of fluorescence intensity (arbitrary units) versus wavelength (nanometers), showing a fluorescence spectrum of the quantum dot of Example 9.

Then, a toluene solution of 1.0 wt % of Polymer A-1 synthesized in Example 1 was applied on the hole injection layer by spin coating, so that a dry film thickness was 25 nm. Then, heat treatment was performed thereon at a temperature of 150° C. for 30 minutes, thereby forming a hole transport layer on the hole injection layer. Then, blue quantum dots (see FIG. 2) of ZnTeSe/ZnSe/ZnS (core/shell/shell) in cyclohexane not dissolving the hole transport layer was dispersed on the hole transport layer at a concentration of 1.0 wt %. The dispersion liquid was applied by spin coating and dried to form a quantum-dot emission layer having a dry film thickness of 25 nm. Also, the blue quantum dot has an emission wavelength center of 458 nm in the dispersion liquid and a full width at half maximum (FWHM) of 29 nm (see FIGS. 3 and 4).

The quantum-dot emission layer was completely dried, and lithium quinolate (LiQ) and an electron transport material TPBI (manufactured by Sigma-Aldrich) were co-deposited on the quantum-dot emission layer by using the vacuum deposition apparatus. As a result, an electron transport layer having a thickness of 36 nm was formed on the quantum-dot emission layer. LiQ was deposited on the electron transport layer by using the vacuum deposition apparatus, thereby forming an electron injection layer having a thickness of 0.5 nm. Aluminum was deposited on the electron injection layer by using the vacuum deposition apparatus to form a second electrode (cathode) having a thickness of 100 nm, thereby completing the manufacture of a quantum-dot light-emitting device Device-4.

Example 10: Manufacture of Quantum-Dot Light-Emitting Device Device-5

A quantum-dot light-emitting device Device-5 was manufactured in the same manner as in Example 9, except that Polymer Compound A-4 synthesized in Example 4 was used instead of Polymer Compound A-1 in forming a hole transport layer.

Comparative Example 3: Manufacture of Quantum-Dot Light-Emitting Device Device-6

A quantum-dot light-emitting device Device-6 was manufactured in the same manner as in Example 9, except that TFB (product of Luminescence Technology Corp.) was used instead of Polymer Compound A-1 in forming a hole transport layer.

Evaluation Example 3: Evaluation of Driving Voltage, External Quantum Efficiency, Color Coordinates, and Emission Wavelength The driving voltage, external quantum efficiency (EQE), color coordinates, and emission wavelength of the quantum-dot light-emitting devices Device-4 and Device-5 manufactured according to Examples 9 and 10 and the quantum-dot light-emitting device Device-6 manufactured according to Comparative Example 3 were evaluated according to the following method. Results thereof are shown in Table 3.

First, when a predetermined voltage was applied to the organic light-emitting devices by using a DC constant voltage source (source meter, manufactured by KEYENCE), a current started to flow through the respective organic light-emitting devices at a constant voltage, and the organic light-emitting devices emitted light. The voltage at this time was set as a driving voltage (V). While the light emission of the organic light-emitting device was measured by using a luminance measurement apparatus (SR-3, manufactured by Topcom), a current applied to the organic light-emitting device was gradually increased. A current at which luminance reached 100 cd/m² was constantly maintained.

The color coordinates were measured by using a luminance measurement apparatus. The external quantum efficiency was calculated on the assumption that Lambertian radiation was performed on a spectral radiation luminance spectrum measured by the luminance measurement apparatus.

When a changed voltage was applied to the quantum-dot light-emitting device Device-4 of Example 9 and the quantum-dot light-emitting device Device-5 of Example 10, an electroluminescence spectrum had an emission wavelength center of 454 and an FWHM of 29 nm. Therefore, it is confirmed that the polymer compound according to the embodiment is suitable for the quantum-dot light-emitting device.

As described above, since the polymer compound has a high triplet energy level and has excellent hole transport capability, it is possible to suppress the increase of the driving voltage when the polymer compound is applied to the light-emitting device.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A polymer compound consisting of a first repeating unit represented by one of Formulae 1-1-a to 1-1-r, 1-2-a to 1-2-l, 1-3-a to 1-3-l, and 1-4-a to 1-4-l a third repeating unit represented by Formulae 4-1 or 4-2, and optionally a second repeating unit represented by Formula 2, wherein the first repeating units may be the same or different, the third repeating units may be the same or different, and the second repeating units may be the same of different:

TABLE 3

| | Organic light-emitting device | Hole transport material | Driving voltage (V) @10 mA/cm² | EQE @100 nit | Color coordinates | Emission wavelength |
|---|---|---|---|---|---|---|
| Example 9 | Device-4 | A-1 | 4.78 V | 3.72% | X = 0.148 Y = 0.058 | 454 nm |
| Example 10 | Device-5 | A-4 | 3.65 V | 5.61% | X = 0.142 Y = 0.087 | 454 nm |
| Comparative Example 3 | Device-6 | TFB | 5.03 V | 3.16% | X = 0.148 Y = 0.058 | 454 nm |

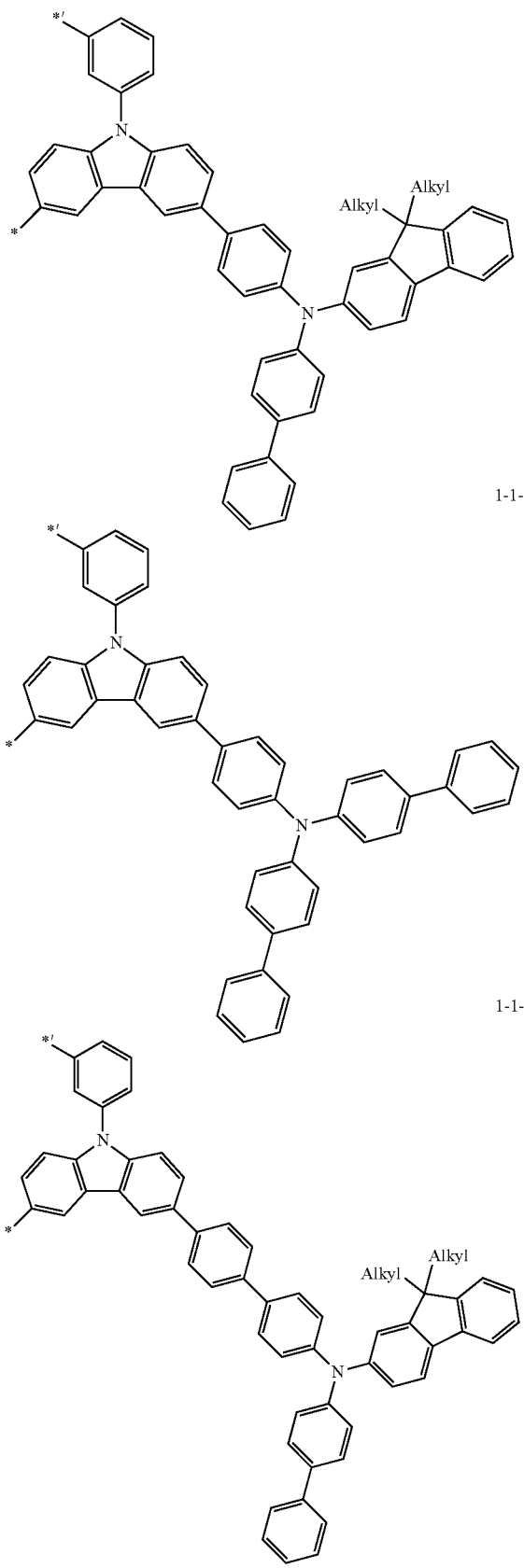
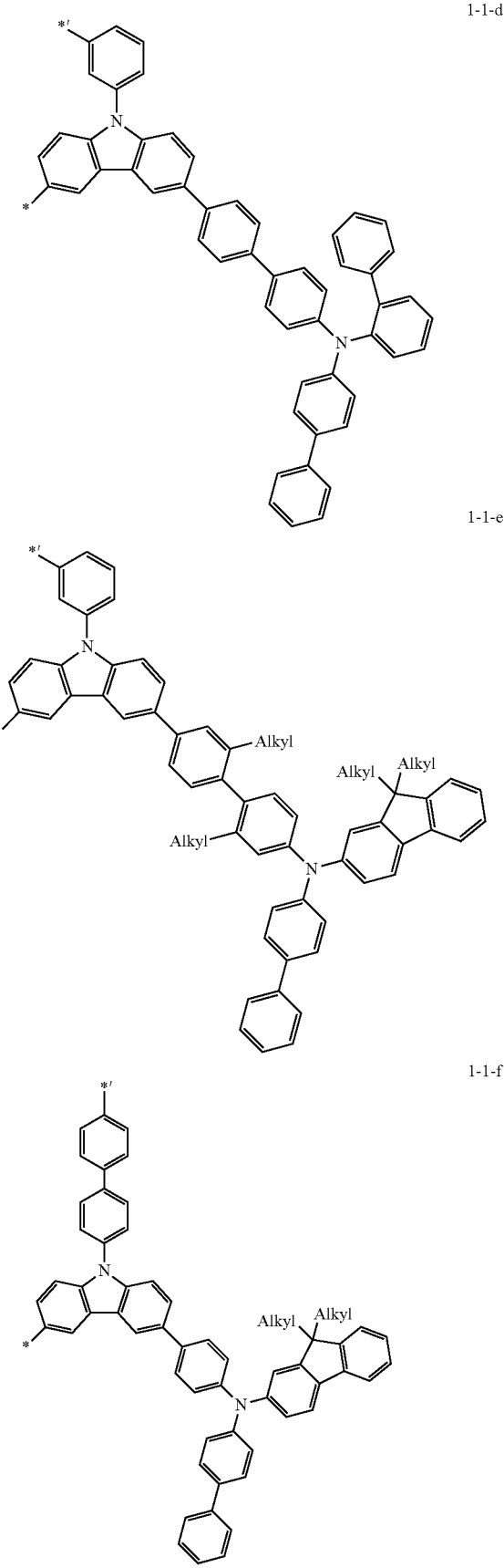

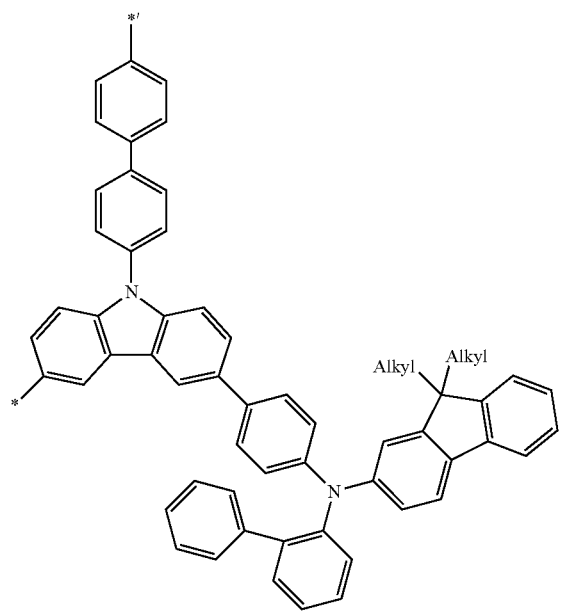
1-1-g
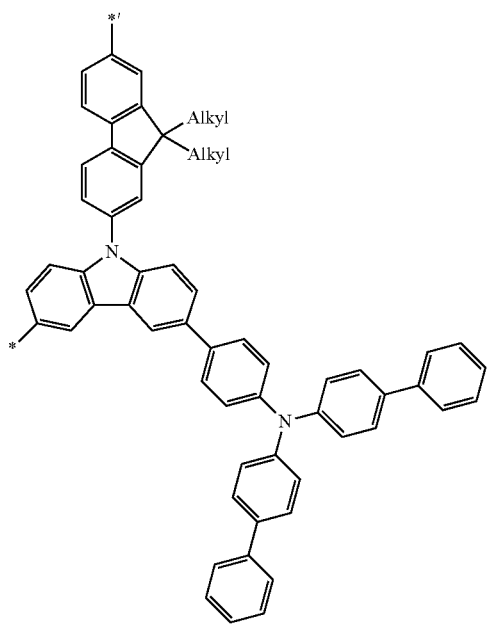
1-1-i
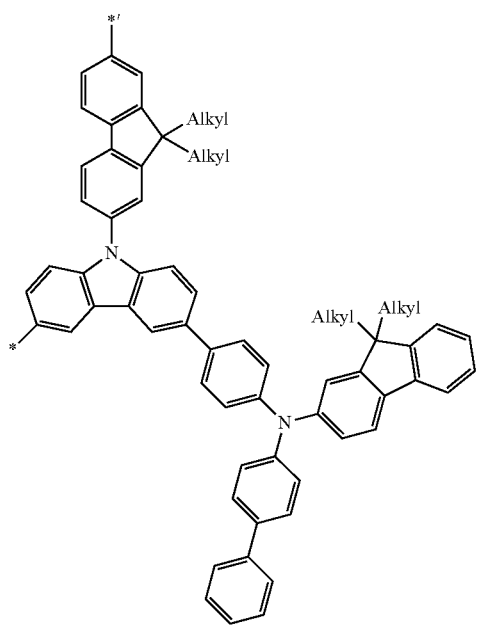
1-1-h
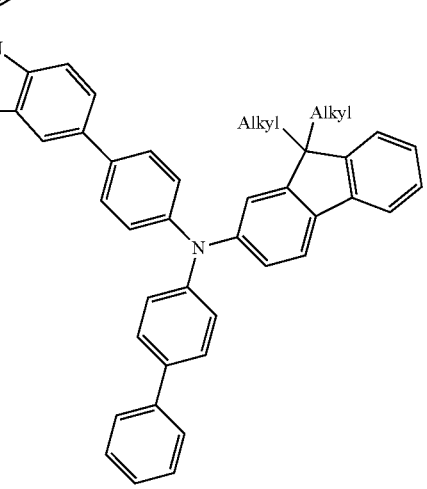
1-1-j

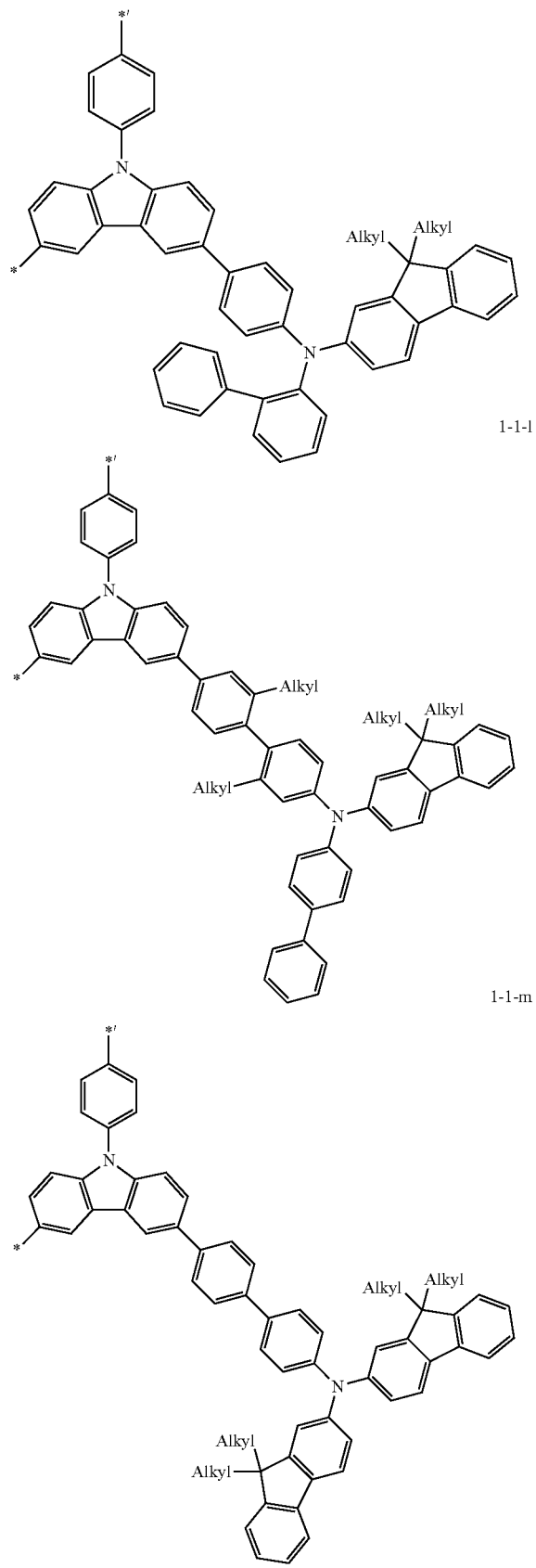
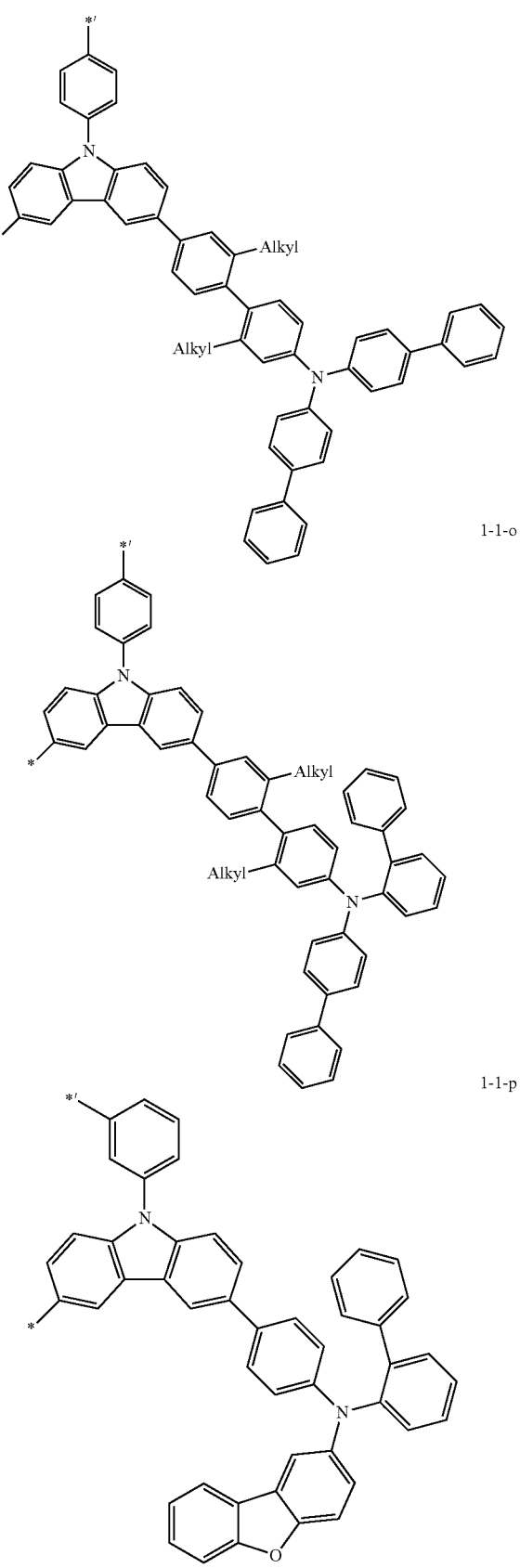

-continued
1-1-q
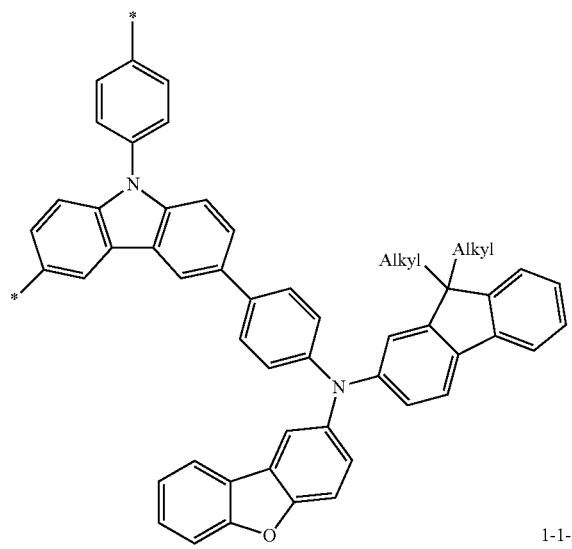
1-1-r
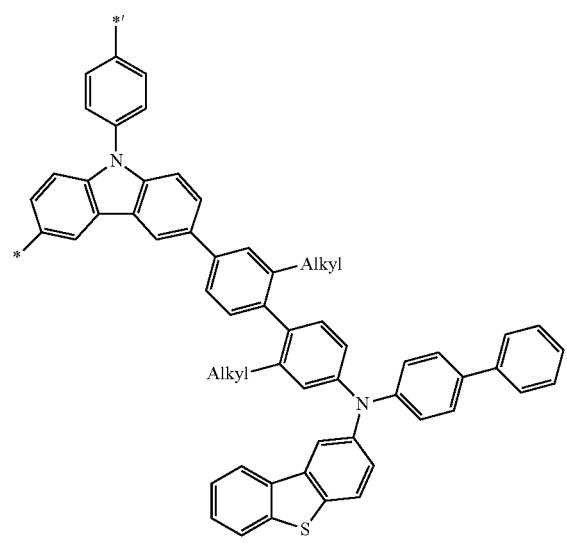
1-2-a
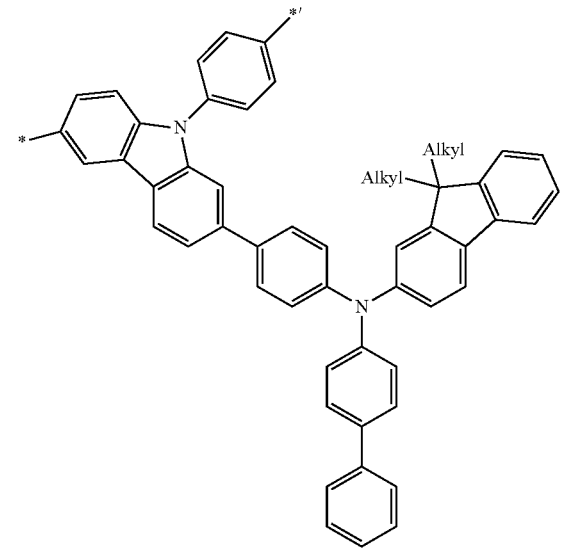
-continued
1-2-b
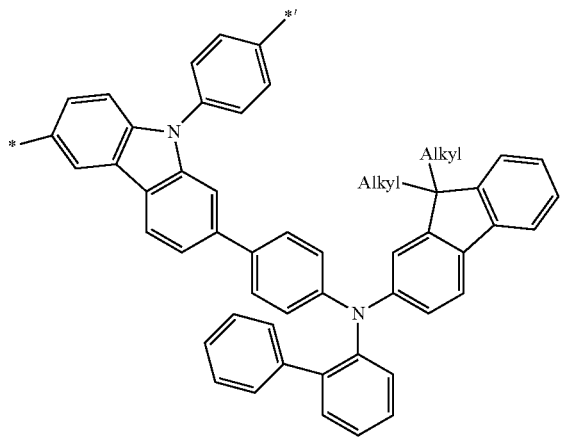
1-2-c
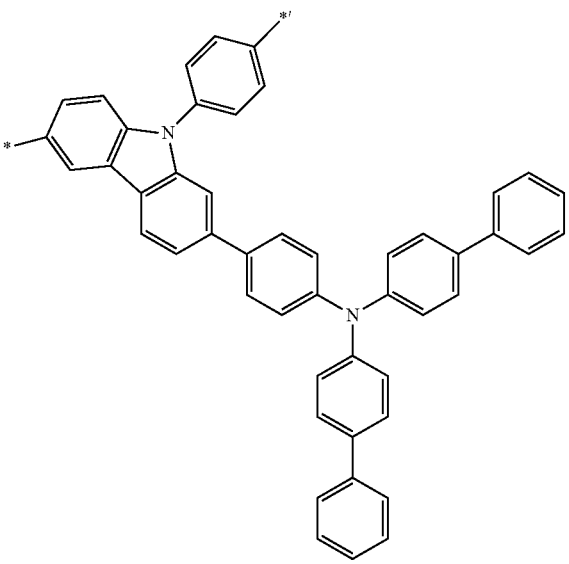
1-2-d
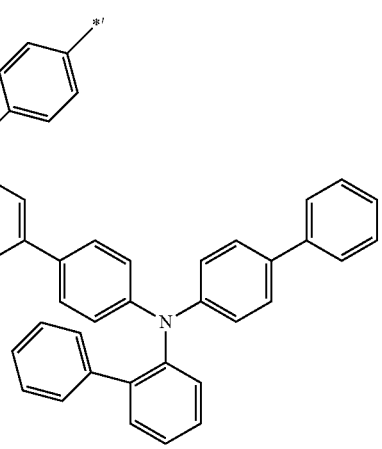

1-2-e
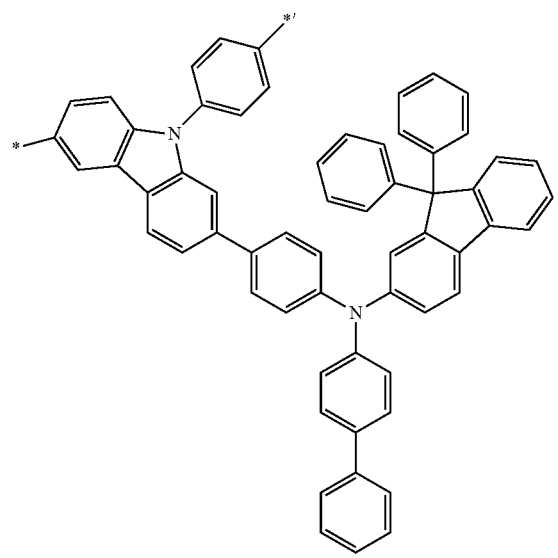
1-2-f
1-2-g
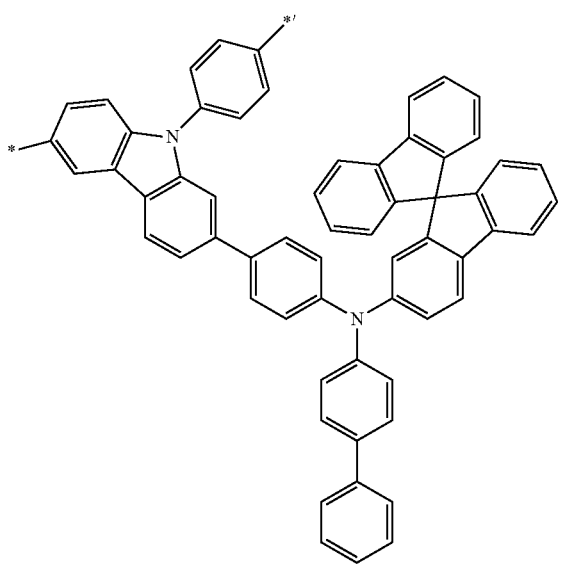
1-2-h
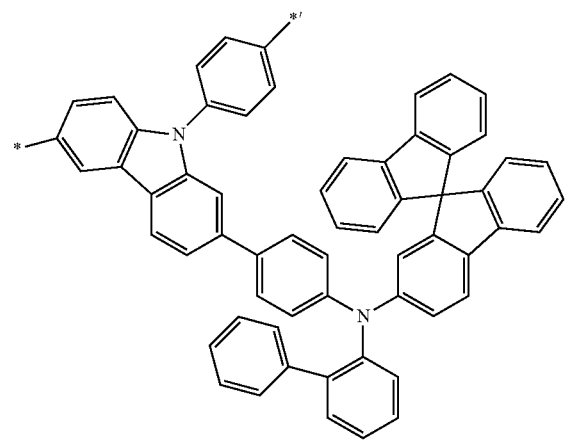
1-2-i
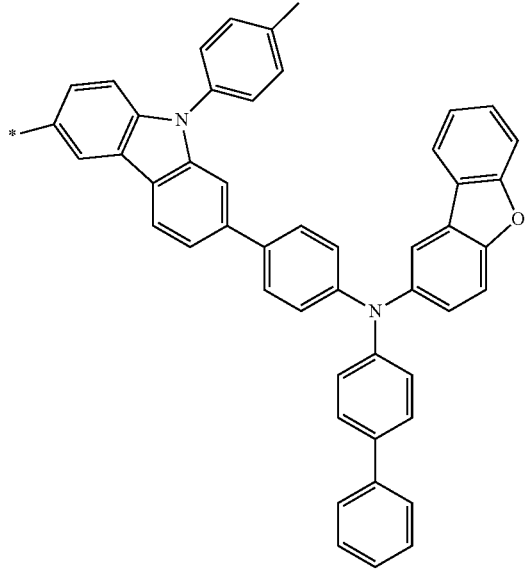
1-2-j
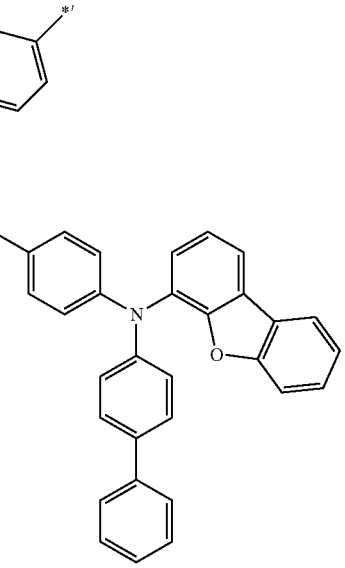

101
-continued
1-2-k
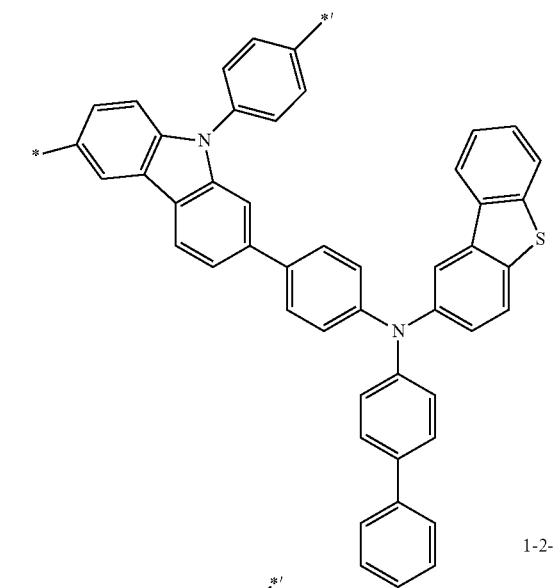
1-2-l
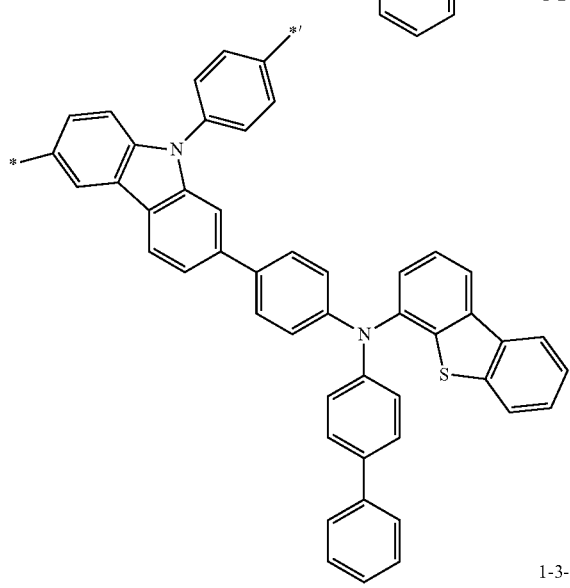
1-3-a
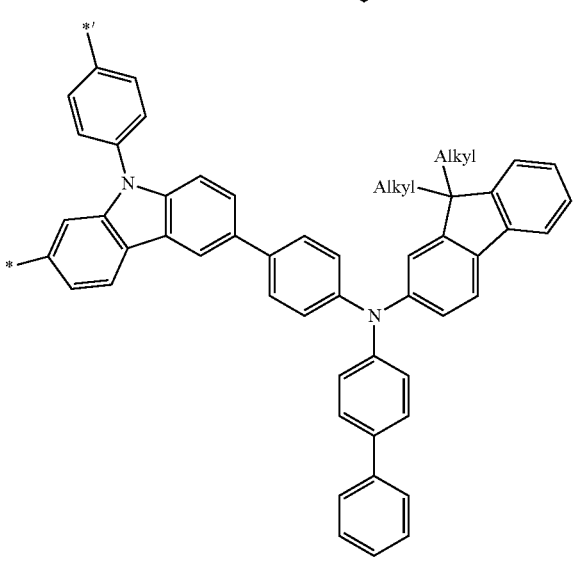
102
-continued
1-3-b
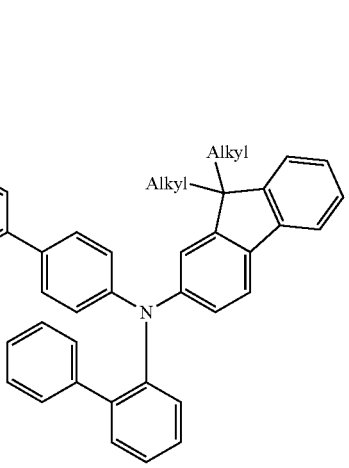
1-3-c
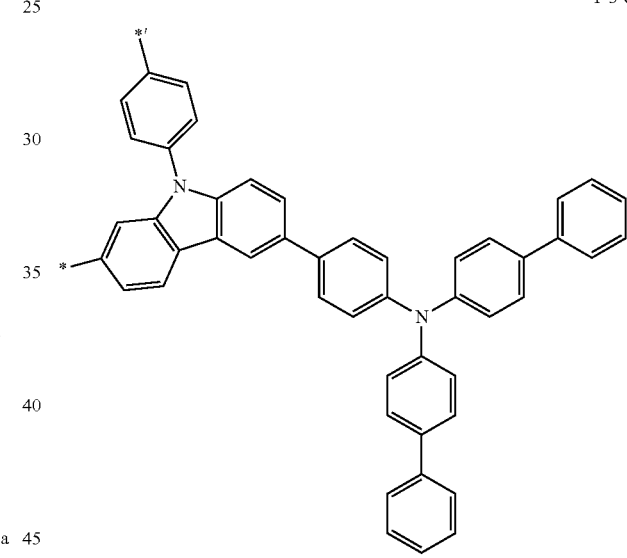
1-3-d 1-3-e 1-3-f 1-3-g 1-3-h 1-3-i 1-3-j 1-3-k
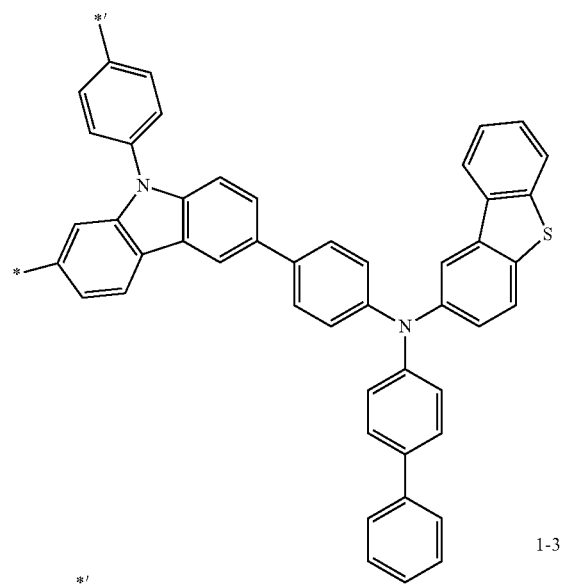
1-3-l
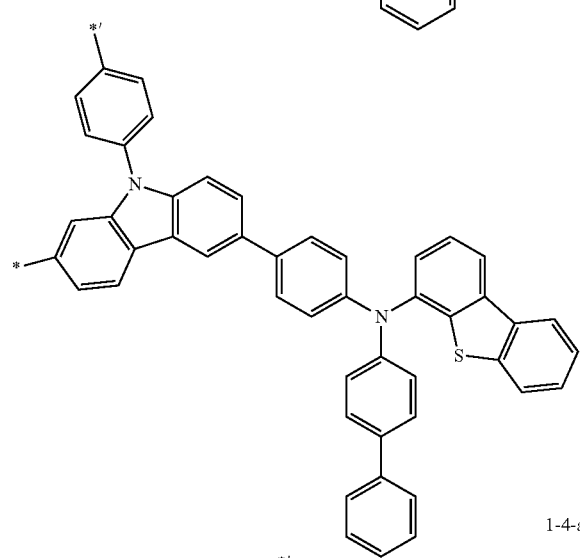
1-4-a
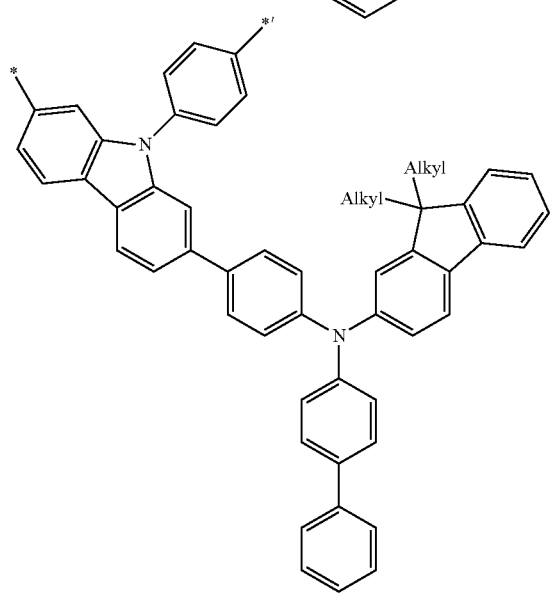
1-4-b
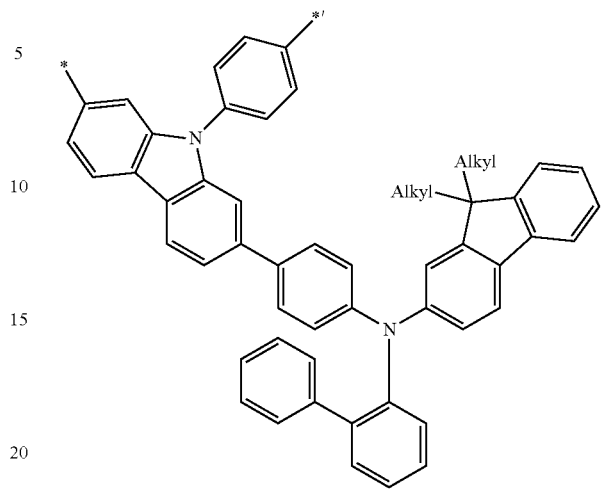
1-4-c
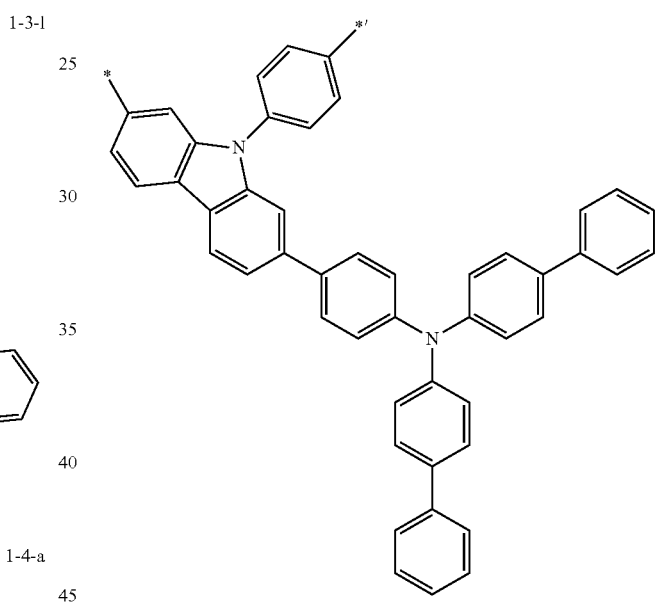
1-4-d
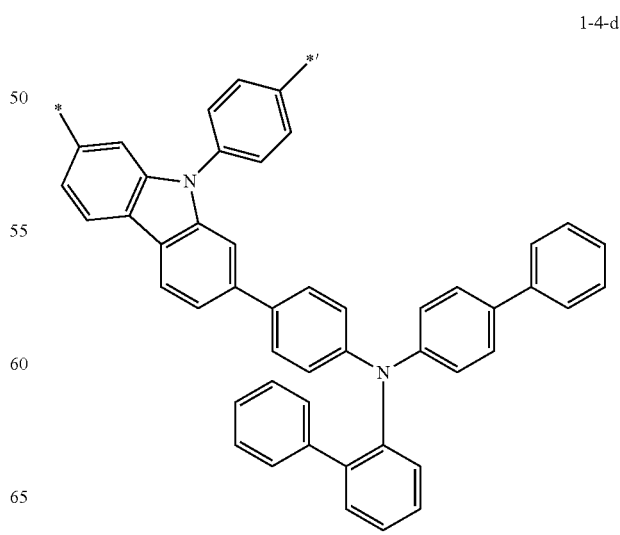

1-4-e
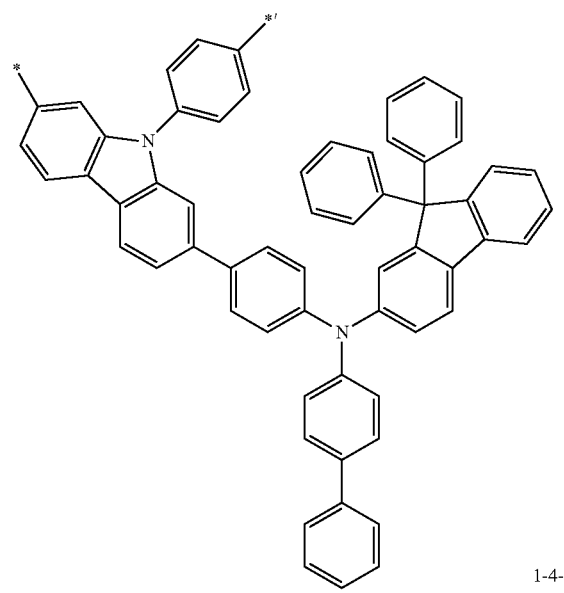
1-4-f
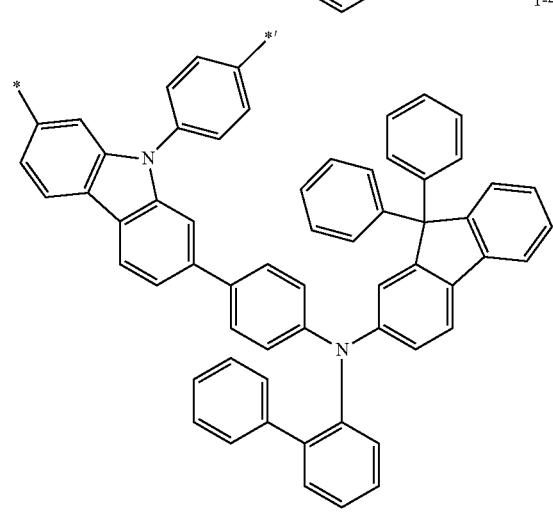
1-4-g
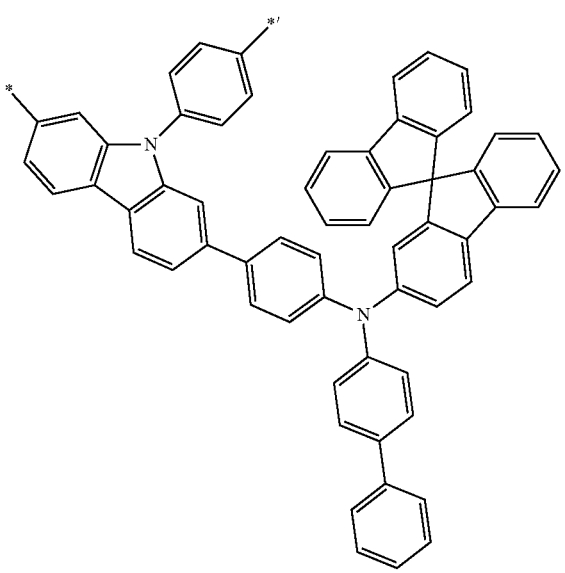
1-4-h
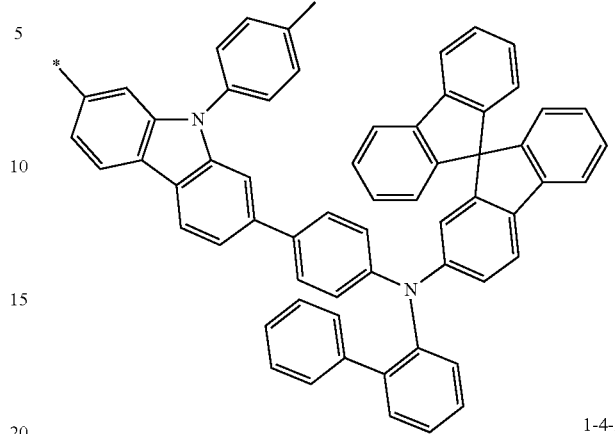
1-4-i
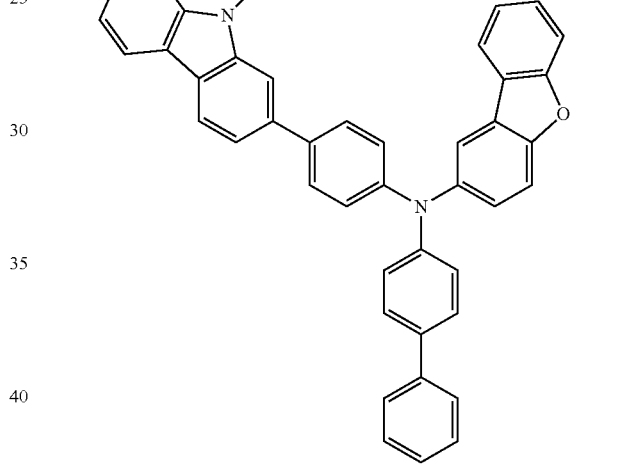
1-4-j
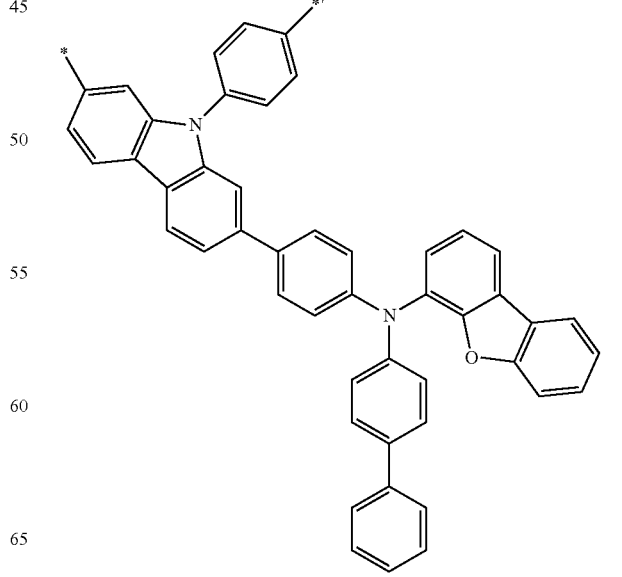

1-4-k

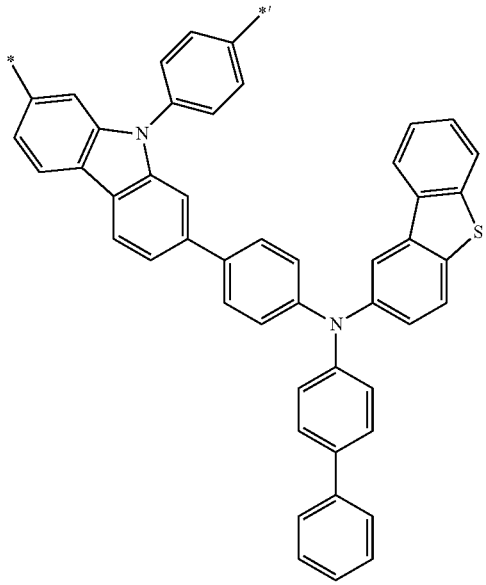

1-4-l

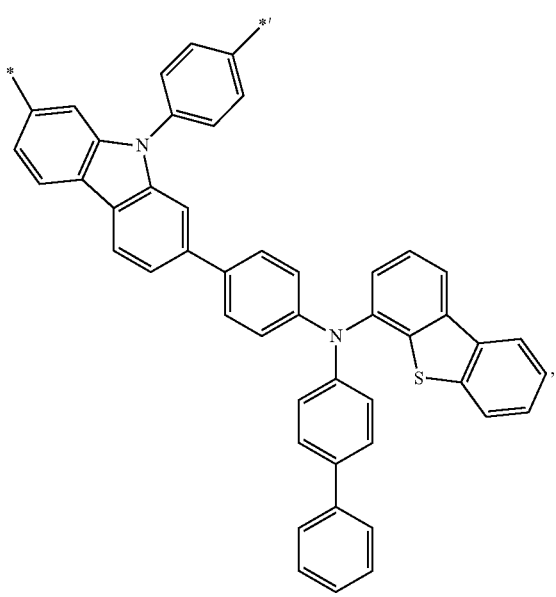

wherein, in Formulae
1-1-a to 1-1-r, 1-2-a to 1-2-l, 1-3-a to 1-2-l, and 1-4-a to 1-4-l;
each instance of alkyl is independently unsubstituted or substituted with deuterium, —F, —Cl, —Br, —I, a hydroxyl group, a cyano group, a nitro group, an amino group, or a $C_1$-$C_{60}$ alkyl group, and
* and *' each indicate a binding site to a neighboring atom, 4-1

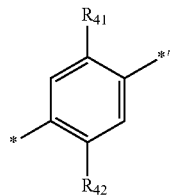

4-2

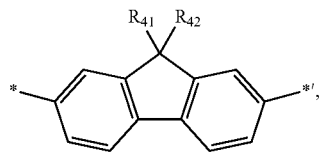

Formula 2

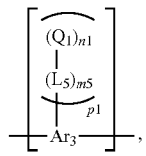

wherein, in Formulae 4-1 and 4-2,
$R_{41}$ and $R_{42}$ are each independently hydrogen, deuterium, —F, —Cl, —Br, —I, a hydroxyl group, a cyano group, a nitro group, an amino group, or a $C_1$-$C_{60}$ alkyl group, and
* and *' each indicate a binding site to Formula 1, Formula 2, Formula 4-1, Formula 4-2, or a combination thereof,
wherein, in Formula 2,
$Ar_3$ is a substituted or unsubstituted $C_5$-$C_{30}$ carbocyclic group or a substituted or unsubstituted $C_1$-$C_{30}$ heterocyclic group,
$L_5$ is selected from a single bond, a substituted or unsubstituted $C_1$-$C_{60}$ alkylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group,
m5 is an integer from 0 to 5,
when m5 is zero, $L_5$ is a single bond,
when m5 is two or more, two or more groups $L_5$ are identical to or different from each other,
$Q_1$ is a monovalent crosslinking group comprising at least one selected from an ether group, a vinyl group, an acrylate group, a methacrylate group, a styryl group, an epoxy group, an oxetane group, and a benzocyclobutene group,
n1 is an integer from 1 to 5, wherein, when n1 is two or more, two or more groups $Q_1$ are identical to or different from each other, and
p1 is an integer from 1 to 5, wherein, when p1 is two or more, two or more groups -$(L_5)_{m5}$-$(Q_1)_{n1}$ are identical to or different from each other.

2. The polymer compound of claim 1, the second repeating unit of Formula 2 is present.

3. The polymer compound of claim 2, wherein Q₁ in Formula 2 is a crosslinking group represented by one of Formulae Q-1 to Q-8:

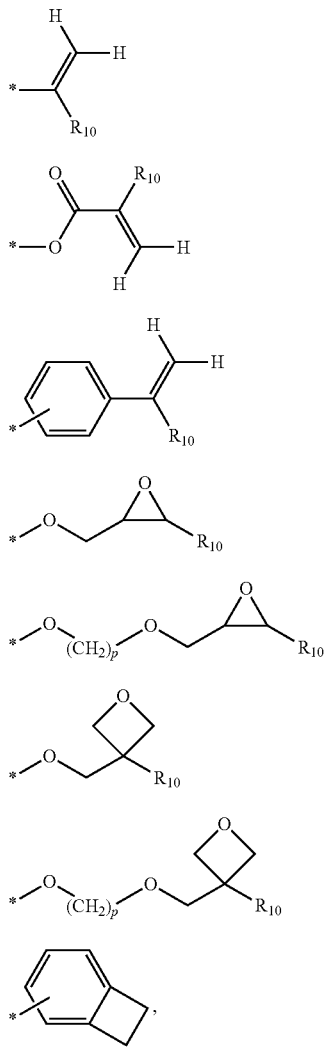

wherein, in Formulae Q-1 to Q-8,
R₁₀ is hydrogen, deuterium, —F, —Cl, —Br, —I, a hydroxyl group, a cyano group, a nitro group, an amino group, or a C₁-C₁₀ alkyl group,
p is an integer from 1 to 10, and
* indicates a binding site to a neighboring atom.

4. The polymer compound of claim 2, wherein the second repeating unit is represented by Formula 2-1 or 2-2:

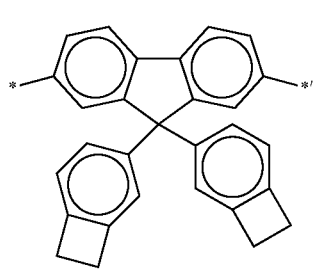

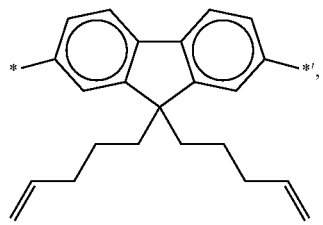

wherein, in Formulae 2-1 and 2-2,
* and *' each indicate a binding site to a neighboring atom.

5. The polymer compound of claim 2, wherein
an amount of the first repeating unit is in a range of about 40 parts by weight to about 95 parts by weight based on 100 parts by weight of the polymer compound, and an amount of the second repeating unit is in a range of about 5 parts by weight to about 15 parts by weight based on 100 parts by weight of the polymer compound.

6. The polymer compound of claim 1, wherein
an amount of the third repeating unit is in a range of about 5 parts by weight to about 50 parts by weight based on 100 parts by weight of the polymer compound.

7. The polymer compound of claim 1, wherein
a number average molecular weight (Mn) of the polymer compound is in a range of about 10,000 Daltons to about 500,000 Daltons.

8. A composition comprising:
the polymer compound of claim 1; and
a liquid medium.

9. The composition of claim 8, further comprising at least one selected from a hole transport material, an electron transport material, and a light-emitting material.

10. The composition of claim 9, wherein
the light-emitting material comprises an organometallic complex compound.

11. A light-emitting device comprising:
a first electrode;
a second electrode; and
an intermediate layer disposed between the first electrode and the second electrode and comprising an emission layer,
wherein the intermediate comprises the polymer compound of claim 1.

12. The light-emitting device of claim 11, wherein
the intermediate layer comprises an organometallic compound, a semiconductor compound, or a combination thereof.

13. The light-emitting device of claim 12, wherein
the intermediate layer comprises an organic compound, and
the organic compound emits light from triplet excitons.

14. The light-emitting device of claim 11, wherein
the intermediate layer comprises a semiconductor compound, and
the semiconductor compound is a quantum dot.

15. The polymer compound of claim 1, wherein the second repeating unit is represented by Formula 2-2:

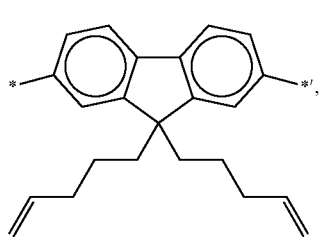

wherein, in Formula 2-2,
* and *' each indicate a binding site to a neighboring atom.

16. The polymer compound of claim 1, wherein an amount of the first repeating unit is in a range of about 40 parts by weight to about 95 parts by weight based on 100 parts by weight of the polymer compound, and an amount of the second repeating unit is in a range of about 5 parts by weight to about 15 parts by weight based on 100 parts by weight of the polymer compound.

* * * * *